United States Patent
Aruga et al.

(10) Patent No.: US 7,928,871 B2
(45) Date of Patent: Apr. 19, 2011

(54) SUCCESSIVE APPROXIMATION A/D CONVERTER

(75) Inventors: Kenta Aruga, Kawasaki (JP); Suguru Tachibana, Kawasaki (JP); Koji Okada, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 21 days.

(21) Appl. No.: 12/409,462

(22) Filed: Mar. 23, 2009

(65) Prior Publication Data

US 2010/0001892 A1 Jan. 7, 2010

(30) Foreign Application Priority Data

Mar. 24, 2008 (JP) .................. 2008-076682

(51) Int. Cl.
*H03M 1/06* (2006.01)

(52) U.S. Cl. .................. 341/118; 341/163; 341/172

(58) Field of Classification Search .................. 341/118, 341/120, 144, 145, 150, 161, 162, 163, 172
See application file for complete search history.

(56) References Cited

U.S. PATENT DOCUMENTS

| | | | | |
|---|---|---|---|---|
| 4,200,863 A * | 4/1980 | Hodges et al. | ............ | 341/156 |
| 6,714,151 B2 | 3/2004 | Tachibana et al. | | |
| 7,233,273 B2 | 6/2007 | Tachibana et al. | | |
| 7,782,234 B2 * | 8/2010 | Ahmad | ............ | 341/118 |
| 2002/0135503 A1 * | 9/2002 | Fossum | ............ | 341/172 |
| 2008/0158028 A1 * | 7/2008 | Yang et al. | ............ | 341/118 |
| 2008/0316080 A1 * | 12/2008 | Yoshinaga | ............ | 341/158 |
| 2010/0214140 A1 * | 8/2010 | Reinhold et al. | ............ | 341/118 |

FOREIGN PATENT DOCUMENTS

| | | | |
|---|---|---|---|
| JP | 59-83418 A | | 5/1984 |
| JP | 59083418 A | * | 5/1984 |
| JP | 59133728 A | * | 8/1984 |
| JP | 4-220016 A | | 8/1992 |
| JP | 5-167449 A | | 7/1993 |
| JP | 7-86947 A | | 3/1995 |
| JP | 2004-32089 A | | 1/2004 |
| JP | 2004-80075 A | | 3/2004 |
| JP | 2007-142863 A | | 6/2007 |

OTHER PUBLICATIONS

Hae-Seung, Lee et al., "A Self-Calibrating 15 Bit CMOS A/D Converter", *IEEE Jounal of Solid-State Circuits*, vol. SC-19, No. 6, Dec. 1, 1984.
Hae-Seung, Lee et al., "Self-Calibation Technique for A/D Converters," *IEEE Transaction on Circuit and Systems*, vol. CAS-30, No. 3, Mar. 1, 1983.

* cited by examiner

*Primary Examiner* — Howard Williams
(74) *Attorney, Agent, or Firm* — Fujitsu Patent Center

(57) ABSTRACT

A successive approximation A/D converter includes a capacitive D/A converter including capacitors, and generates a voltage based on the input voltage and a first digital signal including J bits; a resistive D/A converter that generates a voltage based on a second digital signal; a capacitor that capacity-couples the voltage to an output node; a comparator that generates a result based on the voltage; a control circuit that supplies the first digital signal to the capacitive D/A converter according to the result and outputs a third digital signal indicating a correction and a fourth digital signal including K bits; and a digital calculating circuit that generates the second digital signal including K bits based on the third digital signal and the fourth digital signal, and supplies the second digital signal to the resistive D/A converter, a (J+K) bit digital data is generated based on the input signal.

20 Claims, 25 Drawing Sheets

FIG. 10

| | FIG. 6 | FIG. 8 | CHANGE FROM FIG. 6 |
|---|---|---|---|
| COUPLING CAPACITOR FOR ANALOG ADDITION | 1C | 2C+1C=3C | 1C+1C+1C=3C |
| NUMBER OF BITS OF SUB-DAC AND CORRECTING DAC (OR INTEGRATED DAC) | 5bit+7bit | 4bit+4bit | 3bit+2bit+4bit+3bit |
| TOTAL NUMBER OF SWITCHES | 32+128=160 | 16+16=32 | 8+4+16+8=36 |
| CONFIGURATION SUMMARY | main(9bit) sub(5bit) cal(7bit) | main(9bit) Calsubu(4bit) Calsubl(4bit) | main(9bit) subu(3bit) subl(2bit) calu(4bit) call(3bit) |

SUCCESSIVE APPROXIMATION A/D CONVERTER

CROSS-REFERENCE TO RELATED APPLICATIONS

This application claims the benefit of priority from Japanese Patent Application No. 2008-76682 filed on Mar. 24, 2008, the entire contents of which are incorporated herein by reference.

BACKGROUND

The embodiments discussed herein are directed to an A/D converter.

DESCRIPTION OF RELATED ART

Successive approximation A/D converters are included in devices such as micro-controllers. The successive approximation A/D converters are disclosed in publications such as Japanese Laid-open Patent Publication No. H4-220016, Japanese Laid-open Patent Publication No. 2004-32089, Japanese Laid-open Patent Publication No. 2004-80075, Japanese Laid-open Patent Publication No. S59-83418, Japanese Laid-open Patent Publication No. H7-86947, Japanese Laid-open Patent Publication No. H5-167449, Japanese Laid-open Patent Publication No. 2007-142863, "H. S. Lee, D. A Hodges, 'Self-Calibration Technique for A/D converters', IEEE Transactions Circuits and Systems, Vol. CAS-30, No. 3, March 1983", and "H. S. Lee, D. A. Hodges, P. R. Gray, 'A Self-Calibrating 15 Bit CMOS A/D Converter', IEEE Journal of Solid-State Circuits Vol. SC-19, No. 6, December 1984".

SUMMARY

It is an aspect of the embodiments discussed herein to provide a successive approximation A/D converter that includes a capacitive D/A converter that includes a plurality of capacitors for storing charge based on an input voltage supplied to an input node, and generates, at an output node, a voltage based on the input voltage and a first digital signal including J bits, where J is a natural number, by switching connections of the plurality of capacitors according to the first digital signal; a resistive D/A converter that generates a voltage based on a second digital signal by voltage division using a resistor string; a capacitor that capacity-couples the voltage generated by the resistive D/A converter to the output node; a comparator that generates a comparison result signal based on the voltage output at the output node; a control circuit that supplies the first digital signal to the capacitive D/A converter according to the comparison result signal and outputs a third digital signal indicating a capacitance error correction value for the plurality of capacitors and a fourth digital signal including K bits, where K is a natural number; and a digital calculating circuit that generates the second digital signal, which includes at least K bits, based on the third digital signal and the fourth digital signal, and supplies the second digital signal to the resistive D/A converter, wherein (J+K) bit digital data is generated based on the input signal.

Additional advantages and novel features of the invention will be set forth in part in the description that follows, and in part will become more apparent to those skilled in the art upon examination of the following or upon learning by practice of the invention.

BRIEF DESCRIPTION OF THE DRAWINGS

FIG. 10 illustrates a comparison among numbers of switches;

DESCRIPTION OF PREFERRED EMBODIMENTS

Figure 1:
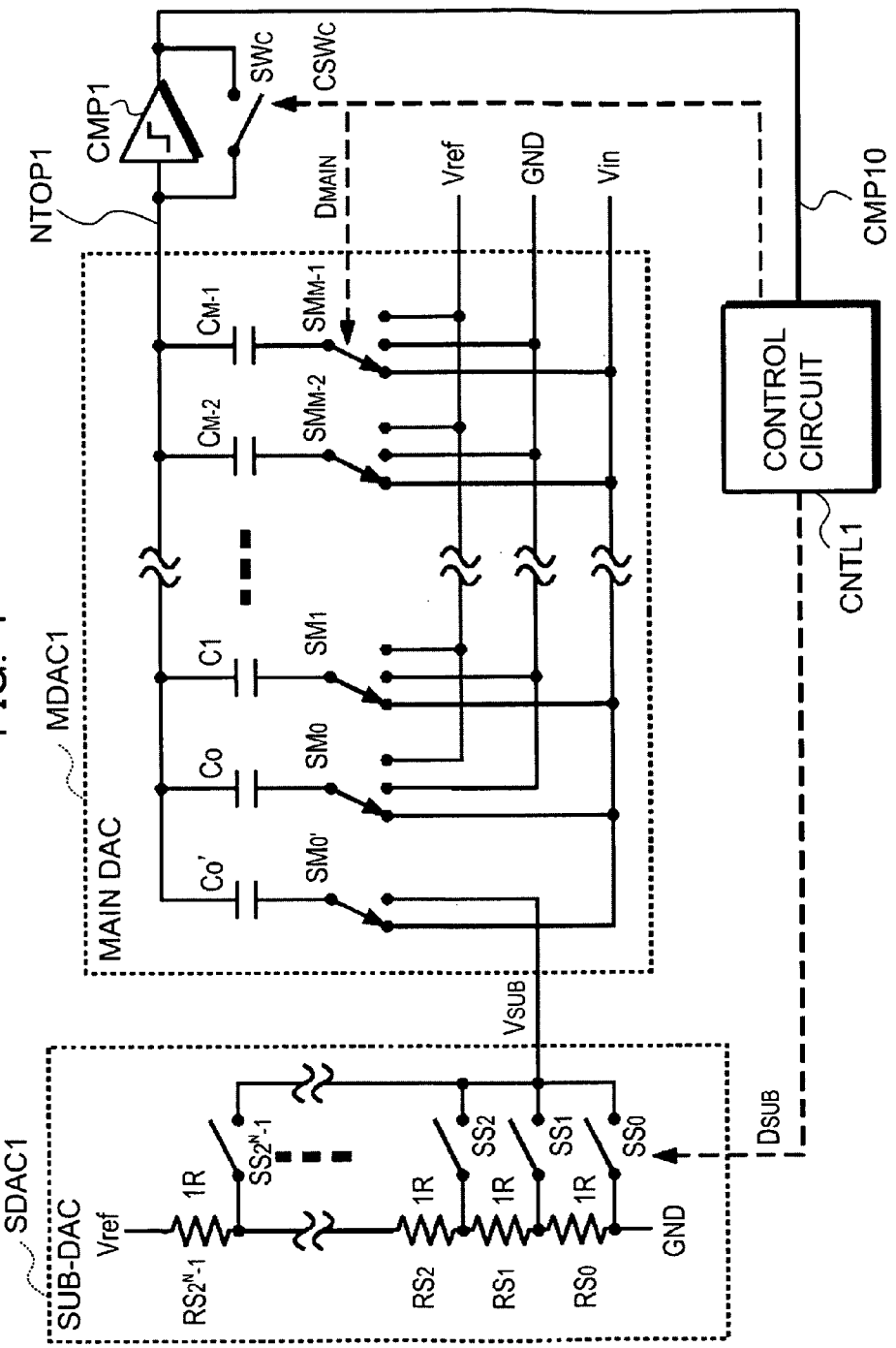
FIG. 1 illustrates an exemplary C—R-type successive approximation A/D converter circuit.

FIG. 1 illustrates an exemplary CR-type successive approximation A/D converter circuit. The successive approximation A/D converter circuit includes an M-bit capacitive main DAC which is denoted MDAC1, an N-bit resistive sub-DAC which is denoted SDAC1, a comparator CMP1 and a control circuit CNTL1. Also, all formulas (or equations) as referred herein are listed in Appendix A at the end of the present disclosure.

$RS_0$ to $RS_{2^N-1}$ of FIG. 1 are resistors. $V_{ref}$ denotes a reference voltage for the A/D converter and a voltage value (e.g., 5 V) of the reference voltage. GND is a 0 V power source. $V_{in}$ denotes an analog input signal and a voltage value of the analog input signal. SDAC1 denotes an N-bit resistive sub-DAC (D/A converter). MDAC1 denotes an M-bit capacitive main DAC. CMP1 denotes a comparator. CMP10 denotes an output of the comparator CMP1. NTOP1 denotes a top plate of MDAC1. CNTL1 denotes a control circuit for SDAC1, MDAC1, and a switch SWc. $SS_0$ to $SS_{2^N-1}$ are switches in the resistive sub-DAC. $V_{SUB}$ denotes an output terminal of the SDAC1 and an output voltage at the output terminal. DSUB denotes a digital input to SDAC1. $C_0'$, $C_0$, $C_1$, ... $C_{M-1}$, denote capacitors in MDAC1 and capacitance values of the capacitors. $SM_0'$, $SM_0$, $M_1$, ... $SM_{M-1}$ are switches in MDAC1. Switch SWc controls the comparator. A control signal CSWc controls the switch SWc. $D_{MAIN}$ is a digital input to MDAC1. The "1R" next to each $RS_0$ to $RS_{2^N-1}$ in FIG. 1 denotes a resistance value. The M-bit main DAC includes a capacitor array and a switch attached to a lower terminal of each capacitor. $C_M$ is a total capacitance of the capacitor array (Formula 1). The capacitor array is binary weighted as illustrated in Formula 2. Weighting is applied so that $C_0$ is half of $C_1$, $C_1$ is half of $C_2$, and so on, with $C_m$ being half of $C_{m+1}$. $C_0'$ is substantially equal to $C_0$ and is the product of $(\frac{1}{2})^M$ and the total capacitance $C_M$ of the capacitor array (Formula 3).

For instance, in a 5-bit capacitive main DAC, if $C_0 = C_0' = 1C$, the capacitance values are $C_1 = 2C$, $C_2 = 4C$, $C_3 = 8C$ and $C_4 = 16C$. The total capacitance $C_M$ is then $C_M = 32C = 2^5C$, the product of $2^5$ of $C_0$.

The lower terminal of each capacitor may be coupled to the reference voltage $V_{ref}$, GND, and the analog input signal $V_{in}$ by switches (note that hereinafter the lower terminal of each capacitor is referred to as a bottom plate). The switches are controlled by a digital input signal $D_{MAIN}$ output from the control circuit. $D_{MAIN}$ is an M-bit binary code, each bit of which corresponds to a different one of the switches.

$D_{MAIN}$ includes M bits which are $DM_0$, $DM_1$, ... $DM_{M-1}$, and may be expressed as $D_{MAIN} = 2^{M-1}DM_{M-1} + 2^{M-2}DM^{M-2} + \ldots + 2^1 DM_1 + 2^0 DM_0$. $DM_{M-1}$, $DM_{M-2}$, ..., $DM_1$, $DM_0$ correspond to control signals of the switches $SM_{M-1}$, $SM_{M-2}$, ..., $SM_1$, $SM_0$ during comparing operations. For instance, when $DM_1$ is "1", $SM_1$ is coupled to $V_{ref}$ and when $DM_1$ is "0", $SM_1$ is coupled to GND. Although the signals controlling the switches $SM_{M-1}$, $SM_{M-2}$, ..., $SM_1$, $SM_0$ are the bits $DM_{M-1}$, $DM_{M-2}$, ..., $DM_1$, $DM_0$ respectively, for the sake of simplicity, FIG. 1 only illustrates $D_{MAIN}$ $(=2^{M-1}DM_{M-1} + 2^{M-2}DM_{M-2} + \ldots + 2^1 DM_1 + 2^0 DM_0)$ as the control signal.

For instance, in the 5-bit capacitive main DAC, the capacitors which make up the capacitive DAC are $C_0'$, $C_0$, $C_1$, $C_2$, $C_3$, and $C_4$. The corresponding switches are $SM_0'$, $SM_0$, $SM_1$, $SM_2$, $SM_3$, and $SM_4$. $D_{MAIN}$ is then given by $D_{MAIN} = 16*DM_4 + 8*DM_3 + 4*DM_2 + 2*DM_1 + 1*DM_0$. $D_{MAIN}$ is therefore an integer in the range from 0 to 31. The signals controlling the switches $SM_0'$, $SM_0$, $SM_0$, $SM_1$, $SM_2$, $SM_3$, and $SM_4$ are $DM_0'$, $DM_0$, $DM_1$, $DM_2$, $DM_3$, and $DM_4$, respectively.

The sub-DAC, which is an N-bit resistor-string type DAC, receives an N-bit digital binary code $D_{SUB}$, and outputs an analog output voltage $V_{SUB}$. $D_{SUB}$ is N-bits in length and may be expressed in the decimal system as an integer between 0 and $2^{N-1}$.

The resistors $RS_0$ to $RS_{2^N-1}$ have the same resistance value and are coupled in a series of $2^N$ elements. The voltages 0V to $V_{ref}$ at the connection points have an interval of $V_{ref}/2^N$. Switches $SS_0$ to $SS_{2^N-1}$ are coupled to corresponding connection points. The switches $SS_0$ to $SS_{2^N-1}$ are controlled by the signal $D_{SUB}$. When $D_{SUB} = 0$, switch $SS_0$ is closed and the other switches are all open. When $D_{SUB} = 1$, switch $SS_1$ is closed and the other switches are all open. When $D_{SUB}$ is input, the single switch corresponding to the value of $D_{SUB}$ is closed. As illustrated in Formula 4, rearranging the relationship between $D_{SUB}$ and $V_{SUB}$ gives $V_{SUB} = 0V$ when $D_{SUB} = 0$ and $V_{SUB} = 1/(2N)*V_{ref}$ when $D_{SUB} = 1$. Formula 4 indicates that an output voltage changes in $2^N$ stages according to the value of $D_{SUB}$ and an interval between the stages is $V_{ref}/2^N$.

In the case of the 5-bit sub-DAC (N=5), $D_{SUB}$ may take any (decimal) integer value from 0 to 31. When $D_{SUB} = 0$, $V_{SUB} = 0V$. When $D_{SUB} = 1$, $VSUB = V_{ref}/32$. When $D_{SUB} = 31$, $V_{SUB} = (31/32) V_{ref}$. The output voltage $V_{SUB}$ is step-wise controlled by $D_{SUB}$ with a range of 0V to $V_{ref}$. The output of the sub-DAC is coupled to the bottom plate of $C_0'$ via the switch $SM_0'$.

The switch SWc is coupled between an input NTOP1 and an output CMP1O of the comparator CMP1. The switch SWc is controlled by the signal CSWc from the control circuit CNTL1. When the switch SWc is closed, the voltage between the input and output of the comparator CMP1 is substantially equal to the logic threshold voltage value $V_T$ of the comparator. When the switch SWc is open, the input NTOP1 and the output CMP1O are maintained at the logic threshold value voltage $V_T$. When the input NTOP1 drops below the logic threshold value voltage $V_T$, the output CMP1O outputs the digital value "1". When the input NTOP1 rises above the logic threshold value voltage $V_T$, the output CMP1O outputs the digital value "0". The digital value "0" corresponds to 0V and the digital value "1" corresponds to a power source voltage of the control circuit. The comparator judges whether or not the analog voltage is higher or lower than the logic threshold value voltage $V_T$ and converts the result of the judgment to a digital signal. A judgment result CMP1O, which is the digital value resulting from the conversion, is output to the control circuit CNTL1.

The control circuit CNTL1 receives the output CMP1O of the comparator and outputs a control signal. The control circuit CNTL1 is a digital circuit. The control circuit CNTL1 determines a next state based on the input signal CMP1O from the comparator, and outputs control signals to the portions of the A/D converter. The control circuit CNTL1 performs overall control of the A/D converter.

After the successive approximation A/D converter has sampled the analog signal $V_{in}$ based on the sampling capacitors ($C_0'$, $C_0$, $C_1$, ... $C_{M-1}$) of the main DAC, a comparison potential is compared with the sampled value by the comparator CMP1, and a range of the value of the analog input is determined. In the end, the DAC input digital code at which the comparison potential is closest to the sampled value is selected as an A/D conversion result.

In the sampling operation, the analog input voltage $V_{in}$ is stored in the sampling capacitors (capacitors of main DAC). During sampling, the switch SWc is closed, and the switches $SM_{M-1}$ to $SM_0'$ are coupled to $V_{in}$. Since the switch SWc is closed, the potential of the top plate NTOP1 is brought to the threshold value $V_T$ of the comparator, and the potential of the lower terminal (bottom plate) of the capacitance is brought to $V_{in}$. The electric charge $Q_{samp}$ stored on the entire capacitor array, which includes the capacitor array, the main DAC sampling capacitors, and the main DAC capacitors, is the product of the potential difference between the top plate and the bottom plate of the capacitors with the capacitance value.

In the holding/successive approximation, the voltage is held internally when the sampling ends, and a conversion result is calculated. When the sampling has ended, SWc is opened, the switch $SM_0'$ is coupled to $V_{SUB}$, and the switches $SM_{M-1}$ to $SM_0$ are coupled to a terminal other than $V_{in}$. The nodes of the top plate NTOP1 then enter a floating state and the stored charge is prevented from escaping. For this reason, Formula 6 may be established. $V_{out}$ indicates the potential of the top plate.

Since the charge in Formula 5 and the charge in Formula 6 are substantially equal, Formula 7 may be obtained based on Formula 5 and Formula 6.

By rearranging Formula 7, Formula 8, which shows the relationship between the top plate potential $V_{OUT}$ and the digital input of the main DAC during successive approximation, may be obtained.

Formula 8 includes the output voltage $V_{SUB}$ of the sub-DAC. Hence, when the output voltage $V_{SUB}$ is expressed in terms of the digital input $D_{SUB}$ of the sub-DAC, Formula 9 may be obtained.

Note that "D" in Formula 9 is defined as shown in Formula 10.

Formula 10 gives the code D in which $D_{MAIN}$ and $D_{SUB}$ are expressed as binary numbers, with $D_{MAIN}$ occupying the upper-order positions and $D_{SUB}$ occupying lower-order positions. For instance, when $D_{MAIN}$ and $D_{SUB}$ are expressed as binary numbers and $D_{MAIN}$=00001 and $D_{SUB}$=10000, D=0000110000.

Formula 9 shows the relationship among the DAC input signal D, the top plate potential $V_{out}$, and the analog input potential $V_{in}$ during the successive approximation operations.

According to Formula 9, when $V_{out}$ is larger than $V_T$, the DAC output, which is the $V_{ref}$ term in the last line of Formula 9, is larger than $V_{in}$. When $V_{out}$ is smaller than $V_T$, the DAC output is smaller than $V_{in}$.

The comparison operations begin by judging the magnitude correlation between $V_{ref}/2$ and $V_{in}$.

When $V_{in}$ is smaller than $V_{ref}/2$, $V_{in}$ is compared to $V_{ref}/4$ in a second comparison. When $V_{out}$ is larger than $V_T$, it is understood that $V_{in}$ is smaller than $V_{ref}/4$. When $V_{out}$ is smaller than $V_T$, it is understood that $V_{in}$ is larger than $V_{ref}/4$ and smaller than $V_{ref}/2$.

When $V_{in}$ is larger than $V_{ref}/2$ in the first comparison, $V_{in}$ is compared with $3V_{ref}/4$ in the second comparison. When $V_{out}$ is larger than $V_T$, it is understood that $V_{in}$ is smaller than $3V_{ref}/4$ and larger than $V_{ref}/2$. When $V_{out}$ is smaller than $V_T$, it is understood that $V_{in}$ is larger than $3V_{ref}/4$.

By making a comparison of bits based on this search method in which the range in which the $V_{in}$ value exists is successively halved, the DAC digital input code for which $V_{out}$ is closest to $V_T$ may be obtained. This search method is known as a "binary search". The DAC digital input code which is closest to the value of $V_{in}$ is obtained as the A/D conversion result for $V_{in}$. When the binary search ends, $V_T \approx V_{out}$. When $V_T = V_{out}$ is inserted into Formula 10, Formula 11 is obtained.

The code "D" obtained using the binary search is the result of the A/D conversion.

If the A/D converter in FIG. 1 includes a 5-bit main DAC (M=5) and a 5-bit sub-DAC (N=5), the A/D converter including 32 unit capacitors and 32 unit resistors is preferable.

When a single stage DAC including one of a capacitive DAC and a resistive DAC is used, a 10-bit A/D conversion circuit including 1024 unit capacitors or 1024 unit resistors is preferable.

Thus, by using the double-stage DAC, the scale of the circuit is reduced. For instance, when the main DAC is a 5-bit (M=5) capacitive DAC and the sub-DAC is 5-bit resistive DAC (N=5), the 5-bit accuracy is sufficient. As a further advantage, an area of resistive DAC may be smaller.

Since the capacitors of the main DAC are used for the conversion of the upper bits, the effects of variations in the manufacture of capacitors are large.

The errors in the capacitors of the main DAC of FIG. 1 are modeled as shown in Formula 12. In Formula 12, the capacitances $C_0'$, $C_0$, ..., $C_{M-1}$ are the sums of $C_{0,ideal}'$, $C_{0,ideal}$, ..., $C_{M-1,ideal}$, which are ideal values, and the corresponding capacitance errors $\Delta C_0'$, $\Delta C_0$, ..., $\Delta C_{M-1}$.

The ideal values of each capacitance are ideal values based on $C_M$ (total capacitance of capacitor array) of Formula 1 and are $C_{M-1,ideal}=C_M/2$, $C_{M-2,ideal}=C_M/2^2$, ..., $C_{1,ideal}=C_M/2^{M-1}$, $C_{0,ideal}=C_{0,ideal}'=C_M/2^M$. Therefore, the overall sum of the errors $\Delta C_0'$, $\Delta C_0$, ..., $\Delta C_{M-1}$ is "0". $\Delta C_m$ may be positive or negative and expresses the difference between the actual capacitance and the ideal capacitance which is $C_M$.

Rewriting Formula 9 with Formula 12 gives Formula 13. Since the ideal values of each capacitance are obtained based on $C_M$, the top-plate voltage may be expressed in the same form as Formula 9 without depending on the absolute value of $C_M$ even when there is an error in each capacitance.

When the binary search has ended, $V_T \approx V_{out}$. When $V_T \approx V_{out}$ is inserted into Formula 13, Formula 14 may be obtained.

Formula 14 shows a relationship between the A/D conversion result and the analog input voltage $V_{in}$ when the capacitance errors of the main DAC are considered. Formula 11 does not take the capacitance errors into account. When Formula 11 is compared with Formula 14, Formula 14 has an added second term. The second term indicates the effects of the capacitance errors on the conversion result.

Figure 2:
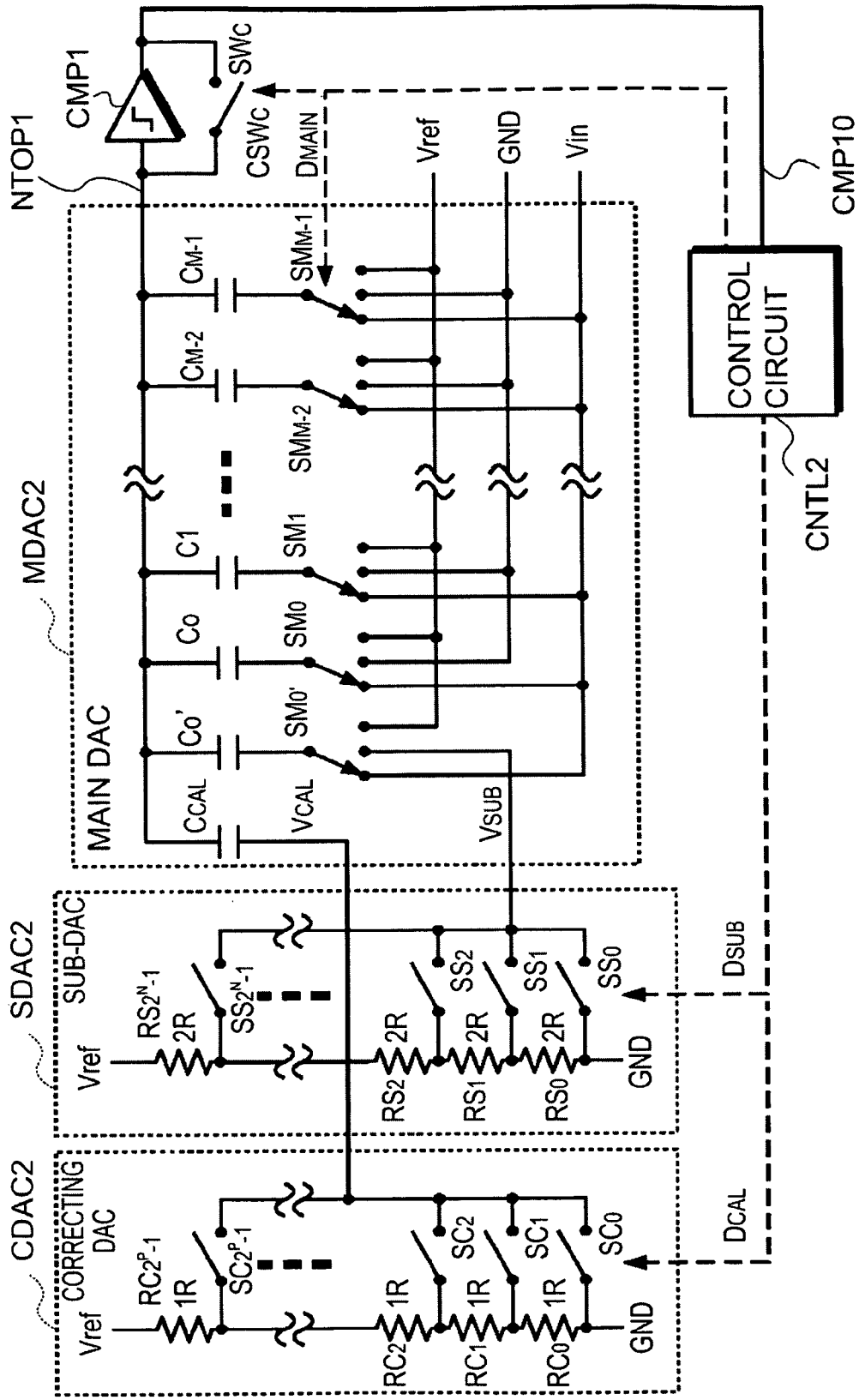
FIG. 2 illustrates an exemplary self-correcting successive approximation A/D converter circuit.
Figure 3:
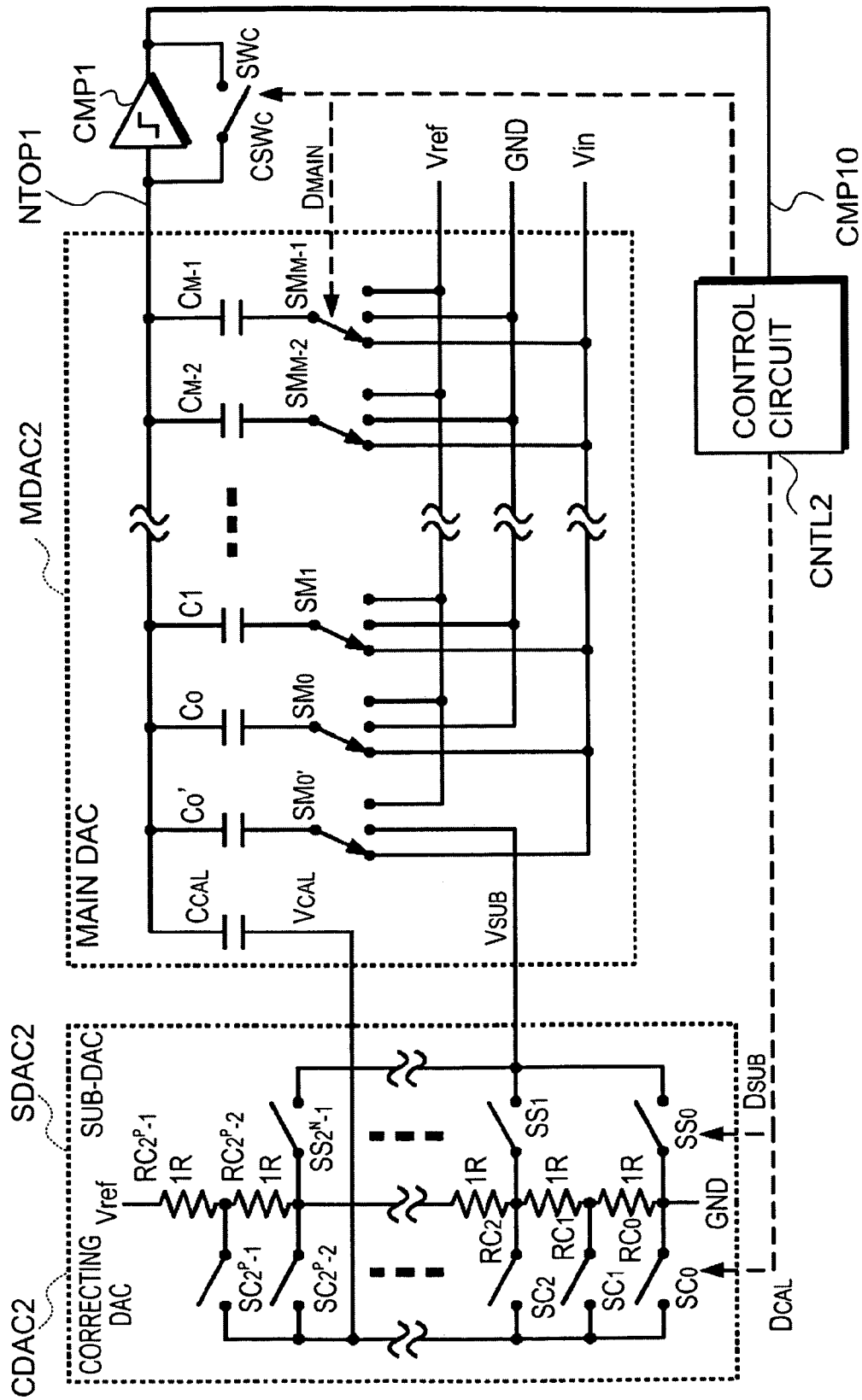
FIG. 3 illustrates another exemplary self-correcting successive approximation A/D converter circuit.

FIG. 2 and FIG. 3 illustrate self-correcting successive approximation A/D converters. The self-correcting successive approximation A/D converters measure errors in advance to calculate the capacitance errors. During normal conversion, the conversion is performed while correcting for the errors.

The sub-DAC and the correcting DAC in FIG. 2 have independent resistor strings. The sub-DAC and the correcting DAC in FIG. 3 have a common resistor string.

The self-correcting successive approximation A/D converter initially measures the capacitance errors. The self-correcting successive approximation A/D converter performs the A/D conversion after calculating, based on the measured errors, correction data which is to be input to the correcting DAC and storing the correction data in memory. The A/D conversion is performed while using the correction data in the memory to correct the capacitance errors.

The self-correcting successive approximation A/D converter includes a resistor string P-bit correcting DAC. An output of the P-bit correcting DAC is coupled to the top plate via a coupling capacitor $C_{CAL}$. The capacitor $C_{CAL}$ may, for instance, have the same or close capacitance as $C_0'$ and $C_0$.

In FIG. 2 and FIG. 3, CDAC2 is a P-bit correcting DAC. SDAC2 is an N-bit sub-DAC. $RC_m$ (where m is an integer) are resistors of the correcting DAC. $SC_m$ (where m is an integer) are switches of the correcting DAC. $D_{CAL}$ is a control input of the correcting DAC. MDAC2 denotes the main DAC. $C_{CAL}$ is a coupling capacitor for analog addition of the correcting DAC output to the top plate NTOP1. $V_{CAL}$ is a correcting DAC output. CNTL2 is a control circuit.

The "1R" and "2R" which accompany the resistors $RC_m$ (where "m" is an integer) and $RS_m$ (where m is an integer) denote the resistance values of $RC_m$ and $RS_m$ respectively. In the correcting DAC (CDAC2) of FIG. 3, a tap (output line for divided voltage) every 1R in the resistor string is selected and is used to output the output voltage $V_{CAL}$. In the sub-DAC (SDAC2), a tap every 2R in the resistor string is selected and is used to output the output voltage $V_{SUB}$.

The correcting DAC is a P-bit resistor string DAC. The input to the correcting DAC is a P-bit binary code $D_{CAL}$, and the output of the correcting DAC is the analog output voltage $V_{CAL}$. The operations of the correcting DAC are substantially the same as or similar to those of the sub-DAC. As indicated by Formula 15, the analog output voltage $V_{CAL}$ varies based on a value of the digital input signal $D_{CAL}$.

During sampling, the switches $SM_{M-1}$ to $SM_0'$ are coupled to $V_{in}$. The potential of the lower terminals (bottom plates) of the capacitors is the analog input voltage $V_{in}$. $V_{CAL}$ is set to an initial value (such as $\frac{1}{2}V_{ref}$). At this point, the voltage of $V_{CAL}$ is denoted as $V_{CAL,init}$. The potential of the top plate NTOP1 then becomes the threshold value $V_T$ of the comparator. The charge $Q_{samp}$ stored in the entire capacitor array is calculated as shown in Formula 16.

$SM_{M-1}$ to $SM_0'$ are coupled to other terminals as well as $V_{in}$. The nodes of the top plates NTOP1 then enter a floating state and the stored charge is prevented from escaping. This state is indicated in Formula 17. $V_{out}$ denotes the potential of the top plates.

Since the charge in Formula 16 is substantially equal to the charge in Formula 17, it is possible to equate the two formulas, and rearrange the result to obtain Formula 18.

The successive approximation A/D converter performs a binary search for "D" at which $V_{out}$ nears $V_T$. When the search ends, $V_{out}=V_T$. When the errors in each of the capacitances are taken into account based on Formula 12, Formula 19 is obtained.

Formula 19 shows a relationship between the A/D conversion result and the analog input voltage $V_{in}$ when the capacitance errors of the main DAC are considered. The second and third terms in the formula are error terms. The fourth term in the formula is a correction term. When the correction term is added so as to cancel out the error term, the conversion error is eliminated. The condition for canceling out the error of the second term of Formula 19 using the fourth term of Formula 19 is shown in Formula 20.

From Formula 20, when $DM_m$ (where m is an integer) is "1" and other $DM_n$ (where n is an integer) are "0", a correction voltage $V_{CDAC,m}$ (where m is an integer) for canceling out the capacitance errors may be obtained. $V_{CDAC,m}$ is given by Formula 21 ($V_{CDAC,m}$ is $V_{CAL}-V_{CAL,init}$ when $DM_m$ alone is "1").

Inserting Formula 21 into Formula 20 gives Formula 22.

The correction terms of Formula 22 are stored in a memory. During normal conversion, $D_{CAL}$ is output according to the binary code $D_{MAIN}$ input to the main DAC, as indicated by Formula 20 and Formula 22. Thus, by performing such control, the error term, which is the second term in Formula 19, is cancelled out.

The third term may be corrected if values for $\Delta C_0'$ and $V_{SUB}$ are obtained.

The weighting of $\Delta C_0'$ corresponds to 1LSB of the main DAC and so the error correction of Formula 20 alone is sufficient.

A resolution of the correcting DAC is $C_{CAL}/(2^P*C_0)$ with respect to 1LSB of the capacitor array. A correction range of the correcting DAC is $\pm C_{CAL}/(2*C_0)$.

A capacitor complementary to the capacitance $C_m$ of the capacitor array is defined as $/C_m$ by Formula 23. For instance, $/C_3$ is given by $/C_3 \equiv C_2+C_1+C_0+C_0'$. For instance, $/C_2$ is given by $/C_2 \equiv C_1+C_0+C_0'$. Note that "/" is used in the text to denote the lines over the characters in the formulas.

Since the capacitors of the capacitor array are binary weighted, ideally $C_m=/C_m$. Error measurement is performed in order starting with the highest-order capacitor $C_{M-1}$ and ending with $C_0'$.

In the measurement of the capacitance error of the highest-order capacitor $C_{M-1}$, the potential of the top plate NTOP1 is set to the threshold value $V_T$ of the comparator, and the highest-order capacitor $C_{M-1}$ is charged by $V_{ref}$. The complementary capacitor to $C_{M-1}$ is charged by GND. The top plate enters a floating state, the bottom plate of the highest-order capacitor $C_{M-1}$ is set to GND, and the bottom plate of capacitor, which is complementary to the highest-order capacitor $C_{M-1}$, is set to $V_{ref}$. The change in potential of the top plate is converted to a digital value by performing a binary search for the input digital code of the correcting DAC.

In the measurement of capacitance errors of the highest-order capacitor $C_{M-1}$, SWc is closed, $SM_{M-1}$ is coupled to $V_{ref}$, and the $SM_{M-2}$ and lower-order switches are coupled to GND. By closing the switch SWc, the potential of the top plate NTOP1 is brought to the threshold value $V_T$ of the comparator. $V_{CAL}$ is an initial value $V_{CAL,init}$. The charge $Q_{x,M-1}$ stored on the entire capacitor array is given by Formula 25.

When SWc is opened, $SM_{M-1}$ is coupled to GND, and $SM_{M-2}$ and lower-order switches are coupled to $V_{ref}$. By opening SWc, the nodes of the top plate NTOP1 of the capacitor array enter a floating state, and the stored charge is prevented from escaping. In this state, with the potential of the top plate denoted $V_{x,M-1}$, Formula 25 may be established. The value of $V_{CAL}$ is assumed to be $V_{CAL,M-1}$.

Since the charge in Formula 25 is substantially the same as the charge in Formula 26, Formula 27 may be obtained by rearranging $V_{x,M-1}$.

The second term of Formula 27 is "0" when the capacitance value of the capacitor array is ideal ($C_{M-1}=/C_{M-1}$). The third term of the Formula 27 is "0" when $V_{CAL}$ is unchanged ($V_{CAL,M-1}=V_{CAL,init}$). With ideal capacitors and an unchanging $V_{CAL}$, the top plate potential $V_{x,M-1}$ remains unchanged at $V_T$.

However, since the capacitors include errors ($C_{M-1} \neq /C_{M-1}$), the second term is not zero. Thus, the top plate potential $V_{x,M-1}$ changes. The capacitance error is measured by measuring the amount of change in the top plate potential $V_{x,M-1}$.

The $V_{CAL}$ ($V_{CAL,M-1}$) at which $V_{x,M-1}$ nears $V_T$ is searched for with a binary search by controlling $D_{CAL}$. Since $V_{x,M-1} \approx V_T$ at the completion of the search, Formula 28 may be obtained from Formula 27.

Substituting the error based on Formula 12 for $C_{M-1}$ and $/C_{M-1}$ in Formula 28 gives Formula 29.

From Formula 29, Formula 30 may be obtained.

Formula 30 is the same as the correction term obtained using Formula 21. The ($V_{CAL,M-1}-V_{CAL,init}$) of Formula 30 may be obtained as digital code by obtaining the difference between the value of $D_{CAL}$ upon completion of the binary search of the error measurement for $C_{M-1}$ and the value of $D_{CAL}$ when the initial value (½$V_{ref}$, for example) is output. The correction term may be obtained by halving ($V_{CAL,M-1}-V_{CAL,init}$).

$V_{CAL,init}$ is added to the input of the correcting DAC which outputs the correction term (a digital value that corresponds to half of ($V_{CAL,M-1}-V_{CAL,init}$)) a sign of which is inverted. The correcting DAC output is then at a potential which cancels out the error voltage generated due to the error in the highest-order capacitor $C_{M-1}$.

In the error measurement of the second-highest order capacitor, $C_{M-2}$ is charged with $V_{ref}$ with regarding the potential of the top plate NTOP1 as the comparator threshold value $V_T$. The capacitor of a higher-order than $C_{M-2}$ and the capacitors complementary to $C_{M-2}$ are charged with GND. The top plate enters a floating state, the bottom plate of $C_{M-2}$ is set to GND, and the bottom plates of the capacitors complementary to $C_{M-2}$ are set to $V_{ref}$. The potential of the bottom plate of the capacitors of a higher order than $C_{M-2}$ remains unchanged at GND. The change in the potential of the top plate is converted to a digital value by performing a binary search for the input digital code of the correcting DAC.

In the error measurement of the second-highest order capacitor, SWc is closed, $SM_{M-1}$ is coupled to GND, $SM_{M-2}$ is coupled to Vref, and $SM_{M-3}$ and lower-order switches are coupled to GND. By closing SWc, the potential of the top plate is brought to the comparator threshold value $V_T$. $V_{CAL}$ has an initial value $V_{CAL,init}$. The charge $Q_{x,M-2}$ stored on the entire capacitor array is given by Formula 31.

SWc is opened, $SM_{M-2}$ is coupled to GND, and $SM_{M-3}$ and lower-order switches are coupled to $V_{ref}$. By opening SWc, the nodes of the top plate NTOP1 enter a floating state, and the stored charge is prevented from escaping. When the potential of the top plate is denoted $V_{x,M-2}$, Formula 32 may be established. The value of $V_{CAL}$ assumed to be $V_{CAL,M-2}$.

Since the charge in Formula 31 is substantially equal to the charge in Formula 32, Formula 33 may be obtained by equating the two formulas and rearranging them in respect to $V_{x,M-2}$.

The second term of Formula 33 is "0" when the capacitance value of the capacitor array is ideal ($C_{M-2}=/C_{M-2}$). The third term of the Formula 33 is "0" when $V_{CAL}$ is unchanged ($V_{CAL,M-2}=V_{CAL,init}$). With ideal capacitor arrays and an unchanging $V_{CAL}$, the top plate potential $V_{x,M-2}$ remains at $V_T$.

However, since the capacitors include errors ($C_{M-2} \neq /C_{M-2}$), the second term is not "0", and the top plate potential $V_{x,M-2}$ changes. By measuring the amount of change, the capacitance error may be measured.

To measure the capacitance error, a binary search for the $V_{CAL}(V_{CAL,M-2})$ at which $V_{x,M-2}$ nears $V_T$ is performed by controlling $D_{CAL}$. Since $V_{x,M-2} \approx V_T$ on completion of the search, Formula 34 may be obtained from Formula 33.

Inserting the error-including terms from Formula 12 in place of $C_{M-2}$ and $/C_{M-2}$ in Formula 34 gives Formula 35.

From Formula 35, Formula 36 may be obtained.

Formula 36 matches the correction term obtained from Formula 21. The ($V_{CAL,M-2}-V_{CAL,init}$) of Formula 36 is the difference between the value of $D_{CAL}$ upon completion of the binary search and the value of $D_{CAL}$ when the initial value is output. The correction term is obtained by subtracting a value that is half of the $C_{M-1}$ correction term (Formula 30) from a value that is half of ($V_{CAL,M-1}-V_{CAL,init}$).

In the measurement of the capacitance error of $C_m$, the potential of the top plate NTOP1 is brought to the threshold value $V_T$ of the comparator, and the capacitor $C_m$ for which the error is to be measured is charged with $V_{ref}$. The capacitors of higher order than the capacitor $C_m$ for which error is to be measured and the capacitors complementary to the capacitor $C_m$ for which error is to be measured are charged with GND. The top plate enters a floating state, the bottom plate of the capacitor $C_m$, which is to undergo error measurement, is coupled to GND, and the bottom plates of the capacitors complementary to the capacitor Clare coupled to $V_{ref}$. The potential of the bottom plate of the capacitors of a higher order than the capacitor $C_m$ remains unchanged at GND. The change in the potential of the top plate is converted to a digital value by performing a binary search for the input digital code of the correcting DAC.

The charge $Q_{x,m}$ stored in the entire capacitor array when the capacitor $C_m$ to be error-measured is charged by $V_{ref}$ is shown in Formula 37. $V_{CAL}$ has an initial value $V_{CAL,init}$.

When the bottom plate of $C_m$ is coupled to GND and the bottom plate of the capacitors complementary to $C_m$ are coupled to $V_{ref}$, the charge is given by Formula 38. The value of $V_{CAL}$ is assumed to be $V_{CAL,m}$. The top plate potential is $V_{x,m}$.

Since the charge in Formula 37 is substantially equal to the charge in Formula 38, Formula 39 is obtained by equating the two formulas and rearranging in respect to $V_{x,m}$.

Due to errors in the capacitors ($C_m \neq /C_m$), the second term is not zero and the top plate potential $V_{x,m}$ changes. The capacitance error is measured by measuring the amount of change.

The capacitance error is measured by controlling $D_{CAL}$ and performing a binary search for $V_{CAL}$ ($V_{CAL,m}$) at which $V_{x,m}$ nears $V_T$. Since $V_{x,m} \approx V_T$ on completion of the search, Formula 40 may be obtained from Formula 39.

Inserting the error-including terms based on Formula 12 in place of $C_m$ and $/C_m$ in Formula 40 gives Formula 41.

From Formula 41, Formula 42 may be obtained.

The relationship between the values of measured error and the correction term is given by Formula 43.

By performing calculations based on Formula 43 using the values obtained in the error measurements, the correction terms may be calculated.

Since $\Delta C_0' + \Delta C_0 + \Delta C_1 + \ldots + \Delta C_{M-1} = 0$, when the error of each capacitor of Formula 43 has been found, $\Delta C_0'$ may be obtained.

Figure 4:
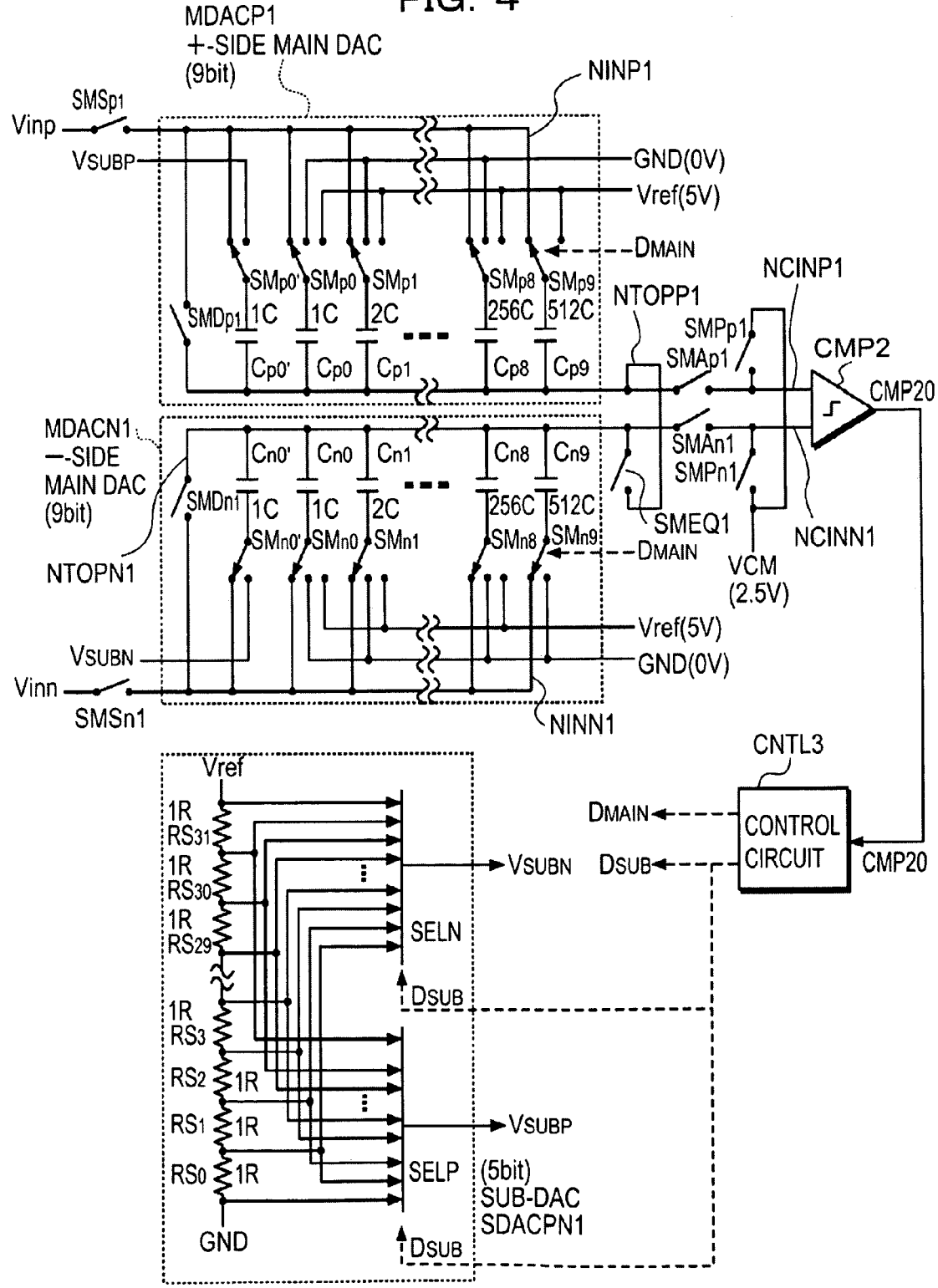
FIG. 4 illustrates an exemplary differential successive approximation A/D converter circuit.

FIG. 4 illustrates a differential successive approximation A/D converter circuit which is not self-correcting.

$V_{inp}$ of FIG. 4 is a positive-side analog input signal. $V_{inn}$ is a negative-side analog input signal. Devices having symbols starting with "SM" are switches of a capacitive main DAC. MDACP1 is a positive-side capacitive main DAC. MDACN1 is a negative-side capacitive main DAC. Devices having symbols starting with C are capacitors. CMP2 is a comparator. CMP2O is an output of the comparator CMP2. VCM is a potential of approximately half the power source voltage. SDACPN1 is a resistive sub-DAC. CNTL3 is a control circuit. $V_{SUBP}$ is an output voltage of a positive-side resistive sub-DAC. $V_{SUBN}$ is an output voltage of a negative-side resistive sub-DAC. $D_{SUB}$ is a digital input of SDACPN1. $D_{MAIN}$ is a digital input of the capacitive main DAC. $RS_0$ to $RS_{31}$ are resistors. SELN and SELP are selectors. NTOPP1 is a top plate of the positive-side capacitive main DAC. NTOPN1 is a top plate of the negative-side capacitive main DAC. NINP1 is an internal input node which receives $V_{inp}$. NINN1 is an internal input node which receives $V_{inn}$. NCINP1 and NCINN1 are inputs to the comparator CMP2.

The "1R" next to each of $RS_0$ to $RS_{31}$ denotes a resistance value. The circuit of FIG. 4 is a 14-bit differential A/D conversion circuit which combines a 9-bit main DAC and a 5-bit sub-DAC.

In the positive-side capacitive main DAC of FIG. 4, the top plate potential during sampling is a common potential of $V_{inp}$ and $V_{inn}$. In the positive-side capacitive main DAC of FIG. 4, when the highest-order capacitor $C_{p9}$ begins the comparison operations, the bottom plate is coupled to $V_{ref}$. The other operations of the circuit in FIG. 4 are the same as or similar to those of the circuit in FIG. 1. On completion of the sampling, the highest-order capacitor $C_{p9}$ begins the comparison operation and the bottom plate is coupled to $V_{ref}$. The bottom plates of the capacitors $C_{p8}$, $C_{p1}$ and the like are coupled to $V_{ref}$ or GND in accordance with the value of $D_{MAIN}$. The negative-side capacitive main DAC and the positive-side capacitive main DAC perform complementary operations. After the completion of sampling, the highest-order capacitor $C_{n9}$ begins the comparison operation and the bottom plate is coupled to GND. When the bottom plate of $C_{pm}$ (where m is an integer) is coupled to $V_{ref}$, the bottom plate of $C_{nm}$ is coupled to GND. The circuit illustrated in FIG. 4 may deal with a differential input signal.

For the A/D conversion, the analog signal is stored (sampled) to sampling capacitors. Inputting to the DAC begins. The value of the DAC input code at which the DAC output potential and the value of the sampled analog signal are closest is searched for, and the searched DAC input code is output as the A/D conversion result.

The positive-side 9-bit main DAC (MDACP1) includes a capacitor array and switches coupled to the bottom terminal of each capacitor. The capacitor array includes binary-weighted capacitors with $C_0=C_0'=1C$, $C_1=2C$, $C_2=4C$, $C_3=8C, \ldots, C_8=256C, C_9=512C$. The total capacitance of the capacitor array is 1024C.

Figure 5:
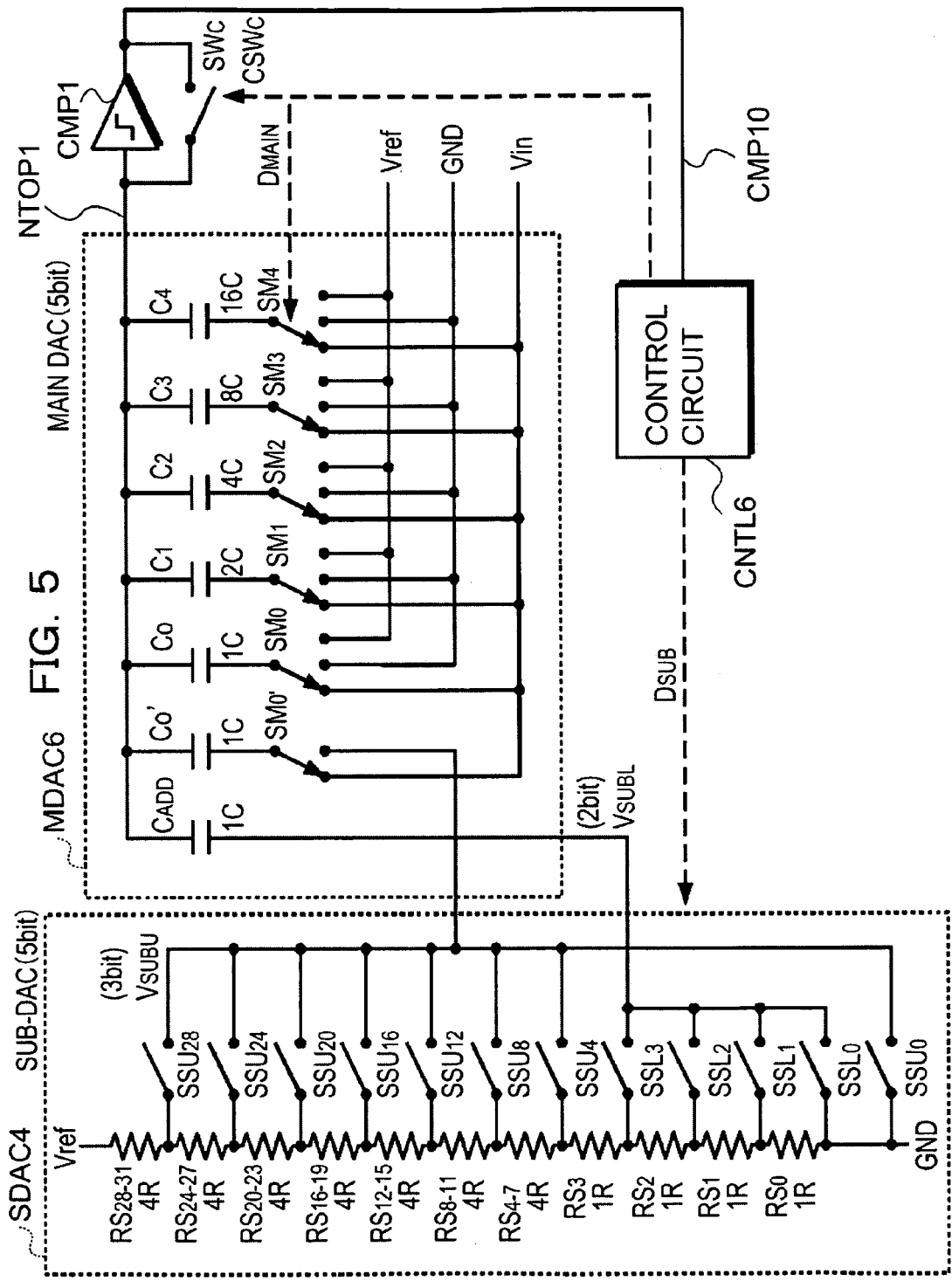
FIG. 5 illustrates another exemplary differential successive approximation A/D converter circuit.

In the circuit of FIG. 5, the total capacitance of the 5-bit capacitive main DAC (MDAC6) is $32C=2^5C$. In the circuit of FIG. 4, on the other hand, the total capacitance of the positive-side 9-bit capacitive main DAC (MDACP1) is $1024C=2^{10}C$ because, in addition to the 9-bit resolution, the circuit of FIG. 4 needs information about the sign of the signal to deal with the differential input signals.

The positive-side DAC is a 5-bit resistor string DAC. The digital input signal of the positive-side DAC is a 5-bit digital binary code $D_{sub}$ (expressed as an integer from 0 to 31 in the decimal system). The analog output voltage of the positive-side sub-DAC is $V_{SUBP}$.

The resistors $RS_0$ to $RS_{31}$ may have substantially the same resistance value and are coupled in a series of 32 elements. At the connection points voltages from 0V to $V_{ref}$ are generated with an interval of $V_{ref}/32$. A switch is coupled to each connection point. In FIG. 4, for simplification, the selector SELP is illustrated instead of switches. The switches are controlled by the signal $D_{SUB}$. The relationship between $D_{SUB}$ and $V_{SUBP}$ is given by Formula 44. Formula 44 shows that the output voltage changes among 25 levels based on $D_{SUB}$.

The output of the positive-side sub-DAC is coupled to the bottom terminal of $C_{p0}$ via the switch $SM_{p0}'$.

The negative-side DAC is a 5-bit resistor string DAC. The digital input signal of the negative-side DAC is a 5-bit digital binary code $D_{sub}$ (expressed as an integer from 0 to 31 in the decimal system). The analog output voltage of the negative-side sub-DAC is $V_{SUBN}$.

The resistor string of the negative-side resistive sub-DAC is also used as the resistor string of the resistive sub-DAC of the positive-side sub-DAC. The node potential selected by the selector SELN is controlled by the signal $D_{SUB}$. The relationship between $D_{SUB}$ and $V_{SUBN}$ is given in Formula 45. Formula 45 shows that the output voltage varies among 25 levels according to $D_{SUB}$. In contrast to the positive-side sub-DAC, in the negative-side sub-DAC, $V_{SUBN}$ decreases as $D_{SUB}$ becomes larger.

The output of the negative-side sub-DAC is coupled to the bottom terminal of $C_{n0}'$ via the switch $SM_{n0}'$.

During sampling, the switches $SM_{p9}$ to $SM_{p0}'$ are coupled to $V_{inp}$. The potential of the lower terminals (bottom plates) of the capacitors is brought to $V_{inp}$. The potential of NTOPP1 (top plates) is $V_{TOPI}$. The electric charge $Q_{sampp}$ stored on the entire capacitor array (also referred to as the entire capacitor array, the main DAC sampling capacitors, and the main DAC capacitors) is given by Formula 46.

On completion of sampling in the successive comparison operation, the nodes of the top plate NTOPP1 enter a floating state, $SM_{p0}'$ is coupled to $V_{SUBP}$, and $SM_{p9}$ is coupled to $V_{ref}$. $SM_{p8}$ to $SM_{p0}$ are coupled to terminals other than $V_{inp}$. Since the stored charge is prevented from escaping, Formula 47 may be established. $V_{outp}$ indicates the potential of the top plate. $D_{MAIN}=2^8DM_8+2^7DM_7+\ldots+2^1DM_1+2^0DM_0$. When $DM_{p8}$ to $DM_0$ are "1", $SM_{p8}$ to $SM_{p0}$ are coupled to $V_{ref}$.

Since the charge in Formula 46 is substantially equal to the charge in Formula 47, Formula 48 may be obtained.

By rearranging Formula 48, Formula 49, which gives the relationship between the potential $V_{outp}$ of the top plate during successive comparison and the digital input to the main DAC, is obtained.

By expressing the output voltage $V_{SUBP}$ of the sub-DAC in Formula 49 in terms of the digital input $D_{sub}$ of the sub-DAC, Formula 50 may be obtained.

"D" of Formula 50 is defined by Formula 51.

During the sampling of the negative-side capacitive main DAC, the switches $SM_{n9}$ to $SM_{n0}'$ are coupled to $V_{inn}$. The potential of the lower terminals (bottom plates) of the capacitors is brought to $V_{inn}$. The potential of NTOPN1 (top plates) is $V_{TOPI}$. The electric charge $Q_{sampn}$ stored on the entire capacitor array (referred to as the capacitor array, the main DAC sampling capacitors, and the main DAC capacitors) is given by Formula 52.

On completion of the sampling in the successive comparison, the nodes of the top plate NTOPN1 enter a floating state, $SM_{n0}'$ is coupled to $V_{SUBN}$, and $SM_{n9}$ is coupled to GND. $SM_{n8}$ to $SM_{n0}$ are coupled to terminals other than $V_{inn}$. Since the stored charge is prevented from escaping, Formula 53 may be established. $V_{outn}$ indicates the potential of the top plate at this time. The negative-side capacitive main DAC differs from the positive-side capacitive main DAC in that $SM_{n8}$ to $SM_{n0}$ are coupled to GND when $DM_8$ to $DM_0$ are 1.

Since $DM_8$ to $DM_0$ are one of "1" and "0", $1-DM_m$ (where "m" is an integer) indicates the reversal of the bit value.

When Formula 54 and $D_{MAIN}$ are added, the result is $2^9-1$. In other words, the bracketed terms in Formula 54 are equal to $2^9-1-D_{MAIN}$.

Since the charge in Formula 52 is substantially equal to the charge in Formula 53, Formula 55 may be obtained by equating the two formulas and rearranging.

By rearranging Formula 55, Formula 56, which expresses the relationship between the potential $V_{outn}$ of the top plate and the digital input to the main DAC during successive approximation, may be obtained.

Formula 56 includes the output voltage $V_{SUBN}$ of the sub-DAC. By expressing the output voltage $V_{SUBN}$ of the sub-DAC as the digital input $D_{SUB}$ of the sub-DAC, Formula 57 may be obtained.

The top plate potential $V_{outp}$ of the Formula 50 and the top plate potential $V_{outn}$ of Formula 57 are added, and the result is halved to give the common potential of $V_{outp}$ and $V_{outn}$.

$$(V_{outp}+V_{outn})/2=V_{TOPI}+(1/2)V_{ref}-(V_{inp}+V_{inn})/2$$

To set the common potential of the top plates during successive approximation to approximately half of the power source voltage ($V_{ref}/2$), the top plate potential $V_{TOPI}$ during sampling is set to the common potential of input signals ($V_{inp}$ and $V_{inn}$).

$$V_{TOPI}=(V_{inp}+V_{inn})/2$$

From Formula 50 and Formula 57, the relationships between the input signal ($V_{inp}$ or $V_{inn}$) and the top plate potential $V_{outp}$ of the positive-side capacitive main DAC or the top plate potential $V_{outn}$ of the negative-side capacitive main DAC may be obtained. A relationship between the top plate potential difference $V_{outp}-V_{outn}$ of the top plates and the input signal is given by the comparator CMP2 of FIG. 4 judging the potential difference between $V_{outp}$ and $V_{outn}$.

Formula 58 is obtained by subtracting Formula 57 from Formula 50.

Note that "D" of Formula 58 is defined by Formula 59.

Formula 58 shows the relationship during the successive approximation operations of the DAC input signal D, the top-plate potential difference $V_{outp}-V_{outn}$, and the analog input potential difference $V_{inp}-V_{inn}$.

According to Formula 58, when $V_{outp}-V_{outn}$ is greater than "0", the DAC output is larger than the analog input potential difference $V_{inp}-V_{inn}$. When $V_{outp}-V_{outn}$ is less than "0", the DAC output is smaller than the analog input potential difference $V_{inp}-V_{inn}$.

For instance, by using a binary search which narrows a range for $V_{inp}-V_{inn}$ by a half each time and performing comparisons for each bit to be found, the DAC digital input code (A/D conversion result), which is closest to $V_{inp}-V_{inn}$ may be obtained. Upon completion of the binary search, $V_{outp}-$ $V_{outn} \approx 0$. When $V_{outp} - V_{outn} \approx 0$ is reflected in Formula 58, Formula 60 (for the result of the A/D conversion) may be obtained.

Before the sampling, the switches $SM_{p9}$ to $SM_{p0}'$ are coupled to $V_{inp}$, and SMDp1 is switched on. The top-plate potential of the positive-side capacitive main DAC and the bottom plate potential are then substantially equal. SMSp1 is switched off. The charge in the capacitors of the positive-side capacitive main DAC is then "0" or near to "0". The switches $SM_{n9}$ to $SM_{n0}'$ are coupled to $V_{inn}$, and SMDn1 is switched on. The top-plate potential of the negative-side capacitive main DAC and the bottom plate potential are substantially equal, and the charge in the capacitors of the negative-side capacitive main DAC is "0" or near to "0".

When SMEQ1 is switched on, the top-plate potential of the positive-side capacitive main DAC and the top-plate potential of the negative-side capacitive main DAC are substantially equal, and the charge on the capacitors is "0" or near to "0".

After initialization, SMDp1 and SMDn1 are switched off, and the analog input is sampled. When SMSp1 and SMSn1 are switched on, the top-plate potential of the positive-side capacitive main DAC and the top-plate potential of the negative-side capacitive main DAC reach a common potential which is approximately equal to the input signal.

FIG. 5 illustrates another exemplary successive approximation A/D conversion circuit. The successive approximation A/D conversion circuit of FIG. 5 divides the resistive sub-DAC into an upper-order part and a lower-order part.

The devices having reference characters that begin with "RS" are resistors of the sub-DAC. The SDAC4 is a 5-bit resistive sub-DAC. MDAC6 is a 5-bit capacitive main DAC. CNTL6 is a control circuit. $SSU_0$ to $SSU_{28}$ are switches for selecting an upper-order side output of the resistive sub-DAC. $SSL_0$ to $SSL_3$ are switches for selecting a low-order side output of the resistive sub-DAC. $V_{SUBU}$ is an upper-order side output voltage from SDAC4 (resistive sub-DAC). $V_{SUBL}$ is a lower-order side output voltage from SDAC 4 (resistive sub-DAC). $D_{DUB}$ is a digital input to SDAC4. $C_{ADD}$ is a capacitor for adding $V_{SUBL}$ to NTOP1, which is the output of MDAC6.

The "1R" and "4R" which accompany the resistors $RS_m$ (where m is an integer) denote resistance values of the resistors.

The 5-bit resistive sub-DAC of FIG. 5 includes eight switches for selecting $V_{SUBU}$ corresponding to three upper-order bits and four switches for selecting $V_{SUBL}$ corresponding to two lower-order bits. The total number of switches is therefore reduced to twelve. The reduction in the number of switches allows reductions in parasitic capacitance and the time constant of the sub-DAC.

Figure 6:
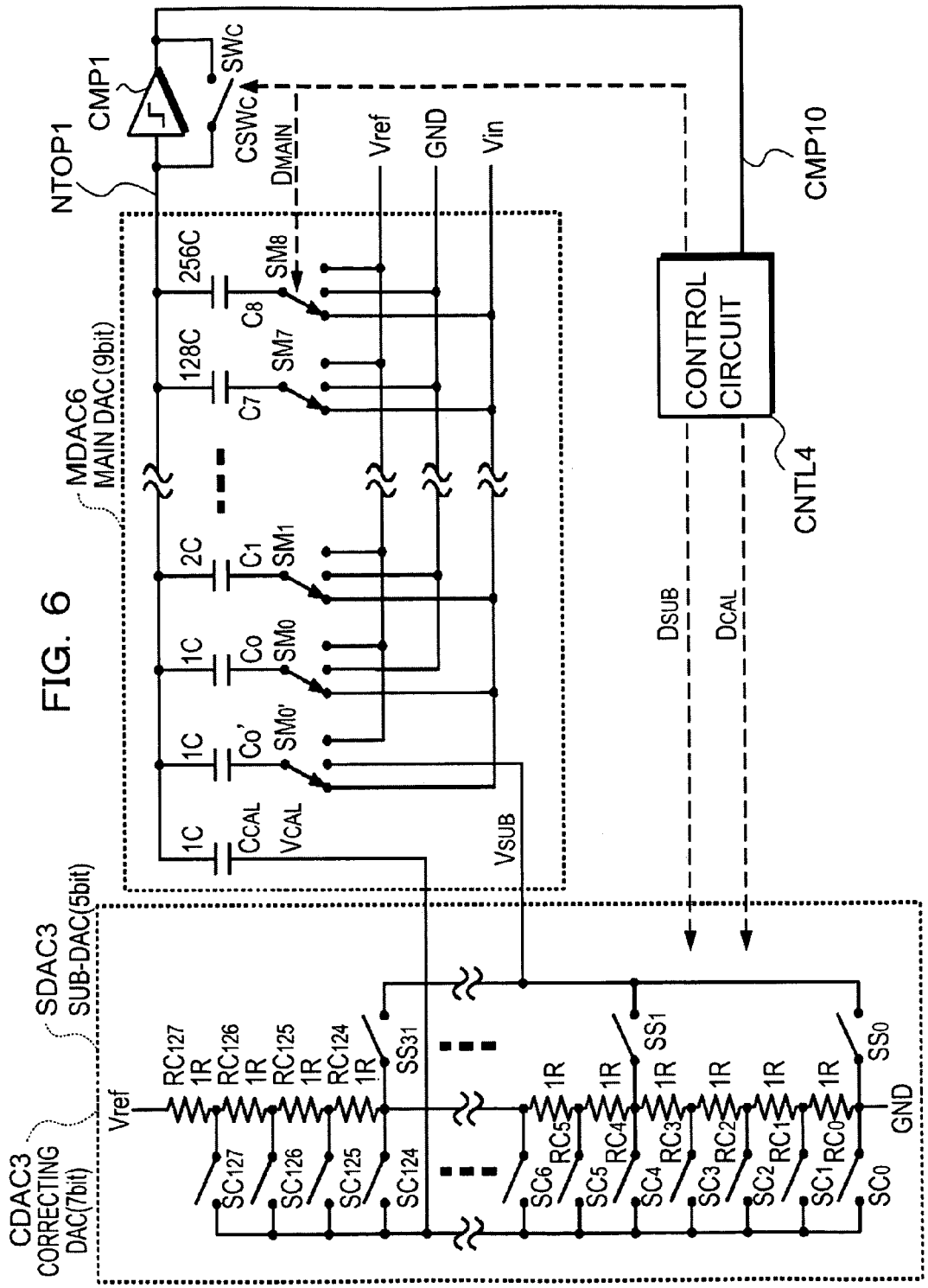
FIG. 6 illustrates an exemplary self-correcting successive approximation A/D converter circuit.

FIG. 6 illustrates an exemplary self-correcting successive approximation A/D converter. The self-correcting successive approximation A/D converter of FIG. 6 includes a 9-bit main DAC, a 5-bit sub-DAC, and a 7-bit correcting DAC. The resolution of the A/D converter of FIG. 6 is (9 bits of main DAC)+(5 bits of sub-DAC)=14 bits. The correcting DAC may correct with an interval of ¼ LSB with respect to the LSB of the 14 bits. The correction range is ±½C with respect to the capacitance 1C of the main DAC, and ±16LSB with respect to the LSB of the 14 bits.

Figure 7:
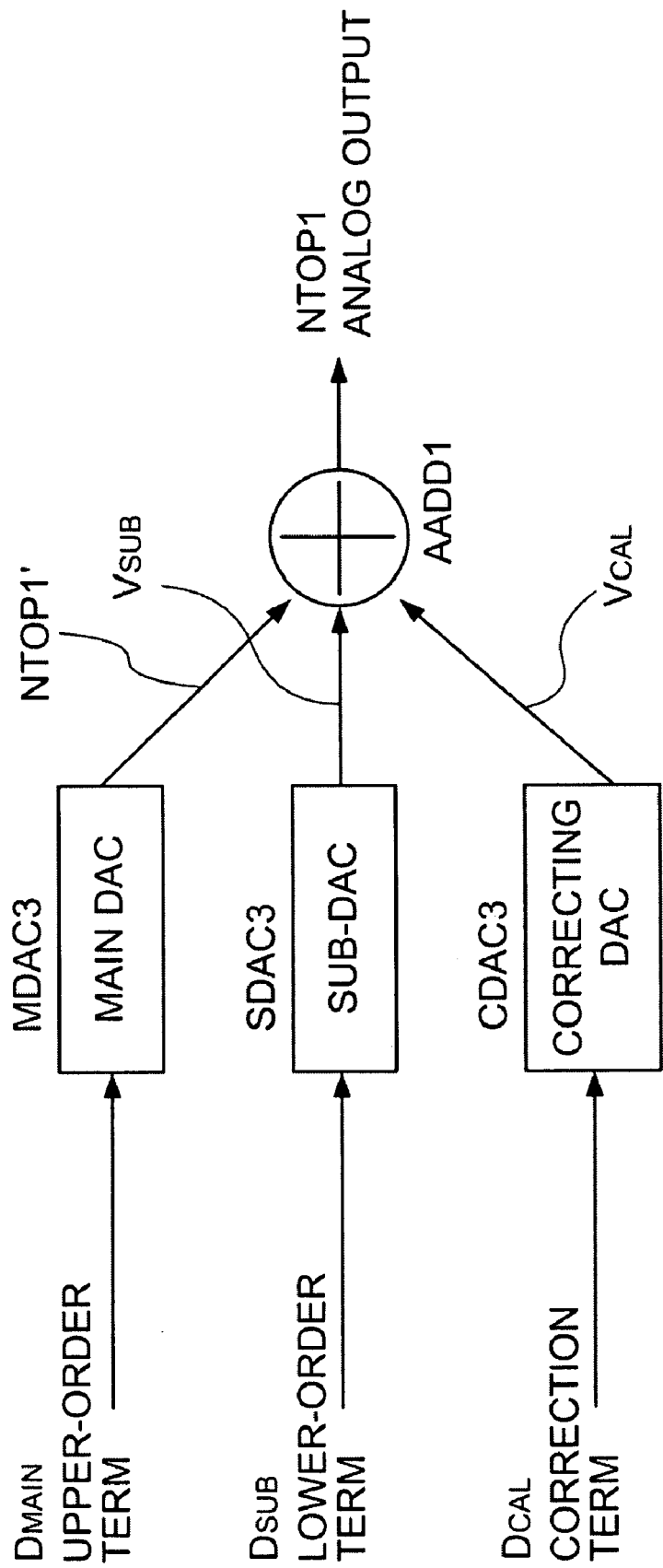
FIG. 7 illustrates another exemplary self-correcting successive approximation A/D converter circuit.

CDAC3 of FIG. 6 is an exemplary 7-bit correcting DAC. The SDAC3 is a 5-bit sub-DAC. $RC_m$ (where m is an integer) is a resistor in the correcting DAC. $SC_m$ (where m is an integer) is a switch of the correcting DAC. $SS_m$ (where m is an integer) is a switch of the sub-DAC. $D_{CAL}$ is a control input of the correcting DAC. MDAC6 denotes the main DAC. $C_{CAL}$ is a coupling capacitor for analog-adding the correcting DAC output to the top plate NTOP1. VCAL is the correcting DAC output. CNTL4 is a control circuit. FIG. 7 illustrates another exemplary a self-correcting successive approximation A/D converter circuit. The self-correcting successive approximation A/D converter circuit includes a correcting DAC (CDAC3 of FIG. 6 and FIG. 7) which receives input of a correction digital code and a sub-DAC (SDAC3 of FIG. 6 and FIG. 7) which receives input of lower-order bits of the DAC digital code ($D_{SUB}$ in FIG. 6 and FIG. 7) when the binary search is performed during normal A/D conversion operations. The correcting DAC and the sub-DAC are provided independently in the self-correcting successive approximation A/D converter circuit.

Figure 8:
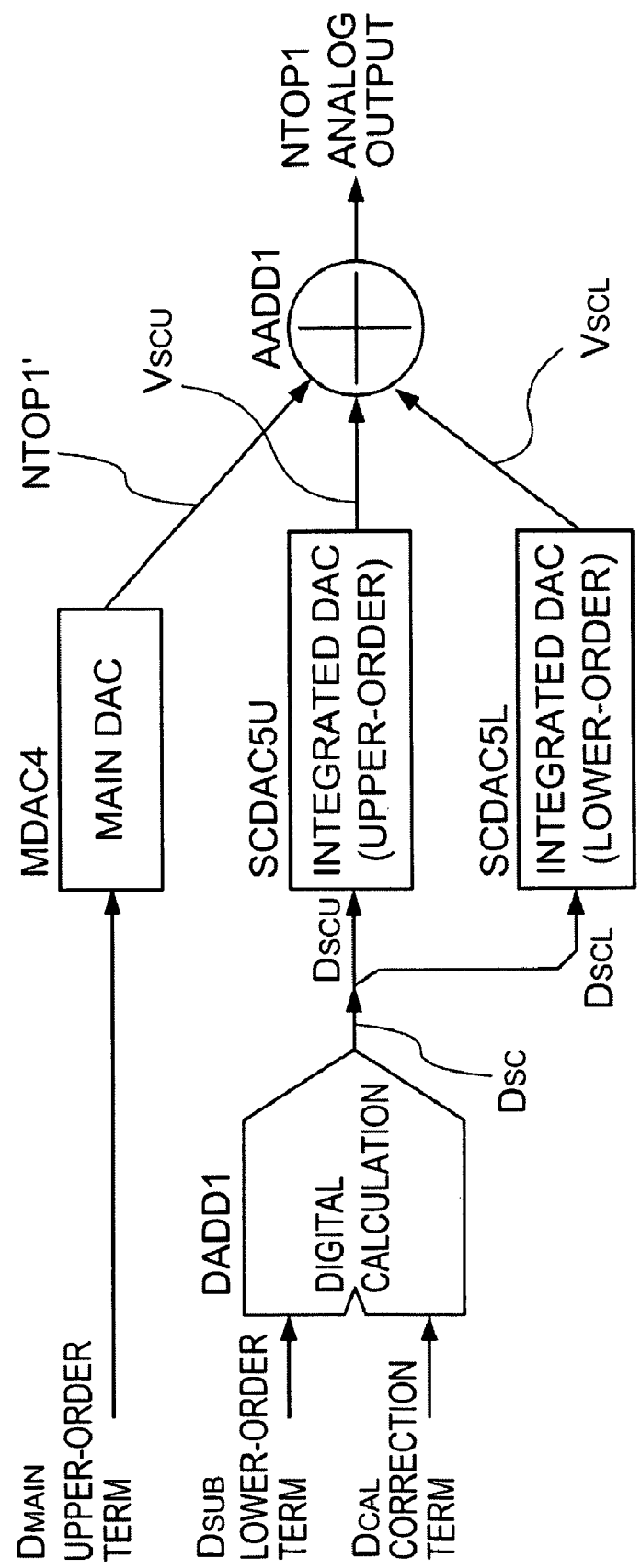
FIG. 8 illustrates a first embodiment.
Figure 9:
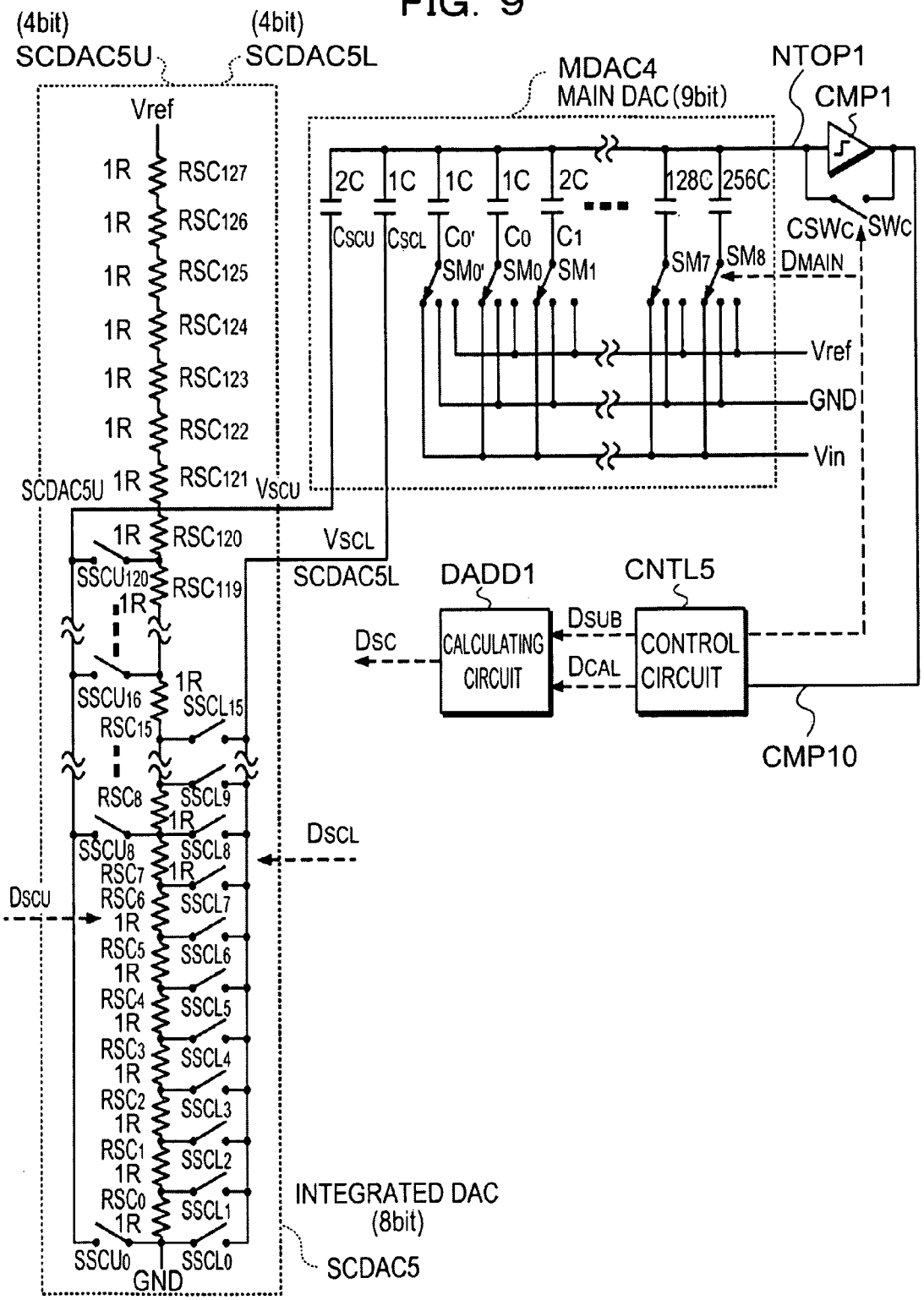
FIG. 9 illustrates the first embodiment.

FIG. 8 and FIG. 9 illustrate a first embodiment. The A/D conversion circuits of FIG. 8 and FIG. 9 include integrated DACs (SCDAC5, SCDAC5U, and SCDAC5L). A digital calculating circuit DADD1 for calculating (addition) a digital code $D_{SC}$ based on a search digital code (lower-order code) $D_{SUB}$ and a correction digital code (correction code) $D_{CAL}$ is provided.

The A/D conversion circuits of FIG. 8 and FIG. 9 include integrated DACs (SCDAC5, SCDAC5U, and SCDAC5L) which are formed by combining sub-DACs and correcting DACs. The lower-order term $D_{SUB}$ and the correction term $D_{CAL}$ are digitally added in advance to give $D_{SC}$.

The output from an integrated DAC (SCDAC5) is split into an upper-order term and a lower-order term, and the split supplies an upper-order integrated DAC (SCDAC5U) and a lower-order integrated DAC (SCDAC5L).

A digital input to the upper-order integrated DAC (SCDAC5U) is set to be the upper-order bits of the single digital code $D_{SC}$.

A digital input to the integrated DAC (SCDAC5L) is set to be the lower-order bits of the single digital code ($D_{SC}$).

Dividing the output of the integrated DAC (SCDAC5 of FIG. 9) between the upper-order integrated DAC (SCDAC5U in FIG. 8 and FIG. 9) and the lower-order integrated DAC (SCDAC5L in FIG. 8 and FIG. 9) allows a reduction in the number of switches.

The outputs ($V_{SCU}$ and $V_{SCL}$) of the upper-order integrated DAC (SCDAC5U) and the lower-order integrated DAC (SCDAC5L) are analog-added to the main DAC output (NTOP1') to give AADD1.

In order to analog-add the outputs from the upper-order integrated DAC, the lower-order integrated DAC and the main DAC, coupling capacitors ($C_{SCU}$ and $C_{SCL}$ of FIG. 9) are provided in addition to the sampling capacitors.

Since the coupling capacitors for analog-adding the outputs of the upper-order integrated DAC and the lower-order integrated DAC to the output of the main DAC may not be used as sampling capacitors, dedicated coupling capacitors may be provided.

The coupling capacitor ($C_{SCU}$ in FIG. 9) for analog-adding the output of the upper-order integrated DAC may, for instance, have a capacitance which is double that of smallest capacitor of the main DAC.

The coupling capacitor ($C_{SCL}$ in FIG. 9) for analog-adding the output of the lower-order integrated DAC may, for instance, have a capacitance substantially equal to that of smallest capacitor of the main DAC.

By setting the capacitances, an equivalent output voltage range of the integrated DAC (SCDAC5 in FIG. 9) may be double the LSB of the main DAC.

FIG. 10 illustrates a comparison between numbers of switches. In the first embodiment, the switches may be reduced as illustrated in FIG. 10.

FIG. 10 illustrates number lines which express the weightings of the outputs from each DAC. The number lines are binary weighted. The left-hand side of each number line represents upper-order bits and the right-hand side represents lower-order bits. A shift of one space to the left represents a doubling of the value and each space corresponds to a single bit.

Since the upper-order weightings are the same or similar, the digital addition illustrated in FIG. 8 and FIG. 9 of the lower-order term $D_{SUB}$ and the correction term $D_{CAL}$ is given by $2^2 * D_{SUB} + D_{CAL}$. In the first embodiment, the 8 bits are divided into upper-order 4 bits and lower-order 4 bits.

This division is illustrated using the circuit of FIG. 9 in the configuration summary of FIG. 10. The integrated DAC is split into an upper-order 4-bit portion and a lower-order 4-bit portion. The weight of the highest-order bit of the upper-order bits corresponds to the weight of the lowest-order bit of the output from the main DAC. In other words, there is a 1-bit overlap. The circuit illustrated in FIG. 9 has a resolution equivalent to (¼) LSB of the 14-bit signal. The circuit illustrated in FIG. 9 may be the 8-bit integrated DAC (SCDAC5). SCDA5 illustrated in FIG. 9 may be the 8-bit integrated DAC. SCDAC5U is a DAC responsible for upper-order bits in the integrated DAC. SCDAC5L is a DAC responsible for lower-order bits in the integrated DAC. An output $V_{SCU}$ denotes an output node of SDAC5U. The voltage at the output node $V_{SCU}$ is also denoted by $V_{SCU}$. $V_{SCL}$ denotes an output node of SDAC5L. The voltage at the output node $V_{SCL}$ is also denoted by $V_{SCL}$. The input digital code $D_{SC}$ is the code output by DADD1. The upper-order bit digital code $D_{SCU}$ indicates an input digital code to SCDAC5U. The lower-order bit digital code $D_{SCL}$ indicates an input digital code to SCDAC5L. The capacitor $C_{SCU}$ is a coupling capacitor for coupling the output voltage $V_{SCU}$ to the top-plate of the capacitor array. The capacitance value of the capacitor $C_{SCU}$ is also denoted as $C_{SCU}$. The capacitor $C_{SCL}$ is a coupling capacitor for coupling the output voltage $V_{SCL}$ to the top-plate of the capacitor array. The capacitance value of the capacitor $C_{SCL}$ is also denoted as $C_{SCL}$. DADD1 is a digital calculating circuit. Devices in FIG. 8 which have similar functions to the devices illustrated in FIGS. 1 to 6 are marked with the same symbols.

The bit-width of the integrated DAC may be expanded by a single bit to the upper-order side. This expansion may be realized, as illustrated in FIG. 8, by designing the range of the output voltage $V_{SCU}$ of the integrated DAC to be from 0 to $V_{ref}$, and coupling the output voltage $V_{SCU}$ to the top plate of the capacitor array via the coupling capacitor $C_{SCU}$ which includes a capacitance value of 2C.

The first embodiment illustrated in FIG. 9 makes use of the fact that the capacitance values of the internal capacitor array are binary weighted to perform error measurement of the capacitor array. In the first embodiment, correction data is calculated based on results of the error measurement, and stored in a memory. During A/D conversion, the correction data is read to cancel out error voltages, the errors in the capacitor array are canceled out, and high-accuracy A/D conversion may be achieved.

The integrated DAC (SCDAC5) illustrated in FIG. 9 includes a double stage configuration, which includes an upper-order DAC (SCDAC5U), and a lower-order DAC (SCDAC5L). The resistor string includes 128 unit resistors $RSC_0$ to $RSC_{127}$ which are coupled in series.

SCDAC5U may be a 4-bit resistor-string DAC which receives the upper-order bit digital code $D_{SCU}$ as an input digital signal, and outputs the output voltage $V_{SCU}$ as an output analog signal. SCDAC5U includes switches $SSCU_8$ to $SSCU_{120}$ (total of 16 switches) which are provided at connection points between strings, each of the strings including eight unit resistors and having a resistance of 8R. The relationship between the output voltage $V_{SCU}$ and the upper-order bit digital code $D_{SCU}$ is given by Formula 61. The upper-order bit digital code $D_{SCU}$ may take any integer value in a range from "0" to "15".

SCDAC5L may be a 4-bit resistor string DAC which receives the lower-order bit digital code $D_{SCL}$ as an input digital signal and outputs a voltage $V_{SCL}$ as an output analog signal. SCDAC5L includes switches $SSCL_0$ to $SSCL_{15}$ (total of 16 switches) each of which is provided at a connection point between adjacent resistors, each of the resistors having a resistance of 1R. The relationship between the output voltage $V_{SCL}$ and the lower-order bit digital code $D_{SCL}$ is expressed in Formula 62. The lower-order bit digital code $D_{SCL}$ may take any integer value in a range from "0" to "15".

The input digital code $D_{SC}$ may be an 8-bit input digital signal to the integrated DAC. The upper-order 4 bits of the 8 bits correspond to the upper-order bit digital code $D_{SCU}$ and the lower-order 4 bits of the 8 bits correspond to the lower-order bit digital code $D_{SCL}$. For instance, in the binary system, when $D_{SC}$=00011000, $D_{SCU}$=0001 and $D_{SCL}$=1000. The output voltage $V_{SCU}$ of the SCDAC5U is coupled to the top plate NTOP1 of the capacitor array via the coupling capacitor $C_{SCU}$ which has a capacitance value of 2C. The output $V_{SCL}$ of SCDAC5L is coupled to the top plate NTOP1 of the capacitor array via the coupling capacitor $C_{SCL}$ which has a capacitance value of 1C.

The resolution of the integrated DAC is $\frac{1}{128}$ with respect to the 1C unit capacitance of the capacitive DAC, and ¼LSB with respect to the LSB of the 14-bit code. The correction range of the integrated DAC is 1C with respect to 1C of the main DAC. The control circuit has added functions for appropriately performing a self-correction sequence. In the control circuit, the memory storing the correction term $D_{CAL}$ may be memory $MEM_0$ to $MEM_8$. In the error measurement, the errors in the capacitors are converted to digital values by controlling the value of the input digital code $D_{SC}$. The capacitance errors, which have been converted to digital values, are stored as the correction term $D_{CAL}$ in the memory.

First, the error of the highest-order capacitor C8 is measured. In the circuit of FIG. 9, the switch SWc is closed, the switch SM8 is coupled to $V_{ref}$ and the switch $SM_7$ and lower-order switches are coupled to GND. Closing the switch SWc brings the potential of the top plate NTOP1 to the comparator threshold value $V_T$. An initial value $D_{SC,init}$=01000000 (binary system)=64 (decimal system) is input to the integrated DAC. Inputting the initial value $D_{SC,init}$ to the integrated DAC gives $V_{SCU}$=$V_{SCU,init}$ and $V_{SCL}$=$V_{SCL,init}$. Charge $Q_{8,M-1}$ stored over the entire capacitor array is expressed as shown in Formula 63 ($C_9$ expresses the total capacitance of the capacitor array).

Next, the switch SWc is opened, the switch $SM_8$ is coupled to the GND side, and the switch $SM_7$ and lower-order switches are switched to the $V_{ref}$ side. As a result of opening the switch SWc, the top plate NTOP1 of the capacitor array enters a floating state and the stored charge is prevented from escaping. In this state, the potential of the top plate NTOP1, which is denoted by $V_{x,8}$, may be obtained from Formula 64.

Since the charge in Formula 63 is the same as the charge in Formula 64, Formula 65 may be obtained by equating the two formulas and rearranging.

By inserting the output voltages $V_{SCU}$ and $V_{SCL}$ given by Formula 61 and Formula 62 to Formula 65, Formula 66 may be obtained.

Next, the input digital code $D_{SC}$ is controlled, and a binary search is performed so that $V_{x,8}$ nears $V_T$. The comparator then judges whether the $V_{x,8}$ is higher or lower than the threshold value $V_T$. The highest-order bit is preset to "0". The bit width may be "7" bits to find the correction term $D_{CAL}$. In the measurement of the capacitance error, the input digital code $D_{SC}$ is controlled to find a digital value for the capacitance error. The obtained correction term is stored in the memory as the correction term $D_{CAL}$. During A/D conversion, the correction term $D_{CAL}$ is added to the lower-order bit digital input signal $D_{SUB}$ to give the input digital code $D_{SC}$. When $V_{x,8}$ is lower than the threshold value $V_T$, the second highest order bit is set to "1". When $V_{x,8}$ is higher than the threshold value $V_T$, the second highest order bit is set to "0".

With the third highest bit set to "1", the comparator makes another judgment. When $V_{x,8}$ is lower than the threshold value $V_T$, the third highest order bit is determined to be "1". When $V_{x,8}$ is higher than the threshold value $V_T$, the third highest order bit is determined to be "0".

With the fourth highest bit set to "1", the comparator makes a further judgment. When $V_{x,8}$ is lower than the threshold value $V_T$, the fourth highest order bit is set to "1". When $V_{x,8}$ is higher than the threshold value $V_T$, the fourth highest order bit is set to "0".

The above-described operations are repeated in descending order until the lowest-order bit is reached. When the operations (binary search) have been completed, $V_{x,8} \approx V_T$. Reflecting this equality in Formula 66 gives Formula 67 for the code on completion of the search and the correction term. The digital code $D_{SC8}$ may be the value of the input digital code $D_{SC}$ on completion of the binary search.

The correction term is obtained by halving of the difference between the value of the input digital code $D_{SC}$ on completion of the binary search and the initial value of the input digital code $D_{SC}$.

The binary search begins with an initial value of an input digital code $D_{SC}$ denoted by $D_{SC,init}$=01000000 (in the binary number system) and proceeds in descending order from the second-highest order bit. Thus, during error measurement, the attainable range of the input digital code $D_{SC}$ is 00000000 to 01111111 (expressed as a binary number) or 0 to 127 (expressed as a decimal number). Upon completion of the binary search, the calculating circuit calculates based on Formula 67 to find the correction term. For instance, when $D_{SC}$=01100000 (binary)=96 (decimal), $D_{SC}-D_{SC,init}$ is given by $D_{SC}-D_{SC,init}$=96−64=32 (decimal). Multiplying the result by ½ gives the value of the correction term, which is "16". When $D_{SC}$=00100000 (binary)=32 (decimal), $D_{SC}-D_{SC,init}$ is given by $D_{SC}-D_{SC,init}$=32−64=−32 (decimal). Multiplying the result by ½ gives the value of the correction term which is "−16". The result of $D_{SC}-D_{SC,init}$ may be a positive or a negative number.

The calculated correction term is then stored in the memory $MEM_8$ (Formula 68) as the correction term $D_{CAL}$.

In the error measurement of $C_7$, the switch SWc is closed, the switch $SM_7$ is switched to the $V_{ref}$ side, and the switches $SM_8$, $SM_6$, and switches of a lower order than $SM_6$ are coupled to the GND side. Closing the switch SWc brings the potential of the top plate NTOP1 to the comparator threshold value $V_T$. An initial value $D_{SC,init}$=01000000 (binary system)=64 (decimal system) is input to the integrated DAC. Based on the input of the initial value, $V_{SCU}=V_{SCU,init}$ and $V_{SCL}=V_{SCL,init}$. The charge $Q_{7,M-1}$ stored in the entire capacitor array is given by Formula 69.

Next, the switch SWc is opened, the switch $S_{M7}$ is coupled to the GND side, and the switch $S_{M6}$ and lower-order switches are switched to the $V_{ref}$ side. As a result of opening the switch SWc, the top plate NTOP1 of the capacitor array enters a floating state and the stored charge is prevented from escaping. The potential of the top plate NTOP1, which is denoted by $V_{x,7}$, may be obtained from Formula 70.

Since the charge in Formula 69 is substantially the same as the charge in Formula 70, Formula 71 may be obtained by equating the two formulas and rearranging.

By inserting the output voltage $V_{SCU}$ given by Formula 61 and $V_{SCL}$ given by Formula 62, Formula 72 may be obtained.

Next, the input digital code $D_{SC}$ is controlled, and a binary search is performed so that $V_{x,7}$ equals $V_T$. The comparator then judges whether $V_{x,7}$ is higher or lower than $V_T$. When $V_{x,7}$ is lower than the threshold value $V_T$, the second highest order bit is set to "1". When $V_{x,7}$ is higher than the threshold value $V_T$, the second highest order bit is set to "0".

With the third highest bit set to "1", the comparator makes another judgment. When $V_{x,7}$ is lower than the threshold value $V_T$, the third highest order bit is set to "1". When $V_{x,7}$ is higher than the threshold value $V_T$, the third highest order bit is set to "0".

With the fourth highest bit set to "1", the comparator makes a further judgment. When $V_{x,7}$ is lower than the threshold value $V_T$, the fourth highest order bit is set to "1". When $V_{x,7}$ is higher than the threshold value $V_T$, the fourth highest order bit is set to "0".

The above-described operations are repeated in descending order until the lowest-order bit is reached. When the operations (binary search) have been completed, $V_{x,7} \approx V_T$. Reflecting this equality in Formula 72 gives Formula 73 for the code on completion of the search and the correction term. The input digital code $D_{SC7}$ may be the value of the input digital code $D_{SC}$ on completion of the binary search.

The correction term is then given by halving the difference between the value of the input digital code $D_{SC}$ on completion of the binary search and the initial value of the input digital code $D_{SC}$, and subtracting, from the resulting value, the correction term found in the error measurement on $C_8$.

The binary search begins with an initial value of an input digital code DSC denoted by $D_{SC,init}$=01000000 (binary) and proceeds in descending order from the second-highest order bit. Thus, during error measurement, the attainable range of the input digital code DSC is 00000000 to 01111111 (binary) or 0 to 127 (decimal).

Upon completion of the binary search, the calculating circuit calculates based on Formula 73 to find the correction term. For instance, assume that $D_{S7}$=00100000=32 (binary) and that the value in the memory $MEM_8$ is "16". $D_{SC7}-D_{SC,init}$=32−64=−32, and halving this difference gives "−16". To obtain the correction term, a value obtained by halving the value in the memory $MEM_8$ is subtracted from the "−16" obtained above. In other words, the correction term is −16−(16/2)=−24. Note that, in this calculation, the signs of the values are taken into account.

The calculated correction term $D_{CAL}$ is then stored in the memory $MEM_7$ [Formula 74].

Error measurements are performed on the capacitors $C_6$ to $C_0$ in the same way or in the similar way and the respective correction terms are calculated. Based on the errors obtained in the measurements, the values which are to be stored in the memory may be obtained from Formula 75. The calculated correction terms are stored in memories $MEM_6$ to $MEM_0$.

During the A/D conversion, the correction terms $D_{CAL}$, which have been stored in the memory, are read and an A/D conversion is performed so that the errors in the capacitor array are cancelled out.

At sampling, the switch SWc is closed. Closing the switch SWc brings the potential of the top plate NTOP1 to the comparator threshold value $V_T$. Further, when the switches $SM_8$ to $SM_0$' are switched to the $V_{in}$ side, the potentials of the lower terminals (bottom plates) of $C_8$ to $C_0$' and $C_0$ of the capacitor array are brought to the analog input voltage $V_{in}$. An initial value $D_{SC,init}$=01000000 (binary system)=64 (decimal system) is input to the integrated DAC, giving $V_{SCU}=V_{SCU,init}$ and $V_{SCL}=V_{SCL,init}$. The charge $Q_{samp}$ stored in the entire capacitor array is expressed in Formula 76 (where $C_9$ is the capacitance of the entire array).

When the switch SWc is opened, the switches $SM_8$ to $SM_0$ are switched to a terminal other than $V_{in}$ and the switch $SM_0'$ is switched to the GND side. As a result of opening the switch SWc, the nodes of the top plate NTOP1 enter a floating state and the stored charge is prevented from escaping. In this state, the potential of the top plate NTOP1, which is denoted by $V_{out}$, may be obtained from Formula 77.

Since the charge in Formula 76 is equal to the charge in Formula 77, Formula 78 may be obtained by equating the two formulas and rearranging the result for the top-plate potential $V_{out}$.

By inserting the output voltage $V_{SCU}$ given by Formula 61 and the output voltage $V_{SCL}$ given by Formula 62, Formula 79 may be obtained.

When the capacitance errors in the capacitances $C_0'$ and $C_0$ to $C_8$ are taken into account in accordance with Formula 12, Formula 80 may be obtained. The fourth term may be a voltage which may be controlled by the input digital code $D_{SC}$. The fifth term expresses the influence of the capacitance errors of $C_0'$ and $C_0$ to $C_8$ on the top-plate potential $V_{out}$.

In the successive approximation operation of the A/D conversion, an input digital code $D_{SC}$ given by Formula 81 is input based on each bit of the upper-order bit digital input signal $D_{MAIN}$.

When the highest-order bit is determined in the successive approximation operation of the A/D conversion, $D_{MAIN}$=100000000, $D_{SC}=D_{SC,init}-MEM_8$, and the error in the capacitor array is cancelled out. The comparator then judges whether the top-plate potential $V_{out}$ is higher or lower than the threshold value $V_T$. The stage of determining highest-order bit using Formula 81 is given in Formula 82.

The error is cancelled out, and, when the top-plate potential $V_{out}$ is less than the threshold value $V_T$, the highest-order bit is determined to be "1". When the top-plate potential $V_{out}$ is greater than the threshold value $V_T$, the highest-order bit is determined to be "0".

With the second-highest bit set to "1", the comparator makes a further judgment. When the highest-order bit has been set to "1", $D_{MAIN}$=110000000. Based on Formula 81, the input digital code $D_{SC}$ is then given by $D_{SC}=D_{SC,init}-MEM_8-MEM_7$. The top-plate potential $V_{out}$ is expressed in Formula 83 and the error of the top-plate potential $V_{out}$ is cancelled out.

When the highest-order bit has been set to "0", $D_{MAIN}$=010000000. Based on Formula 81, the input digital code DSC may be $D_{SC}=D_{SC,init}-MEM_7$. The top-plate potential $V_{out}$ is expressed in Formula 84 and the error of the top-plate potential $V_{out}$ is cancelled out.

Thus the error is cancelled out, and, when the top-plate potential $V_{out}$ is less than the threshold value $V_T$, the second-highest order bit is set to "1". When the top-plate potential $V_{out}$ is greater than the threshold value $V_T$, the second-highest order bit is set to "0".

These operations are repeated in descending order until the lowest-order bit is reached, and all (9 upper-order bits) of the digital input signal $D_{MAIN}$ have been set.

When setting the tenth-highest order bit, $2^2 * D_{SUB}$=01000000 is added to the input digital code $D_{SC}$ ($D_{SC}=D_{SC}$+01000000), and the comparator judges. The lowest order bit of the lower-order bit digital input signal $D_{SUB}$ corresponds to the weight of the LSB of the 14 bits. The weight of the input digital code $D_{SC}$ corresponding to the weight of LSB is the third lowest-order bit, and so the lower-order bit digital input signal $D_{SUB}$ is multiplied by $2^2$. The subsequent calculation of the input digital code $D_{SC}$ is given in Formula 85. Formula 85 is Formula 81 with an added term corresponding to the lower bit digital input signal $D_{SUB}$. Formula 85 may be applied in all cases during the A/D conversion.

When the top-plate potential $V_{out}$ is less than the threshold value $V_T$, the tenth-highest order bit is set to "1". When the top-plate potential $V_{out}$ is greater than the threshold value $V_T$, the threshold tenth-highest order bit is set to "0".

When setting the eleventh highest order bit, 00100000 is added to the input digital code $D_{SC}$ ($D_{SC}=D_{SC}$+00100000), and the comparator judges. When the top-plate potential $V_{out}$ is less than $V_T$, the eleventh highest order bit is set to "1". When the top-plate potential $V_{out}$ is greater than $V_T$, the eleventh highest order bit is set to "0".

The above described process is repeated until the lowest-order bit is reached, e.g., until $D_{SC}=D_{SC}$+00000100.

According to the above-described process, the result of the A/D conversion is determined beginning with the upper-order bits. The result of the A/D conversion is obtained by aligning, under the binary number system, an upper-order bit digital input signal $D_{MAIN}$ and a lower-order bit digital input signal $D_{SUB}$ ($D_{MAIN}*2^5+D_{SUB}$).

Figure 11:
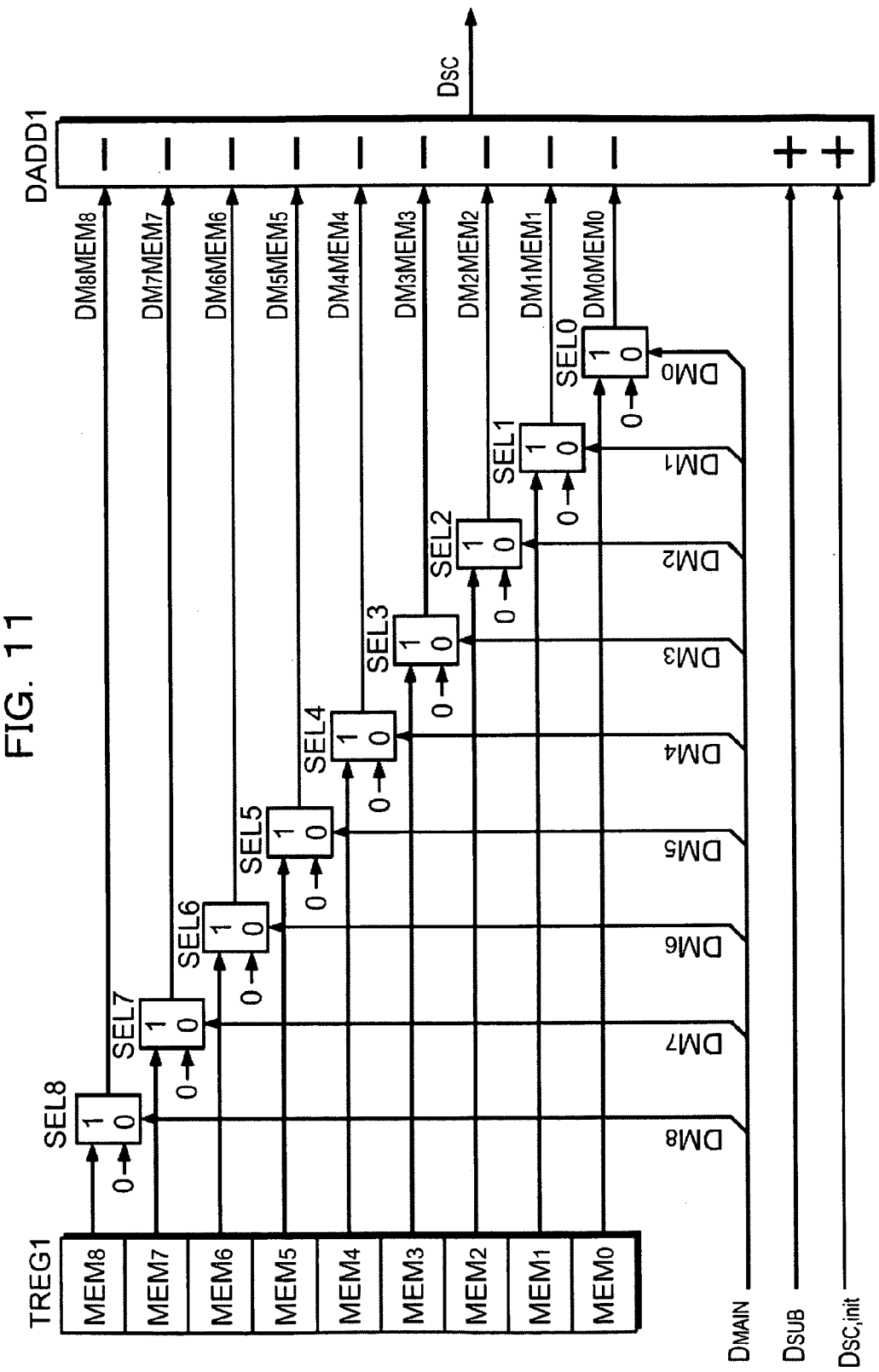
FIG. 11 illustrates a calculation circuit.

Formula 85 shows a calculation method for the input digital code $D_{SC}$ of the integrated DAC. The calculation shown in Formula 85 may, for instance, be realized using the circuit shown in FIG. 11. The circuit shown in FIG. 11 includes 7-bit registers $MEM_0$ to $MEM_8$, a register file TREG 1 which includes the 7-bit registers $MEM_0$ to $MEM_8$, selectors $SEL_0$ to $SEL_8$, and an adder/subtractor circuit DADD1. In FIG. 10, devices which operate in the same way as or the similar way to devices illustrated in FIG. 1 to FIG. 9 are assigned the same symbols. The nodes of FIG. 11, which correspond to the nodes in FIG. 1, FIG. 2 and FIG. 3, are assigned the same symbols. Further descriptions of previously-described portions are omitted.

Each 7-bit register $MEM_0$ to $MEM_8$ stores correction data. The selector $SEL_1$ outputs the data from the corresponding element of the 7-bit register $MEM_0$ to $MEM_8$ when the corresponding selection signal among the selection signals $DM_0$ to $DM_8$ is "1". The selector $SEL_1$ outputs a value of "0" when the corresponding selection signal among the selection signals $DM_0$ to $DM_8$ is "0". The selection signals $DM_0$ to $DM_8$ correspond to the respective bits of the digital input signal $D_{MAIN}$. The outputs $DM_0MEM_0$ to $DM_8MEM_8$ of the selector $SEL_1$ are the partial products of Formula 85.

The adder/subtractor circuit DADD1 performs additions or subtractions of the input signals, and outputs the input digital code $D_{SC}$. The positive signs in FIG. 11 indicate additions and the negative signs in FIG. 11 indicate subtractions. The adder/subtractor circuit DADD1 receives input of the partial products $DM_0MEM_0$ to $DM_8MEM_8$, the lower-order bit digital input signal $D_{SUB}$, and the input digital code initial value $D_{SC,init}$. The operational circuit DADD1 performs calculations based on the inputs, and outputs the input digital code $D_{SC}$.

Figure 12:
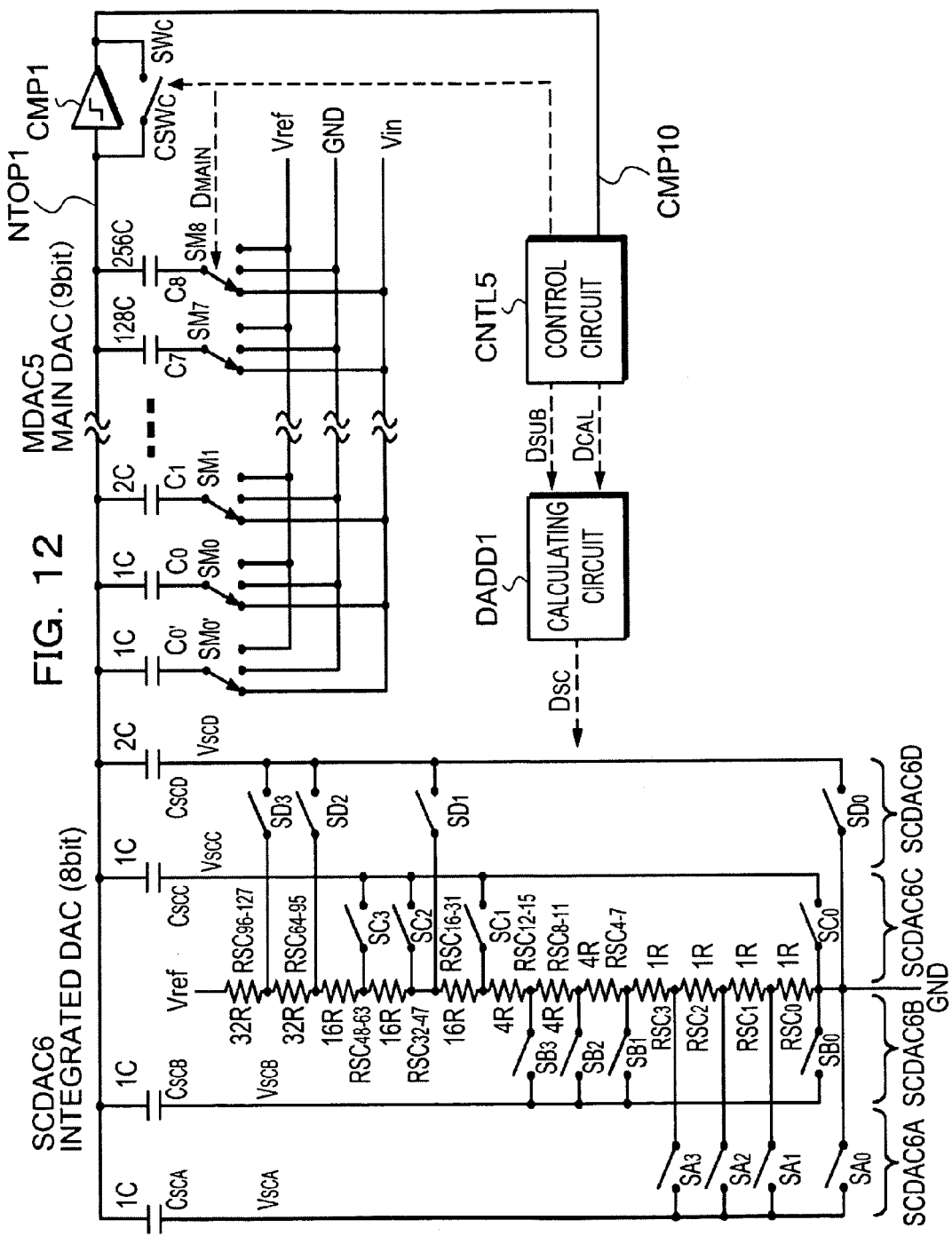
FIG. 12 illustrates a second embodiment.

FIG. 12 illustrates a third embodiment. In the first embodiment illustrated in FIG. 9, the 8-bit integrated DAC includes a 2-stage (4 bit+4 bit) configuration. In the third embodiment, however, the integrated DAC includes a 4-stage (2 bit+2 bit+2 bit+2 bit) configuration.

SCDAC6 denotes an 8-bit integrated DAC. SCDAC6A corresponds to the lowest-order bit and the second-lowest order bit in the 8-bit integrated DAC. SCDAC6B corresponds to the third-lowest order bit and the fourth-lowest order bit of the 8-bit integrated DAC. SCDAC6C corresponds to the fifth-lowest order bit and the sixth-lowest order bit of the 8-bit integrated DAC. SCDAC6D corresponds to the eighth-lowest order bit and the seventh-lowest order bit of the 8-bit integrated DAC. The switches $SA_0$ to $SA_3$ select a voltage in SCDAC6A. The switches $SB_0$ to $SB_3$ select a voltage in SCDAC6B. The switches $SC_0$ to $SC_3$ select a voltage in SCDAC6C. The switches $SD_0$ to $SD_3$ select a voltage in SCDAC6D. SCDAC6A includes an output node and an output voltage ($V_{SCA}$). SCDAC6B includes an output node and an output voltage ($V_{SCB}$). SCDAC6C includes an output node and an output voltage ($V_{SCC}$). SCDAC6D includes an output node and an output voltage ($V_{SCD}$). $C_{SCA}$ denotes a coupling capacitor for the output of SCDAC6A. $C_{SCB}$ denotes a coupling capacitor for the output of SCDAC6B. $C_{SCC}$ denotes a coupling capacitor for the output of SCDAC6C. $C_{SCD}$ denotes a coupling capacitor for the output of SCDAC6D.

In FIG. 12, devices which operate in the same way as or the similar way to the devices illustrated in FIG. 1 to FIG. 11 are assigned the same symbols. The nodes of FIG. 12 which correspond to the nodes in FIG. 1 FIG. 2, and FIG. 3 are assigned the same symbols. Further descriptions of previously-described portions are omitted.

In FIG. 12, the resistor string includes 128 resistors which are denoted by $RSC_0$ to $RSC_{127}$, and each resistor has a resistance value of 1R. In the DAC (SCDAC6A) corresponding to the weights of the lowest-order and second-lowest order bits, the switches $SA_0$ to $SA_3$ are provided with a resistance interval of 1R. The output $V_{SCA}$ of SCDAC6A is coupled to the top plate of the capacitor array of the main DAC via the coupling capacitor $C_{SCA}$ which has a capacitance of 1C. The voltage change corresponding to one stage in $V_{SCA}$ is $1/128$ with respect to LSB of the capacitor array of the main DAC.

The DAC (SCDAC6B) corresponding to the weights of the third-lowest order and fourth-lowest order bits is provided with the switches $SB_0$ to $SB_3$ with a resistance interval of 4R. The output $V_{SCB}$ of SCDAC6B is coupled to the top plate of the capacitor array of the main DAC via the coupling capacitor $C_{SCB}$ which has a capacitance of 1C. The voltage change corresponding to one stage in $V_{SCB}$ is $1/32$ with respect to 1LSB of the capacitor array of the main DAC.

The DAC (SCDAC6C) corresponding to the weights of the fifth-lowest order and sixth-lowest order bits is provided with switches $SC_0$ to $SC_3$ with a resistance interval of 16R. The output $V_{SCC}$ of SCDAC6C is coupled to the top plate of the capacitor array of the main DAC via the coupling capacitor $C_{SCC}$ which has a capacitance of 1C. The voltage change corresponding to one stage in $V_{SCC}$ is $1/8$ with respect to 1LSB of the capacitor array of the main DAC.

The DAC (SCDAC6D) corresponding to the weights of the seventh-lowest order and eighth-lowest order bits is provided with the switches $SD_0$ to $SD_3$ with a resistance interval of 32R. The output $V_{SCD}$ of SCDAC6D is coupled to the top plate of the capacitor array of the main DAC via the coupling capacitor $C_{SCD}$ which has a capacitance of 2C. The voltage change corresponding to one stage in $V_{SCD}$ is $1/2$ with respect to 1LSB of the capacitor array of the main DAC.

Since the weights of SCDAC6A, SCDAC6B, SCDAC6C, and SCDAC6D all differ by a factor of 4, the circuit of FIG. 12 operates as an 8-bit integrated DAC. The resolution of the integrated DAC is $1/128$ with respect to 1LSB of the capacitor array, and the correction range is 1LSB with respect to the 1LSB of the capacitor array. The output range of the integrated DAC is 2LSB with respect to 1LSB of the capacitor array. Since 1LSB of the 2LSB is used as the sub-DAC output, the remaining 1LSB is the correction range.

The basic functions of the circuit illustrated in FIG. 12 are the same as or similar to those in the circuit illustrated in FIG. 8. The method for measuring errors in the capacitor array of the circuit of FIG. 12, the method for calculating the correction data, and the procedure for the A/D conversion are the same as or similar to the methods and procedures for the circuit of FIG. 8. In the circuit of FIG. 12, however, the coupling capacitor is increased from 3C to 5C and the number of switches in the integrated DAC is reduced from 32 to 16 (in comparison to the circuit of FIG. 8).

Circuits may also be divided in other ways. For instance, an 8-bit integrated DAC may be configured with 8 stages (1 bit+1 bit+1 bit+1 bit+1 bit+1 bit+1 bit+1 bit). In this case, the coupling capacitor for the highest-order bit has a capacitance of 2C and the other coupling capacitors have a capacitance of 1C, giving an overall capacitance of 10C. The number of switches in such an integrated DAC is 16.

The number of stages in an integrated DAC may be freely selected. When the number of stages increases, the coupling capacitor increases and the number of switches is reduced.

Figure 13:
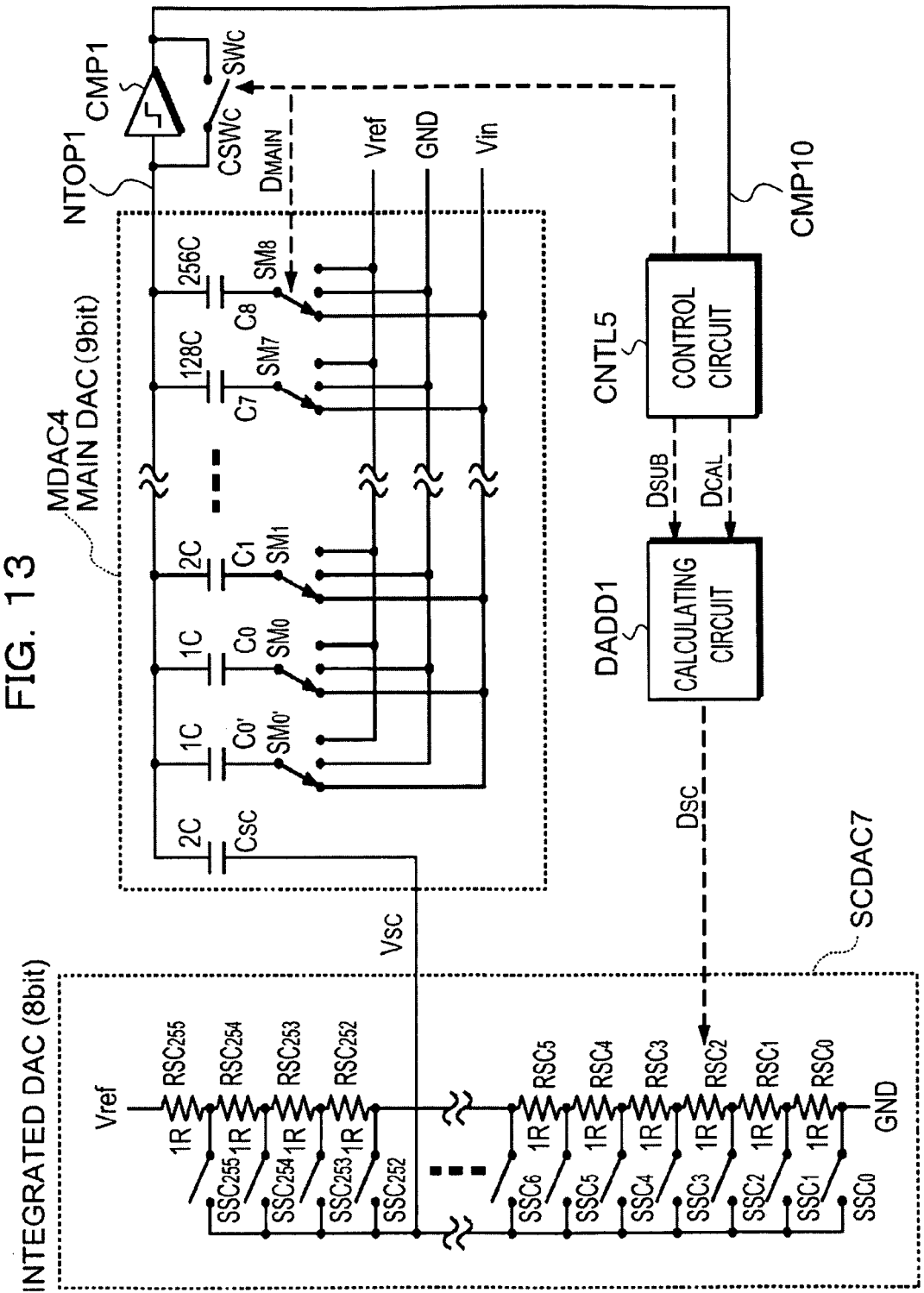
FIG. 13 illustrates a third embodiment.

FIG. 13 illustrates a third embodiment. The integrated DAC of the third embodiment differs from the divided 8-bit integrated DACs in the first embodiment of FIG. 9 and the second embodiment of FIG. 12.

SCDAC7 denotes an 8-bit integrated DAC. $SSC_0$ to $SSC_{255}$ are switches for voltage selection in SCDAC7. $V_{SC}$ denotes an output node and output voltage of SCDAC7.

In FIG. 13, devices which operate in the same way as or the similar way to the devices illustrated in FIG. 1 to FIG. 12 are assigned the same symbols. The nodes of FIG. 13, which correspond to the nodes in FIG. 1, FIG. 2 and FIG. 3, are assigned the same symbols. Further description of previously described portions is omitted.

The resistor string in FIG. 13 includes 256 resistors which are denoted by $RSC_0$ to $RSC_{255}$, and each resistor has a resistance of 1R. In the integrated DAC (SDAC7), switches $SSC_0$ to $SSC_{255}$ are provided with a resistance interval of 1R. The output $V_{SC}$ of SCDAC7 is coupled to the top plate of the capacitor array of the main DAC via the coupling capacitor $C_{SC}$ which has a capacitance of 2C.

The circuit of FIG. 13 operates as an 8-bit integrated DAC. The resolution of the integrated DAC is $1/128$ with respect to the LSB of the capacitor array, and the correction range is 1LSB with respect to the LSB of the capacitor array. The circuit of FIG. 13 has substantially the same functions as or similar functions to the circuit in FIG. 9 and the circuit in FIG. 12. The method for measuring errors in the capacitor array of the circuit of FIG. 13, the method for calculating the correction terms, and the A/D conversion procedure are substantially the same as or similar to the methods and procedures for the circuit of FIG. 9.

A single DAC (integrated DAC) formed by integrating the sub-DAC and the correcting DAC may be used in a configuration in which the integrated DAC is not divided. In the divided integrated DAC, a monotonic increase characteristic of the integrated DAC is ensured by a resistor string-type DAC. However, errors in the coupling capacitors may degrade the monotonicity. In the circuit illustrated in FIG. 13, the same single capacitor $C_{SC}$ is used as the coupling capacitor for the error measurement and the coupling capacitor for the error correction. Since the errors in the coupling capacitor do not affect the monotonicity, the accuracy of A/D conversion is higher than that in the divided case. Compared with the first embodiment illustrated in FIG. 9, the coupling capacitor in the third embodiment has been reduced from 3C to 2C and the number of switches of the integrated DAC in the third embodiment has been increased from 32 to 256.

Figure 14:
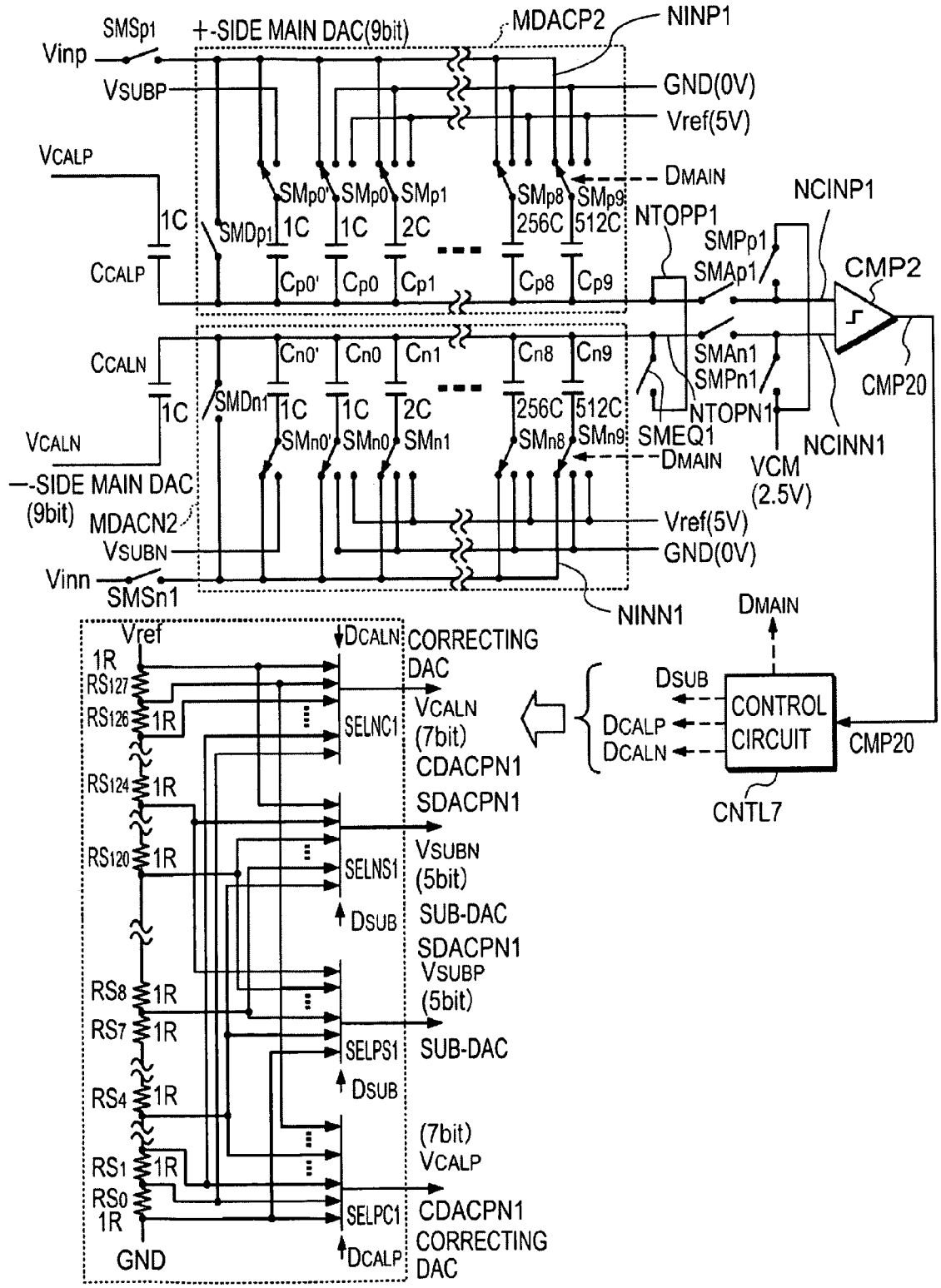
FIG. 14 illustrates a fourth embodiment.

FIG. 14 illustrates a fourth embodiment. The circuit of FIG. 14 operates as a successive approximation A/D conversion circuit.

In the circuit illustrated in FIG. 14, the resolution of the main DAC is 9 bits, the resolution of the sub-DAC is 5-bits, and the resolution of the correcting DAC is 7 bits.

$RS_0$ to $RS_{127}$ of FIG. 14 are resistors. $V_{ref}$ denotes a reference voltage (e.g., 5 V) for the A/D converter and a voltage value of the reference value. GND indicates potential of 0V. $V_{inp}$ is a positive-side analog input signal. $V_{inn}$ is a negative-side analog input signal. Devices beginning with "SM" are switches of a capacitive main DAC. MDACP2 denotes a positive-side capacitive main DAC. MDACN2 denotes a negative-side capacitive main DAC. Devices beginning with "C" are capacitors. CMP2 is a comparator. CMP2O denotes an output of the comparator CMP2. $V_{CM}$ denotes a potential that is approximately half the power source voltage. SDACPN1 is a resistive sub-DAC. CDACPN1 is a resistive correcting DAC. CNTL7 is a control circuit. $V_{SUBP}$ denotes an output voltage of the positive-side resistive sub-DAC. $V_{CALP}$ denotes an output voltage of the positive-side resistive correcting DAC. $V_{SUBN}$ denotes an output voltage of the negative-side resistive sub-DAC. $V_{CALN}$ denotes an output voltage of the negative-side resistive correcting DAC. $D_{SUB}$ denotes an input digital signal to the sub-DAC. $D_{MAIN}$ denotes an input digital signal to the capacitive main DAC. SELNC1 is an output selector of the negative-side correcting DAC. SELNS1 is an output selector of the negative-side sub-DAC. SELNP1 is an output selector of the positive-side correcting DAC. SELPS1 is an output selector of the positive-side sub-DAC. NTOPP1 is a top plate of the positive-side capacitive main DAC. NTOPN1 is a top plate of the negative-side capacitive main DAC. NINP1 is an internal input node which receives input of $V_{inp}$. NINN1 is an internal input node which receives input of $V_{inn}$. NCINP1 and NCINN1 denote comparator inputs. $C_{CALP}$ and $C_{CALN}$ denote coupling capacitors for adding $V_{CALP}$ and $V_{CALN}$ to the top-plate potential.

The "1R" next to each of resistor $RS_0$ to $RS_{127}$ denotes a respective resistance value. The "1C" and other values accompanying the capacitors ($C_{p0}'$, $C_{p0}$, $C_{p1}$, etc.) in the drawing indicate respective capacitance values.

In FIG. 14, devices which function in the same way as or similar way to the devices illustrated in FIG. 1, FIG. 2, FIG. 4, and FIG. 9 are assigned the same symbols. Moreover, the nodes in FIG. 14, which correspond to nodes in FIG. 1, FIG. 2, FIG. 4 and FIG. 9, are given the same symbols. Further descriptions of previously described portions are omitted.

The circuit of FIG. 14 is a successive approximation A/D conversion circuit which performs A/D conversion on a potential difference of $V_{inp}-V_{inn}$ in the same way as or similar way to the circuit of FIG. 4. In the circuit of FIG. 4, the positive-side main DAC and the negative-side main DAC each include a sub-DAC (SDACPN1) and a correcting DAC (CDACPN1). To correct the errors in the positive-side main DAC and the negative-side main DAC, independent correction digital codes (correction codes denoted by $D_{CALP}$ and $D_{CALN}$ in FIG. 14) are prepared.

The positive-side capacitive main DAC and the negative-side capacitive main DAC are both successive approximation A/D conversion circuits and both operate in substantially the same way or in the similar way. One difference is that the top-plate potential during sampling is used as the common potential of an input analog signal. The other difference is that the negative-side capacitive main DAC performs operations which are complementary to the operations of the positive-side capacitive main DAC. For instance, in the positive-side capacitive main DAC, capacitance errors are corrected using the same method as or similar method to the method used in the self-correcting successive approximation A/D conversion circuit. In the negative-side capacitive main DAC, capacitance errors are corrected using a method which is the same as or similar to the method used in the self-correcting successive approximation A/D conversion circuit when it is considered that the potentials in the negative-capacitive main DAC have the reversed potentials of the positive-side capacitive main DAC.

The capacitance errors are measured for the positive-side capacitive main DAC and the negative-side capacitive main DAC and respective correction digital codes (correction codes) are stored in the memory. During the A/D conversion, the positive-side capacitive main DAC and the negative-side capacitive main DAC correct the capacitance errors using the independent correction digital codes (correction codes denoted by $D_{CALP}$ and $C_{CALN}$ in FIG. 14).

Figure 15:
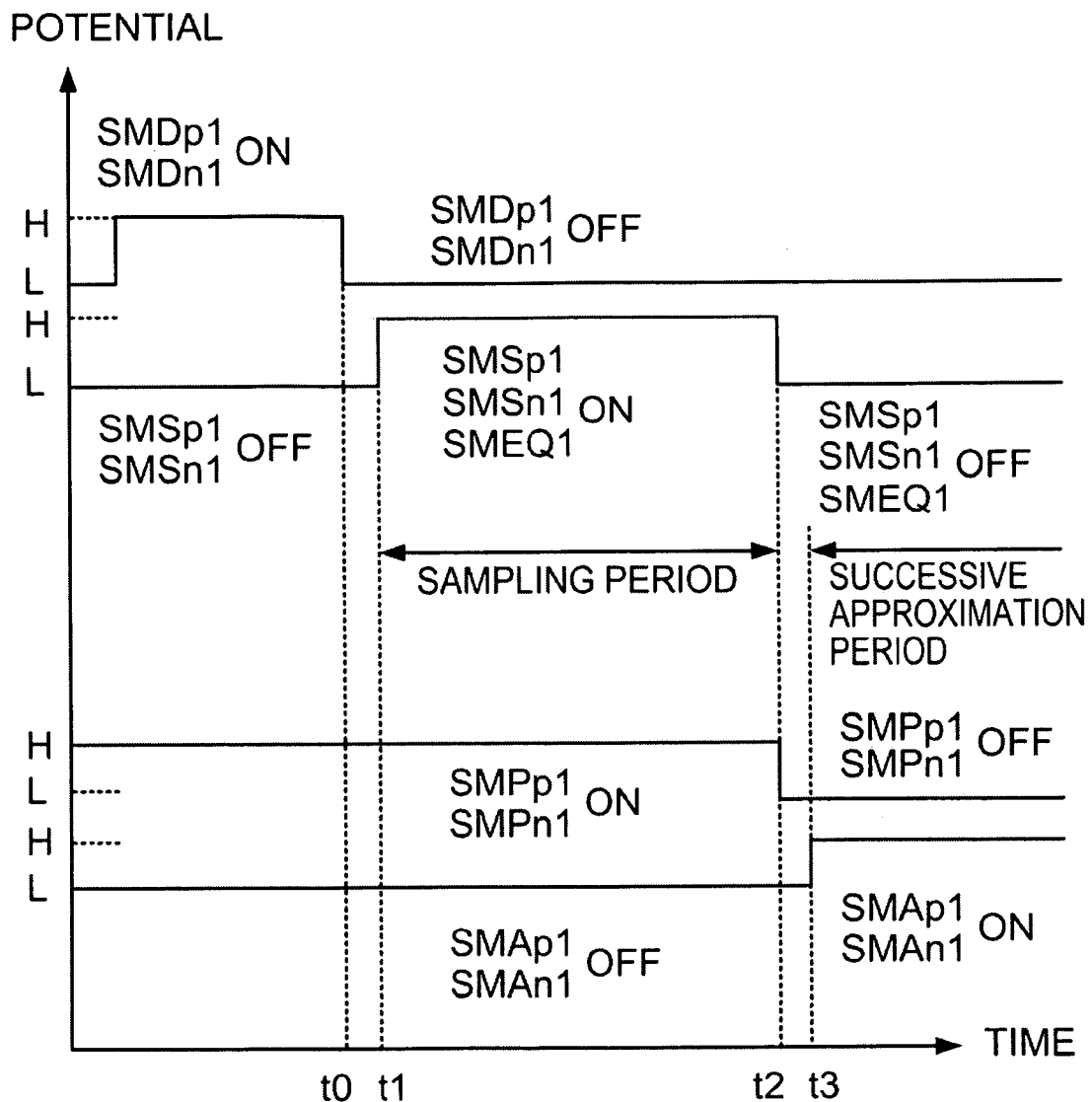
FIG. 15 illustrates an exemplary switch control in A/D conversion according to the fourth embodiment.

FIG. 15 illustrates an exemplary switch control during A/D conversion in the circuit of FIG. 14. The horizontal axis of FIG. 15 indicates time and the vertical axis indicates voltages of the control signals of the switches. The switch names in FIG. 15 correspond to the switches in FIG. 14.

Before sampling, the switches $SM_{p9}$ to $SM_{p0}'$ are coupled to $V_{inp}$ (NINP1). SMDp1 is switched on (for the period up to timing t0 in FIG. 15). The top-plate potential of the positive-side capacitive main DAC and the bottom plate potential thereof are then substantially equal or close each other. When SMSp1 is switched off, the charge on all the capacitors of the positive-side capacitive main DAC is "0" or close to "0". The switches $SM_{n9}$ to $SM_{n0}'$ are coupled to $V_{inn}$ (NINN1). SMDn1 is switched on (for the period up to timing t0 in FIG. 15). The top-plate potential of the negative-side capacitive main DAC and the bottom plate potential thereof are then substantially equal to or close to each other, and the charge in all the capacitors of the negative-side capacitive main DAC is "0" or close to "0".

When SMEQ1 is switched on, the top-plate potential of the positive-side capacitive main DAC and the top-plate potential of the negative-side capacitive main DAC are substantially equal or close each other, and the charge in all the capacitors is "0" or close to "0".

After initialization, at timing t0, SMDp1 and SMDn1 are switched off and SMSp1 is switched on. At timing t1, SMSn1 is switched on and the analog input is sampled. SMEQ1 is also switched on. Since the charge on all the capacitors of the positive-side capacitive main DAC is "0" or close to "0" and the charge on all the capacitors on the negative-side capacitive main DAC is "0" or close to "0", the sampling operation divides $V_{inp}$ and $V_{inn}$ with the substantially equal capacitances. The top-plate potential of the positive-side capacitive main DAC and the top-plate potential of the negative-side capacitive main DAC then have a common potential of the input signal.

In the sampling period, a comparator offset may be stored in a capacitor within the comparator and the comparator offset may be cancelled. With SMPp1 and SMPn1 switched on, the input potential of the comparator is biased to a final value of a comparator input potential which is set in advance by successive approximation. The switches SMAp1 and SMAn1 for transmitting the top-plate potential (NTOPP1) of the positive-side capacitive main DAC and the top-plate potential (NTOPN1) of the negative-side capacitive main DAC to the comparator inputs (NCINP1 and NCINN1) are switched off.

Upon completion of the sampling period (timing t2), SMEQ1 is switched off. Further, SMSp1 and SMSn1 are switched off. Since, in the successive approximation period after the completion of the sampling period, the comparator compares the input voltage and the DAC outputs, SMPp1 and SMPn1 are both switched off.

In the successive approximation period (timing t3), SMAp1 and SMAn1 are switched on, the top-plate potentials (NTOPP1 and NTOPN1) are transmitted to the comparator inputs (NCINP and NCINN1), and the A/D conversion result is determined one bit at a time from the highest-order bit.

Figure 16:
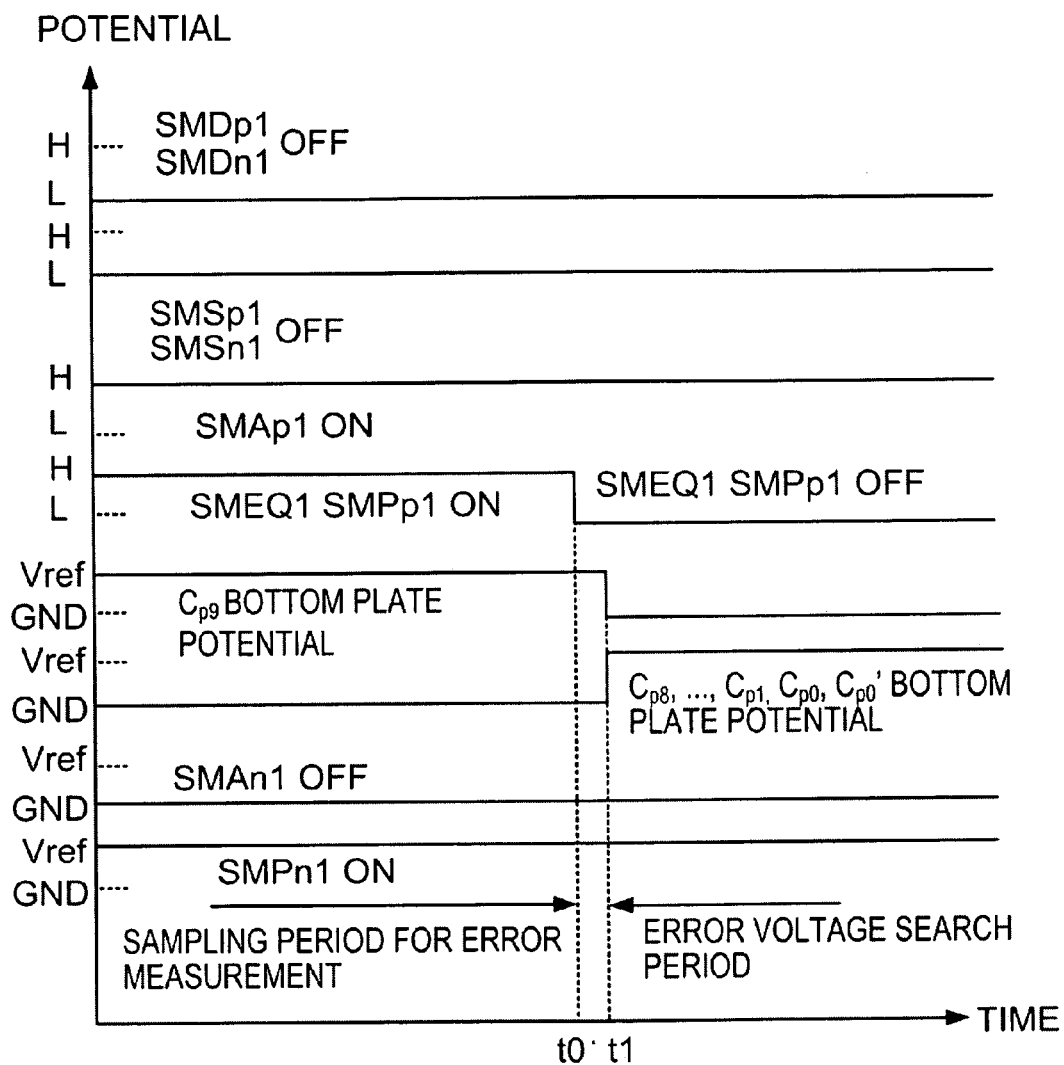
FIG. 16 illustrates an exemplary switch control in error measurement for a positive-side capacitive main DAC.

FIG. 16 is an exemplary switch control during error measurement for $C_{p9}$ in the positive-side capacitive main DAC of FIG. 14. The horizontal axis of FIG. 16 indicates time and the vertical axis indicates the voltages of the control signals of the switches. The switch names in FIG. 16 correspond to the switches in FIG. 14.

In the operations to measure the capacitance errors, the capacitor to be error-measured is charged using $V_{ref}$ with the potential of the top plate NTOP1 set to the comparator threshold value $V_T$. The capacitors of a higher order than the capacitor to be error-measured and the capacitors complementary to the capacitor to be error-measured are charged using GND. The top plate enters a floating state, and the bottom plate of the capacitor to be error-measured is set to GND. Meanwhile, the bottom plates of the capacitors complementary to the capacitor to be error-measured are set to $V_{ref}$. The potential of the bottom plate of the capacitors of a higher order than the capacitor to be error-measured remains unchanged at GND. The change in the potential of the top plate is converted to a digital value by performing a binary search for the input digital code of the correcting DAC. The sampling period during the error measurement is the period over which the capacitor to be error-measured is charged using $V_{ref}$.

In contrast to a normal A/D conversion, SMDp1, SMDn1, SMSp1, SMSn1, and SMAn1 are switched off in all periods. SMPn1 and SMAp1 are switched on in all periods. During the period (up to timing t0) over which the capacitor to be error-measured is charged with $V_{REF}$ and is sampled, SMEQ1 and SMPp1 are switched on.

Since the error in $C_{p9}$ of the positive-side capacitive main DAC is measured, the change in the top-plate potential of the positive-side capacitive main DAC may be converted to a digital value using the correcting DAC output. The other input to the comparator is set to the potential of $V_{CM}$. SMPn1 is switched on for all periods. Since the top-plate potential of the negative-side capacitive main DAC may not be used when measuring error in the positive-side capacitive main DAC, SMAn1 is switched off for all periods.

The top-plate potential of the positive-side capacitive main DAC in the sampling period during the error measurement is set to the potential of $V_{CM}$. SMPp1 and SMEQ1 are switched on for the sampling period. Since, during the sampling period of the error measurement, the capacitor to be error-measured is charged using $V_{ref}$, the bottom plate of $C_{p9}$ is set to $V_{ref}$. The bottom plates of the remaining capacitors are held to GND.

At the timing t0, SMPp1 and SMEQ1 are switched off. At the timing t1, the bottom plate of the capacitor to be error-measured is set to GND and the bottom plates of the capacitors complementary to the capacitor to be error-measured are set to $V_{ref}$. The potential of the bottom plate of the capacitors of a higher order than the capacitor to be error-measured remains unchanged at GND. When the capacitor of the positive-side capacitive main DAC included errors, the top-plate potential of the positive-side capacitive main DAC changes, and the potential difference is converted to a digital value using the correcting DAC of the positive-side capacitive main DAC. (In FIG. 16, the period of these operations is denoted as the "error voltage search period".) Different from a normal A/D conversion, the top-plate potential of the positive-side capacitive main DAC and the positive-side capacitive main DAC input of the comparator may be the same or close. For this reason SMAp1 is switched on for all periods. The switch control illustrated in FIG. 16 allows the capacitance errors of the positive-side capacitive main DAC to be measured independently of the negative-side capacitive main DAC. Further, both normal A/D conversion and measurement of the capacitance errors of the positive-side capacitive main DAC may be performed.

Figure 17:
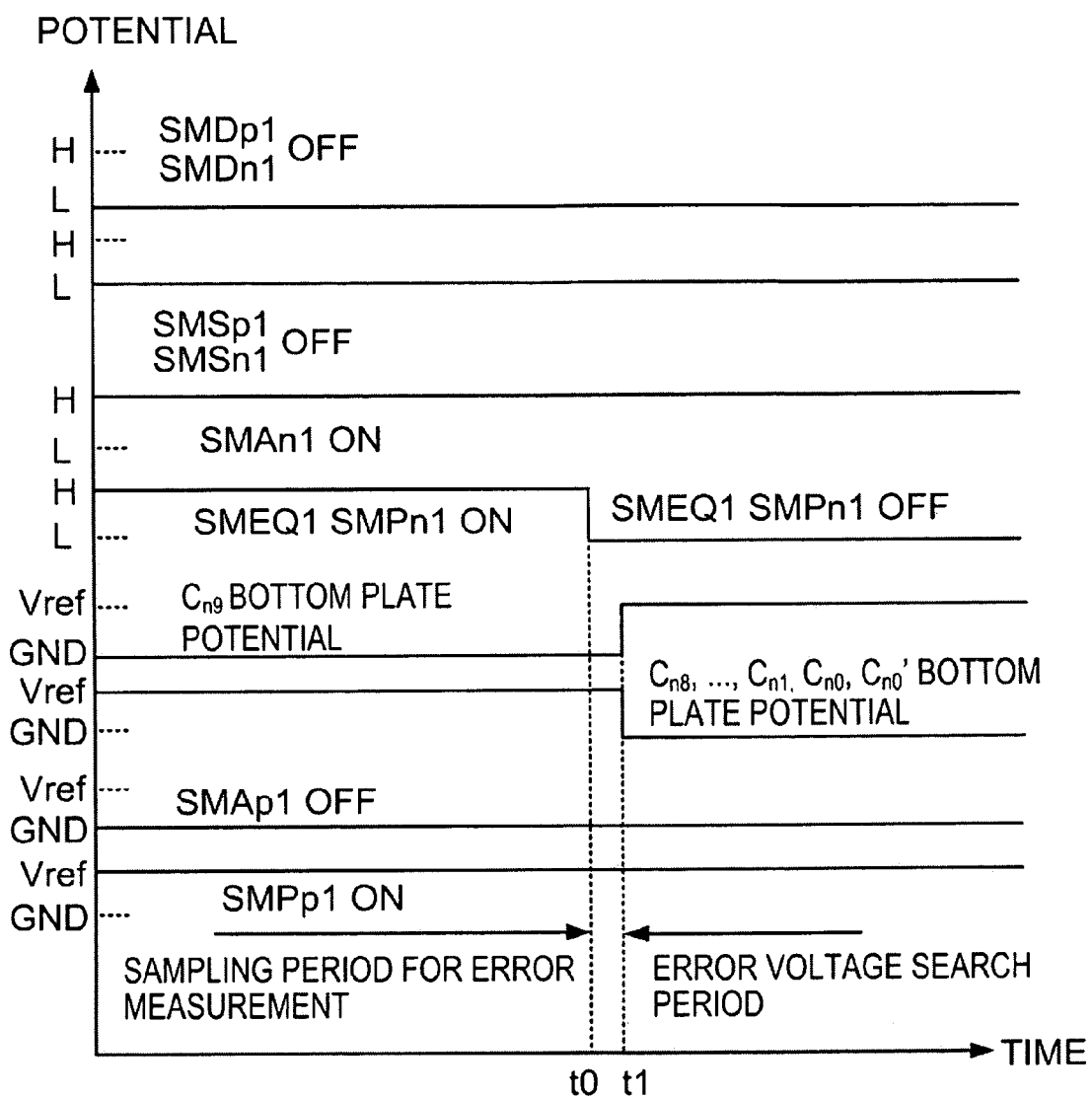
FIG. 17 illustrates an exemplary switch control in error measurement for a negative-side capacitive main DAC.

FIG. 17 illustrates an exemplary switch control during error measurement for Cn9 in the negative-side capacitive main DAC of FIG. 14. The horizontal axis of FIG. 17 indicates time and the vertical axis indicates the voltages of the control signals of the switches. The switch names in FIG. 17 correspond to the switches in FIG. 14.

In FIG. 17, the capacitor to be error-measured is charged using GND. The capacitors of a higher order than the capacitor to be error-measured and the capacitors complementary to the capacitor to be error-measured are charged using $V_{ref}$. The top plate enters a floating state, the bottom plate of the capacitor to be error-measured is coupled to $V_{ref}$ and the capacitors complementary to the capacitor to be error-measured are coupled to GND. The potential of the bottom plates of the capacitors of a higher order than the capacitor to be error-measured remains unchanged at $V_{ref}$. The change in the potential of the top plate is converted to a digital value by performing a binary search for the input digital code of the correcting DAC. The capacitor to be error-measured is charged by the GND potential because the operations of the negative-side capacitive main DAC are the reverse of the operations of the positive-side capacitive main DAC. In the method in which the capacitor to be error-measured is charged to $V_{ref}$, the result which has an opposite sign may be obtained. Hence, the potential of the bottom plate of the capacitor to be error-measured may be controlled as illustrated in FIG. 16.

Since the diagram of FIG. 17 resembles the diagram of FIG. 16 except in that "p" and "n" have been reversed, descriptions may be omitted. The switch control illustrated in FIG. 17 allows the capacitance errors of the negative-side capacitive main DAC to be measured independently of the positive-side capacitive main DAC.

The method for correcting the capacitance errors illustrated in FIG. 9 is applied independently to the positive-side capacitive main DAC and the negative-side capacitive main DAC, respectively.

Figure 18:
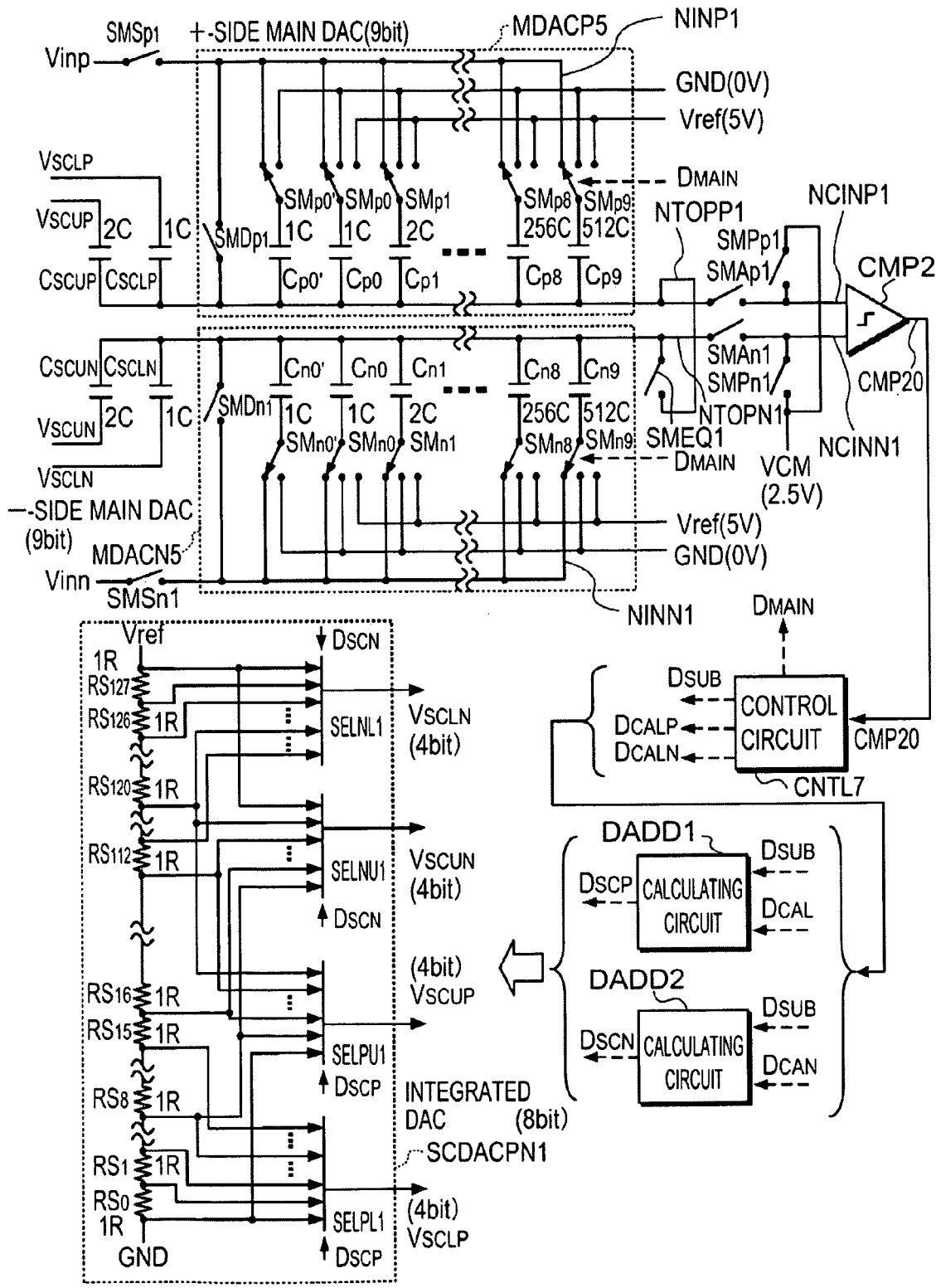
FIG. 18 illustrates the fifth embodiment.

FIG. 18 illustrates an exemplary a differential successive approximation A/D converter circuit. The circuit of FIG. 18 makes use of both the circuit of FIG. 14 and the technique of FIG. 9. In the circuit of FIG. 18, different to the circuit of FIG. 14, the correcting DAC and the sub-DAC for correcting the capacitance errors in each of the positive-side main DAC and negative-side main DAC are replaced by a single integrated DAC. With the replacement, calculating circuits DADD1 and DADD2, which perform digital addition in advance on a lower order term ($D_{SUB}$) and correction terms ($D_{CALP}$ and $D_{CALN}$), are added. The circuit of FIG. 18 includes $C_{SCUP}$, $C_{SCLP}$, $C_{SCUN}$ and $C_{SCLN}$ which are provided separately to the sampling capacitors. The integrated DAC outputs $V_{SCUP}$, $V_{SCLP}$, $V_{SCUN}$, and $V_{SCLN}$ are applied to $C_{SCUP}$, $C_{SCLP}$, $C_{SCUN}$ and $C_{SCLN}$.

The circuit of FIG. 18 is a 14-bit A/D conversion circuit. The resolution of the main DAC is 9 bits and the resolution of the integrated DAC is 8 bits.

$RS_0$ to $RS_{127}$ of FIG. 18 are resistors. $V_{ref}$ denotes a reference voltage (e.g., 5 V) for the A/D conversion and the voltage value of the reference voltage. GND indicates a potential of 0V. $V_{inp}$ is a positive-side analog input signal. $V_{inn}$ is a negative-side analog input signal. Devices beginning with "SM" are switches of the capacitive main DAC. MDACP5 denotes a positive-side capacitive main DAC. MDACN5 denotes a negative-side capacitive main DAC. Devices beginning with "C" are capacitors. CMP2 is a comparator. CMP2O is an output of the comparator CMP2. VCM denotes a potential that is approximately half the power source voltage. SCDACPN1 is a resistive integrated DAC. CNTL7 is a control circuit. $V_{SCUP}$ denotes an upper-order output voltage of the positive-side resistive integrated DAC. $V_{SCLP}$ denotes a lower-order output voltage of the positive-side resistive integrated DAC. $V_{SCUN}$ denotes an upper-order output voltage of the negative-side resistive integrated DAC. $V_{SCLN}$ denotes a lower-order output voltage of the negative-side resistive integrated DAC. $D_{SUB}$ is a digital signal. $D_{MAIN}$ is a digital input of the capacitive main DAC. $D_{CALP}$ and $D_{CALN}$ are correction digital codes of the positive-side capacitive main DAC and the negative-side capacitive main DAC, respectively. $D_{SCP}$ and $D_{SCN}$ are digitally added (search+correction) digital codes of the positive-side capacitive main DAC and the negative-side capacitive main DAC, respectively. DADD1 and DADD2 are adding circuits. SELNL1, SELNU1, SELPU1 and SELPL1 are selectors. NTOPP1 is a top plate of the positive-side capacitive main DAC. NTOPN1 is a top plate of the negative-side capacitive main DAC. NINP1 is an internal input node which receives input of $V_{inp}$. NINN1 is an internal input node which receives input of $V_{inp}$. NCINP1 and NCINN1 are comparator inputs. $C_{SCUP}$, $C_{SCLP}$, $C_{SCUN}$ and $C_{SCLN}$ are coupling capacitors for adding $V_{SCUP}$, $V_{SCLP}$, $V_{SCUN}$ and $V_{SCLN}$ to the top-plate potentials.

The "1R" next to each of resistor $RS_0$ to $RS_{127}$ denotes a respective resistance value. The "1C" and other values accompanying the capacitors ($C_{p0}'$, $C_{p0}$, $C_{p1}$ etc.) in FIG. 18 indicate the capacitance values.

In FIG. 18, devices which function in the same way as or the similar way to the devices illustrated in FIG. 14, FIG. 2, FIG. 4 and FIG. 9 are assigned the same symbols. The nodes of FIG. 18, which correspond to the nodes of FIG. 14, FIG. 2, FIG. 4 and FIG. 9, are assigned the same symbols. Further descriptions of previously described portions are omitted.

The circuit of FIG. 18 is a successive approximation A/D conversion circuit which performs A/D conversion on a potential difference of $V_{inp}$–$V_{inn}$ in substantially the same way as or similar way to the circuit of FIG. 14.

An integrated DAC (SCDACPN1 of FIG. 18) is provided for each of the positive-side main DAC and the negative-side main DAC. The positive-side main DAC and the negative-side main DAC are each provided with a correction digital code (correction code) (denoted by $D_{CALP}$ and $D_{CALN}$ in FIG. 18) for correcting errors. Single (search+correction) digital codes ($D_{SCP}$ and $D_{SCN}$ in FIG. 18) are calculated (addition of DADD1 and DADD2 in FIG. 18) from the search digital code input to the sub-DAC (lower-order code denoted by $D_{SUB}$ in FIG. 18) and the correction digital codes ($D_{CALP}$ and $D_{CALN}$ in FIG. 18) input to the correcting DAC. The output from the integrated DAC (SCDACPN1 of FIG. 18) is divided into upper-order and lower-order outputs, and an upper-order integrated DAC and a lower-order integrated DAC are provided. The digital input to the upper-order integrated DAC includes the upper-order bits of the single (search+correction) digital codes ($D_{SCP}$ and $D_{SCN}$ of FIG. 18). The digital input to the lower-order integrated DAC includes the lower-order bits of the single (search+correction) digital codes ($D_{SCP}$ and $D_{SCN}$ of FIG. 18). The outputs ($V_{SCUP}$, $V_{SCLP}$, $V_{SCUN}$, and $V_{SCLN}$ of FIG. 18) of the upper-order integrated DAC and the lower-order integrated DAC are added, as analog signals, to the main DAC output. Coupling capacitors ($C_{SCUP}$, $C_{SCLP}$, $C_{SCUN}$, and $C_{SCLN}$ in FIG. 18), which are separate from the sampling capacitors, are provided for analog addition of the outputs from the upper-order integrated DAC, the lower-order integrated DAC, and the main DAC. The coupling capacitors ($C_{SCUP}$ and $C_{SCUN}$ in FIG. 18) for analog-adding the output from the upper-order integrated DACs have capacitances which are, for example, twice the capacitance of the smallest capacitor in the main DAC. The coupling capacitors ($C_{SCLP}$ and $C_{SCLN}$ in FIG. 18) for analog-adding the output from the lower-order integrated DACs have capacitances which are, for example, substantially equal to the capacitance of the smallest capacitor in the main DAC. The capacitance errors in the positive-side main DAC and the negative-side main DAC are corrected independently of each other. The number of switches in the circuit is reduced and the conversion time is shortened.

The errors of the positive-side capacitive main DAC and the negative-side capacitive main DAC may be corrected when, by using the positive-side capacitive main DAC and the negative-side capacitive main DAC as independent single-ended successive approximation circuits, the capacitance errors are measured and then correction codes are found.

The circuit of FIG. 18 includes the configuration of FIG. 9. Hence, the circuit of FIG. 18 includes the advantages of the circuit of FIG. 9.

Figure 19:
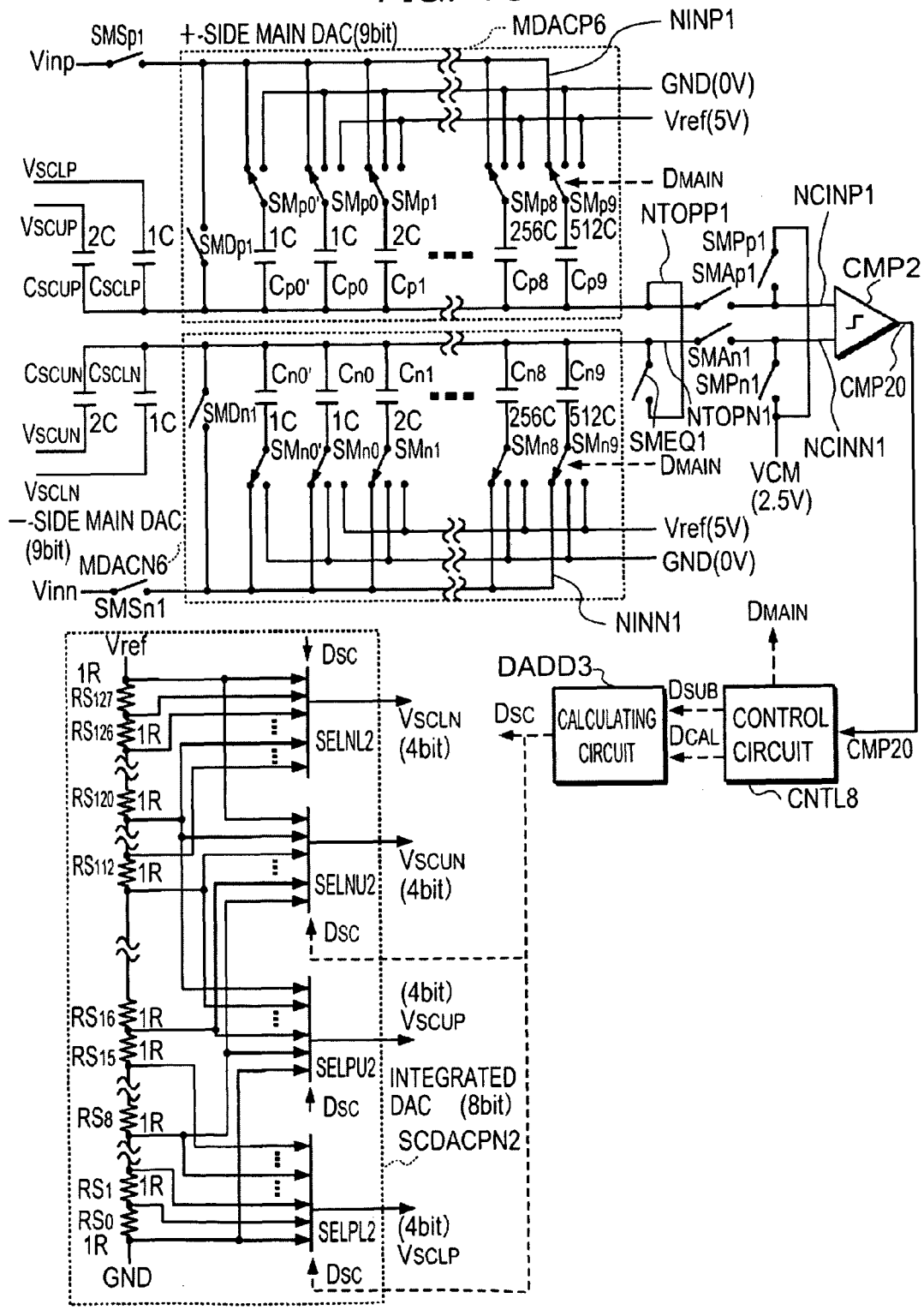
FIG. 19 illustrates a sixth embodiment.

FIG. 19 illustrates a sixth embodiment. The circuit of FIG. 19 is a 14-bit differential successive approximation A/D conversion circuit including a main DAC with a resolution of 9 bits and an integrated DAC with a resolution of 8 bits. The circuit of FIG. 19 includes $C_{SCUP}$, $C_{SCLP}$, $C_{SCUN}$ and $C_{SCLN}$ which are provided separately to the sampling capacitors. Integrated DAC outputs $V_{SCUP}$, $V_{SCLP}$, $V_{SCUN}$ and $V_{SCLN}$ are applied to $C_{SCUP}$, $C_{SCLP}$, $C_{SCUN}$ and $C_{SCLN}$. In the circuit of FIG. 18, the positive-side capacitive main DAC and the negative-side capacitive main DAC, as independent single-ended successive approximation circuits, measure the capacitance errors, find the correction codes, and correct the errors. In the circuit of FIG. 19, the errors in the capacitors of the positive-side capacitive main DAC and the negative-side capacitive main DAC are measured collectively, and error correction is performed collectively by using a correction term for the positive-side capacitive main DAC and the negative-side capacitive main DAC.

$RS_0$ to $RS_{127}$ of FIG. 19 are resistors. $V_{ref}$ denotes a reference voltage (e.g., 5V) for the A/D conversion and the voltage value of the reference voltage. GND indicates a potential of 0V. $V_{inp}$ is a positive-side analog input signal. $V_{inn}$ is a negative-side analog input signal. Devices beginning with "SM" are switches of the capacitive main DAC. MDACP6 denotes a positive-side capacitive main DAC. MDACN6 denotes a negative-side capacitive main DAC. Devices beginning with "C" are capacitors. CMP2 is a comparator. CMP2O is an output of the comparator CMP2. $V_{CM}$ denotes a potential that is approximately half the power source voltage. SCDACPN2 is a resistive integrated DAC. CNTL8 is a control circuit. $V_{SCUP}$ denotes an upper-order output voltage of the positive-side resistive integrated DAC. $V_{SCLP}$ denotes a lower-order output voltage of the positive-side resistive integrated DAC. $V_{SCUN}$ denotes an upper-order output voltage of the negative-side resistive integrated DAC. $V_{SCLN}$ denotes a lower-order output voltage of the negative-side resistive integrated DAC. $D_{SUB}$ is a digital signal. $D_{MAIN}$ is a digital input of the capacitive main DAC. $D_{CAL}$ is a correction digital code. $D_{SC}$ is a digital code resulting from a digital addition (search+correction). DADD3 is an adding circuit. SELNL2, SELNU2, SELPU2, and SELPL2 are selectors. NTOPP1 is a top plate of the positive-side capacitive main DAC. NTOPN1 is a top plate of the negative-side capacitive main DAC. NINP1 is an internal input node which receives input of $V_{inp}$. NINN1 is an internal input node which receives input of $V_{inn}$. NCINP1 and NCINN1 are comparator inputs. $C_{SCUP}$, $C_{SCLP}$, $C_{SCUN}$, and $C_{SCLN}$ are coupling capacitors for adding $V_{SCUP}$, $V_{SCLP}$, $V_{SCUN}$, and $V_{SCLN}$ to the top-plate potentials.

In FIG. 19, devices which function in the same way as or similar way to the devices illustrated in FIG. 18, FIG. 2, FIG. 4, and FIG. 9 are assigned the same symbols. The nodes of FIG. 19 which, correspond to the nodes of FIG. 18, FIG. 2, FIG. 4 and FIG. 9, are assigned the same symbols. Further description of previously described portions is omitted.

The circuit of FIG. 19 is a successive approximation A/D conversion circuit which performs A/D conversion on a potential difference of $V_{inp}-V_{inn}$ in substantially the same way as or similar way to the circuit of FIG. 18.

An integrated DAC (CDACPN2 of FIG. 19) is provided for the positive-side main DAC and the negative-side main DAC. A single correction digital code (correction code) (denoted $D_{CAL}$ in FIG. 19) is provided to correct the errors in the positive-side main DAC and the negative-side main DAC. A calculating circuit (DADD3 in FIG. 19) calculates (adds) a single (search+correction) digital code ($D_{SC}$ in FIG. 17) to be input to the integrated DAC, based on the search digital code $D_{SUB}$ and the correction digital code $D_{CAL}$. The output from the integrated DAC (SCDACPN2 of FIG. 19) is divided into upper-order and lower order outputs, and an upper-order integrated DAC and a lower-order integrated DAC are provided. The digital input to the upper-order integrated DAC includes the upper-order bits of the single (search+correction) digital code ($D_{SC}$ of FIG. 19). The digital input to the lower-order integrated DAC includes the lower-order bits of the single (search+correction) digital code ($D_{SC}$ in FIG. 19). The outputs ($V_{SCUP}$, $V_{SCLP}$, $V_{SCUN}$, and $V_{SCLN}$ in FIG. 19) of the upper-order integrated DAC and the lower-order integrated DAC are added, as analog signals, to the main DAC output. In order to analog-add the outputs from the upper-order integrated DAC, the lower-order integrated DAC and the main DAC, the coupling capacitors ($C_{SCUP}$, $C_{SCLP}$, $C_{SCUN}$ and $C_{SCLN}$ of FIG. 19) are provided in addition to the sampling capacitors. The coupling capacitors for analog-adding the output from upper-order integrated DAC ($C_{SCUP}$ and $C_{SCUN}$ in FIG. 19) have a capacitance which is, for example, twice the value of the smallest capacitor in the main DAC. The coupling capacitors for analog-adding the output from the lower-order integrated DAC ($C_{SCLP}$ and $C_{SCLN}$ in FIG. 19) may, for example, have capacitances which are substantially equal to the capacitance of the smallest capacitor in the main DAC. When the errors in the total capacitance or in the coupling capacitor for each of the positive-side main DAC and the negative-side main DAC are small, the capacitance errors of the positive-side main DAC and the negative-side main DAC are corrected collectively. A more accurate differential successive approximation A/D conversion circuit is realized. In addition, the number of switches in the sub-DAC and the correcting DAC is reduced, and the conversion time is shortened.

The positive-side integrated DAC receives an 8-bit digital binary code DSC (an integer from 0 to 255 when expressed in the decimal number system), and outputs the analog output voltages $V_{SCUP}$ and $V_{SCLP}$. The positive-side integrated DAC is a 7-bit resistor string DAC. The resistor string includes 128 resistors $RS_0$ to $RS_{127}$ which are coupled in series.

The integrated DAC (SCDACPN2) analog-adds the upper-order 4-bit DAC output $V_{SCUP}$ and the lower-order 4-bit output $V_{SCLP}$ at the top plate of the main capacitive DAC using the coupling capacitors $C_{SCUP}$ and $C_{SCLP}$. $V_{SCUP}$ is coupled to $C_{SCUP}$, and $V_{SCLP}$ is coupled to $C_{CSCLP}$. Since the capacitance of the coupling capacitor $C_{SCUP}$ is 2C and the capacitance of the coupling capacitor $C_{SCLP}$ is 1C, the weight of the upper-order DAC output $V_{SCUP}$ is twice the weight of the lower-order DAC output $V_{SCLP}$ when analog-adding using the top plate NTOPP1.

Hence, in spite of the integrated DAC being an 8-bit integrated DAC, the arrangement is that of a 7-bit resistor string DAC. The lower-order 4-bit DAC output $V_{SCLP}$ has a potential selected from 16 adjacent voltages resulting from a $2^7$-way division of $V_{ref}$. Since the weight of the upper-order 4-bit DAC output $V_{SCUP}$ is doubled due to coupling capacitor $C_{SCUP}$, the upper-order 4-bit DAC output $V_{SCUP}$ has a potential selected from among 16 voltages resulting from a $2^4$-way division of $V_{ref}$.

A simple sum of the number of bits in the 9-bit main DAC and the 8-bit integrated DAC is "17". However, due to the overlap of the highest-order bit of the 8-bit integrated DAC with the lowest-order bit of the 9-bit main DAC, the operational total number of bits is "16". The 16 bits include 14 bits for the A/D conversion result and a further 2 bits for error correction. The resolution of the integrated DAC is 1/128 with respect to the 1C of the capacitive DAC, and 1/4LSB when the resolution is converted to the LSB of the 14-bit code. The correction range of the integrated DAC is 1C with respect to 1C of the main DAC.

When the upper-order 4 bits of $D_{SC}$ are denoted $D_{SCU}$ and the lower-order 4 bits are denoted $D_{SCL}$, the relationship between the upper-order 4-bit DAC output voltage $V_{SCUP}$ and the input digital signal $D_{SCU}$ is expressed in Formula 86. The available range of $D_{SCU}$ is the integers from 0 to 15. The relationship between the lower-order 4-bit DAC output $V_{SCLP}$ and the input digital signal $D_{SCL}$ is expressed in Formula 87. The available range of $D_{SCU}$ is the integers from 0 to 15.

The negative-side integrated DAC receives input of the 8-bit binary code $D_{SC}$, and outputs the analog output voltages $V_{SCUN}$ and $V_{SCLN}$. The negative-side integrated DAC includes a 7-bit resistor string DAC which shares resistors with the positive-side integrated DAC.

The integrated DAC (SCDACPN2) analog-adds the upper-order 4-bit DAC output $V_{SCUN}$ and the lower-order 4-bit DAC output $V_{SCLN}$ to the coupling capacitors $C_{SCUN}$ and $C_{SCLN}$ by using the top-plate of the main capacitive DAC via. $V_{SCUN}$ is coupled to $C_{SCUN}$, and $V_{SCLN}$ is coupled to $C_{SCLN}$. The coupling capacitor $C_{SCUN}$ has a capacitance of 2C and the coupling capacitor $C_{SCLN}$ has capacitance of 1C. Hence, when the analog addition is performed using the top plate NTOPN1, the weight of the upper-order DAC output $V_{SCUN}$ is double the weight of the lower-order DAC output $V_{SCLN}$.

The 8-bit integrated DAC includes a 7-bit resistor string DAC. The lower-order 4-bit DAC output $V_{SCLN}$ is a potential selected from among 16 adjacent voltages resulting from a $2^7$-way division of $V_{ref}$. The upper-order 4-bit DAC output $V_{SCUN}$ has a weight which, due the coupling capacitor $C_{SCUN}$, is double the weight of $V_{SCLN}$, and is therefore selected from among 16 voltages resulting from a $2^4$-way division of $V_{ref}$.

When the upper-order 4 bits of $D_{SC}$ are denoted $D_{SCU}$ and the lower-order 4-bits are denoted $D_{SCL}$, the relationship between the upper-order 4-bit DAC output voltage $V_{SCUN}$ and the input digital signal $D_{SCU}$ is given by Formula 88. The available range of $D_{SCU}$ includes the integers from 0 to 15. Formula 88 shows that, in contrast to the positive-side integrated DAC, the potential of $V_{SCUN}$ drops as $D_{SCU}$ increases.

The relationship between the lower-order 4-bit DAC output $V_{SCLN}$ and the input digital signal $D_{SCL}$ is given in Formula 89. The available range of DSCU includes the integers from 0 to 15. Formula 89 shows that, in contrast to the positive-side integrated DAC, $V_{SCLN}$ drops as $D_{SCL}$ increases.

To simplify the description, it is assumed that the potential of the positive-side analog input $V_{inp}$ is higher than the potential of the negative-side analog input $V_{inn}$.

During sampling, switches $SM_{p9}$ to $SM_{p0}'$ are coupled to the $V_{inp}$ side (NINP1 side). The potential of the lower terminals (bottom plates) of the capacitors is then $V_{inp}$. The potential of NTOPP1 (top plate) is $V_{TOPI}$. The electric charge $Q_{sampp}$ stored on the entire capacitor array (referred to as the capacitor array, the main DAC sampling capacitors, and the main DAC capacitors) is given by Formula 90. The error in each capacitor is defined with respect to the entire sampling capacitance which is 1024C. An initial value $D_{SC,init}$=01000000 (binary system)=64 (decimal system) may, for instance, be input to the integrated DAC. The initial values at the positive-side DAC are $V_{SCUP}=V_{SCUP,init}$ and $V_{SCLP}=V_{SCLP,init}$.

In the successive approximation operation, upon the completion of sampling, the nodes of the top plate NTOP1 enter a floating state, $SM_{p0}'$ is coupled to GND, and $SM_{p9}$ is coupled to the $V_{ref}$ side. $SM_{p8}$ to $SM_{p0}$ are coupled to terminals other than $V_{inp}$. Since the stored charge is prevented from escaping, Formula 91 may be established. $V_{outp}$ indicates the potential of the top plate. It is assumed that $D_{MAIN}=2^8 DM_8 + 2^7 DM_7 + \ldots + 2^1 DM_1 + 2^0 DM_0$. When any of $DM_8$ to $DM_0$ are "1", the corresponding switches among $SM_{p8}$ to $SM_{p0}$ are coupled to Vref.

Since the charge in Formula 90 is equal to the charge in Formula 91, Formula 92 may be obtained from the two formulas.

By rearranging Formula 92, Formula 90, which gives the relationship between the potential $V_{outp}$ of the top plate during successive approximation and the digital input to the main DAC, may be obtained.

Formula 93 includes the positive-side integrated DAC voltages $V_{SCUP}$ and $V_{SCLP}$. When Formula 93 is expressed in terms of the integrated DAC digital input $D_{SC}$, Formula 94 may be obtained. $C_{SCUP}$ is expressed in terms of $C_{SCLP}$ with the ratio between $C_{SCUP}$ and $C_{SCLP}$ being 2:1. $D_{SC,init}$ shows the initial value of $D_{SC}$.

When the errors in the capacitors are taken into account, Formula 95 may be obtained. The fourth term in Formula 95 shows a voltage which may be controlled by $D_{SC}$.

The fifth term shows the influence of the error in each capacitor on $V_{outp}$. When it is assumed that $C_{SCUP}=2C$ and that $C_{SCLP}=C$, Formula 96 may be obtained.

During the sampling, the switches $SM_{n9}$ to $SM_{n0}'$ are coupled to the $V_{inn}$ side (NINN1 side). The potential of the lower terminals (bottom plates) of the capacitors is brought to $V_{inn}$. The potential of NTOPP1 (top plate) is $V_{TOPI}$. The charge $Q_{sampn}$ stored in the entire negative-side capacitor array is given by Formula 97. The error in each capacitor is defined with respect to the entire sampling capacitance which is 1024C. An initial value $D_{SC,init}$=01000000 (binary)=64 (decimal) may, for instance, be input to the integrated DAC. The negative-side integrated DAC initial values are expressed with $V_{SCUN}=V_{SCUN,init}$ and $V_{SCLN}=V_{SCLN,init}$.

Upon the completion of the sampling in the successive approximation operation, the nodes of the top plate NTOPN1 enter a floating state, $SM_{n0}'$ is coupled to the $V_{ref}$ side, and $SM_{n9}$ is coupled to the GND side. $SM_{n8}$ to $SM_{n0}$ are coupled to terminals other than $V_{inn}$. Since the stored charge is prevented from escaping, Formula 98 may be established. $V_{outn}$ indicates the potential of the top plate. The negative-side capacitive main DAC differs from the positive capacitive main DAC in that, when any one or more of $DM_8$ to $DM_0$ is "1", the corresponding switch or switches among $SM_{n8}$ to $SM_{n0}$ are coupled to GND.

Since the charge in Formula 97 is equal to the charge in Formula 98, Formula 99 may be obtained from the two formulas.

By rearranging Formula 99, Formula 100, which gives the potential $V_{outn}$ of the top plate during successive approximation and the digital input to the main DAC, may be obtained.

Formula 100 includes the voltages $V_{SCUN}$ and $V_{SCLN}$ of the negative-side integrated DAC. When Formula 100 is expressed in terms of the integrated DAC digital input $D_{SC}$, Formula 101 may be obtained. It is assumed that the ratio between $C_{SCUN}$ and $C_{SCLN}$ is 2:1. $C_{SCUN}$ is expressed in terms of $C_{SCLN}$ and $D_{SC,init}$ denotes an initial value of $D_{SC}$.

When the errors in each capacitor are taken into account, Formula 102 may be obtained.

Rearranging Formula 102 gives Formula 103.

When it is assumed that $C_{SCUP}=2C$ and that $C_{SCLP}=C$, Formula 104 may be obtained.

The relationship between the top plate potential difference ($V_{outp}-V_{outn}$) and the input signal is given by subtracting Formula 104 from Formula 96.

In the successive approximation operations of the A/D conversion, the values of the digital output are determined starting with the upper-order bits. When the main capacitive DAC compares the DAC output and the input potential difference, $D_{SC}$ is input according to each of the bits of $D_{MAIN}$ and an integrated DAC output which cancels out the capacitance errors is output.

When the positive-side capacitive main DAC and the negative-side capacitive main DAC have approximately the same total capacitance and $C_{SCUP}$, $C_{SCLP}$, $C_{SCUN}$, and $C_{SCLN}$ approximate ideal capacitors, the ideal DAC output may approximate being independent of $C_{SCUP}$, $C_{SCLP}$, $C_{SCUN}$ and $C_{SCLN}$. Thus, the errors of the positive-side capacitive main DAC and the negative-side capacitive main DAC may be measured collectively, and may be corrected using a single correction term.

Figure 20:
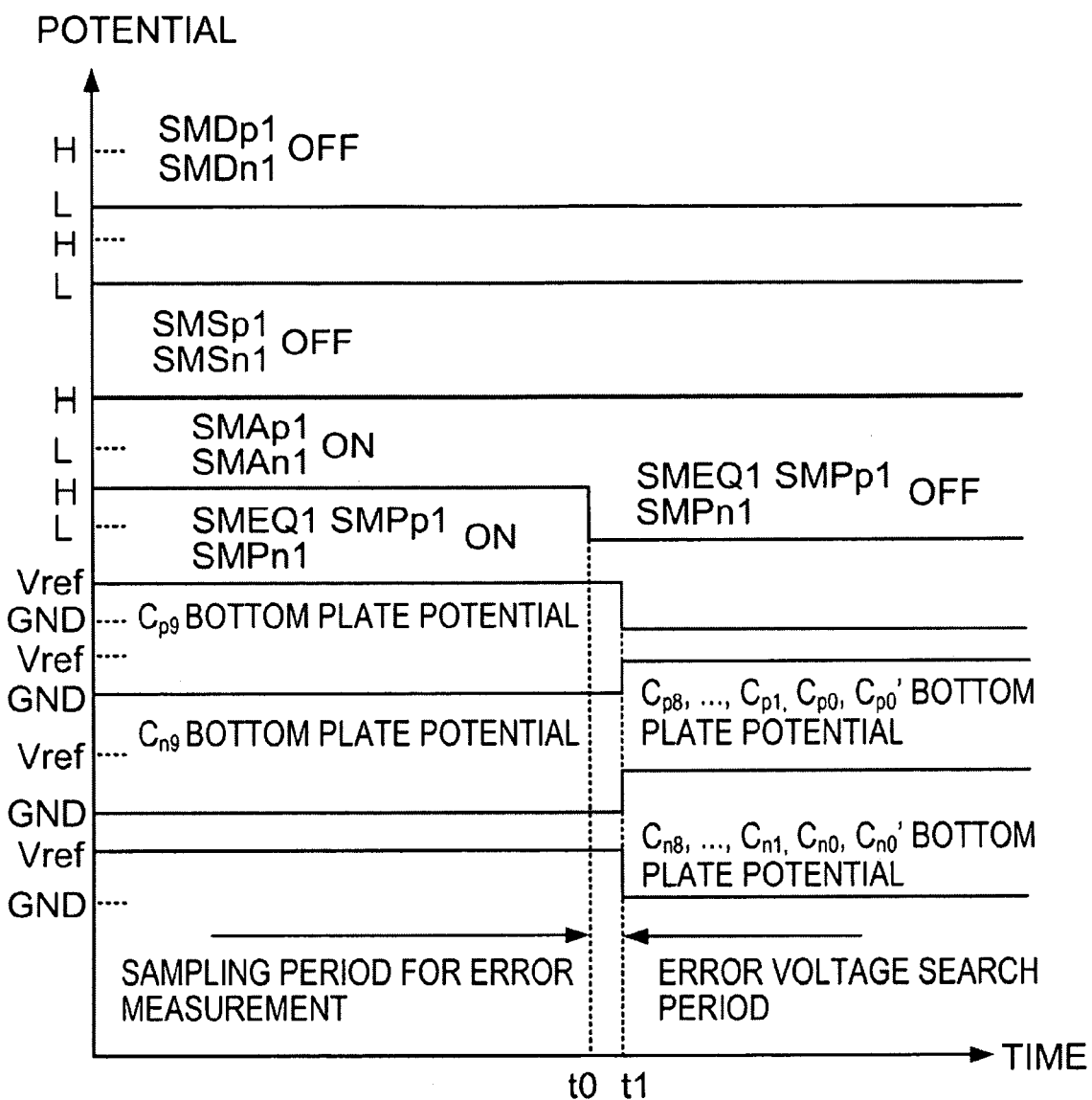
FIG. 20 illustrates an exemplary switch control in error correction according to the sixth embodiment.

FIG. 20 illustrates an exemplary switch control during error correction. FIG. 20 is an exemplary switch control during error measurement for $C_{p9}$ and $C_{n9}$ in the capacitive main DAC of FIG. 19. The horizontal axis of FIG. 20 indicates time and the vertical axis indicates potentials of the control signals of the switches. The switch names in FIG. 20 correspond to the switches in FIG. 19.

In the operations to measure the capacitance errors, the capacitor to be error-measured is charged using $V_{ref}$ with the potential of the top plate NTOP1 set to the comparator threshold value $V_T$. The capacitors of higher order than the capacitor to be error-measured and the capacitors complementary to the capacitor to be error-measured are charged using GND. The top plate enters a floating state, the bottom plate of the capacitor to be error-measured is set to GND, and the bottom plates of capacitors complementary to the capacitor to be error-measured are set to $V_{ref}$. The potential of the bottom plate of the capacitors of a higher order than the capacitor to be error-measured remains unchanged at GND. The change in the potential of the top plate is converted to a digital value by performing binary search for the input digital code of the correcting DAC. The sampling period during the error measurement is a period over which the capacitor to be error-measured is charged using $V_{ref}$.

In contrast to a normal A/D conversion, SMDp1, SMDn1, SMSp1, and SMSn1 are off for all periods. For the period over which the capacitor to be error-measured is charged and for the sampling period during the error measurement (up to timing t0), SMEQ1, SMPp1 and SMPn1 are switched on.

To measure the errors in $C_{p9}$ and $C_{n9}$ of the capacitive main DAC, the correcting DAC output is used, and the change in the capacitive main DAC top-plate potential is converted to a digital value. During the sampling period of the error measurement, the capacitor $C_{p9}$ to be error-measured is charged using $V_{ref}$. The bottom plate of $C_{n9}$ is coupled to GND. The bottom plates of the remaining capacitors in the positive-side capacitive main DAC are coupled to GND. The bottom plates of the remaining capacitors in the negative-side capacitive main DAC are coupled to $V_{ref}$.

At timing t0, SMPp1, SMPn1 and SMEQ1 are switched off. At timing t1, the potentials of the bottom plate of the capacitor to be error-measured and the bottom plates of the capacitors complementary to the capacitor to be error-measured are switched from GND to $V_{ref}$. The potential of the bottom plate of the capacitors of a higher order than the capacitor to be error-measured remains unchanged at GND. When the capacitor of the capacitive main DAC includes an error, the top-plate potential difference of the capacitive main DAC may change, and the potential difference is converted to a digital value using the integrated DAC. In FIG. 20, the period of these operations is denoted as the "search period for finding error voltage". According to the switching operations illustrated in FIG. 20, the capacitance errors of the capacitive main DAC are measured collectively. Thus normal A/D conversion and measurement of the capacitance errors of the capacitive main DAC may both be performed.

With the circuit of FIG. 19, the errors of the positive-side capacitive main DAC and the negative-side capacitive main DAC are corrected collectively. The number of switches in the sub-DAC and the correcting DAC is reduced and the conversion time is shortened.

Figure 21:
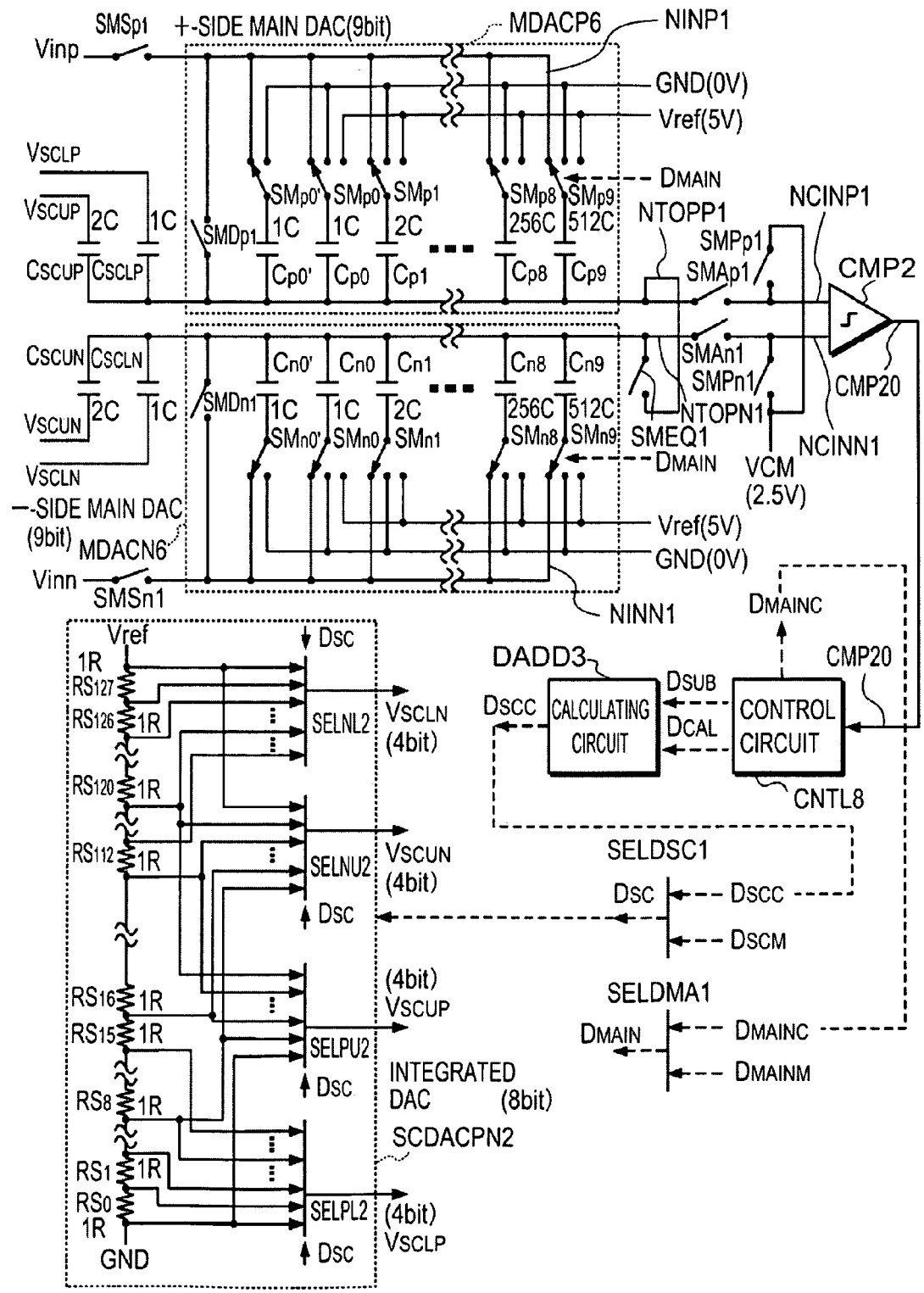
FIG. 21 illustrates a seventh embodiment.

FIG. 21 illustrates a seventh embodiment. In FIG. 21, devices, which function in the same way as or the similar way to the devices illustrated in FIG. 20, FIG. 2, FIG. 4 and FIG. 9, are assigned the same symbols. The nodes of FIG. 21, which correspond to the nodes of FIG. 20, FIG. 2, FIG. 4 and FIG. 9, are assigned the same symbols. Further descriptions of previously described portions are omitted.

The circuit of FIG. 21 is similar to the circuit of FIG. 19 but includes additional selectors SELDSC1 and SELDMA1. $D_{SCC}$ of FIG. 21 is a (search+correction) digital code used during A/D conversion, and corresponds to $D_{SC}$ of FIG. 19. $D_{SCM}$ is an integrated DAC input used when measuring the capacitance errors of the main DAC. $D_{MAINC}$ is a digital input of the capacitive main DAC used during the A/D conversion, and corresponds to $D_{MAIN}$ of FIG. 19. $D_{MAINM}$ is a capacitive main DAC digital input used when the capacitance errors of the main DAC are measured.

The selectors SELDSC1 and SELDMA1 allow both normal A/D conversion operations and operations to measure errors in the capacitive main DAC. During normal A/D conversion, $D_{SCC}$ is selected by SELDSC1 and $D_{MAINC}$ is selected by SELDMA1. During error correction for the capacitive main DAC, $D_{SCM}$ is selected by SELDSC1 and $D_{MAINM}$ is selected by SELDMA1. Since the integrated DAC is used when measuring errors in the main DAC, the control performed differs from the control used during normal A/D conversion.

In the error measurement, the capacitor to be error-measured is charged using $V_{ref}$. The capacitors of a higher order than the capacitor to be error-measured and the capacitors complementary to the capacitors to be error-measured are charged using GND. The bottom plate of the capacitor to be error-measured is set to GND. The bottom plates of the capacitors complementary to the capacitor to be error-measured are set to $V_{ref}$. The potential of the bottom plates of the capacitors of a higher order than the capacitor to be error-measured remains unchanged at GND. SELDSC1 and SELDMA1 may be added to circuits other than the circuit of FIG. 19.

Figure 22:
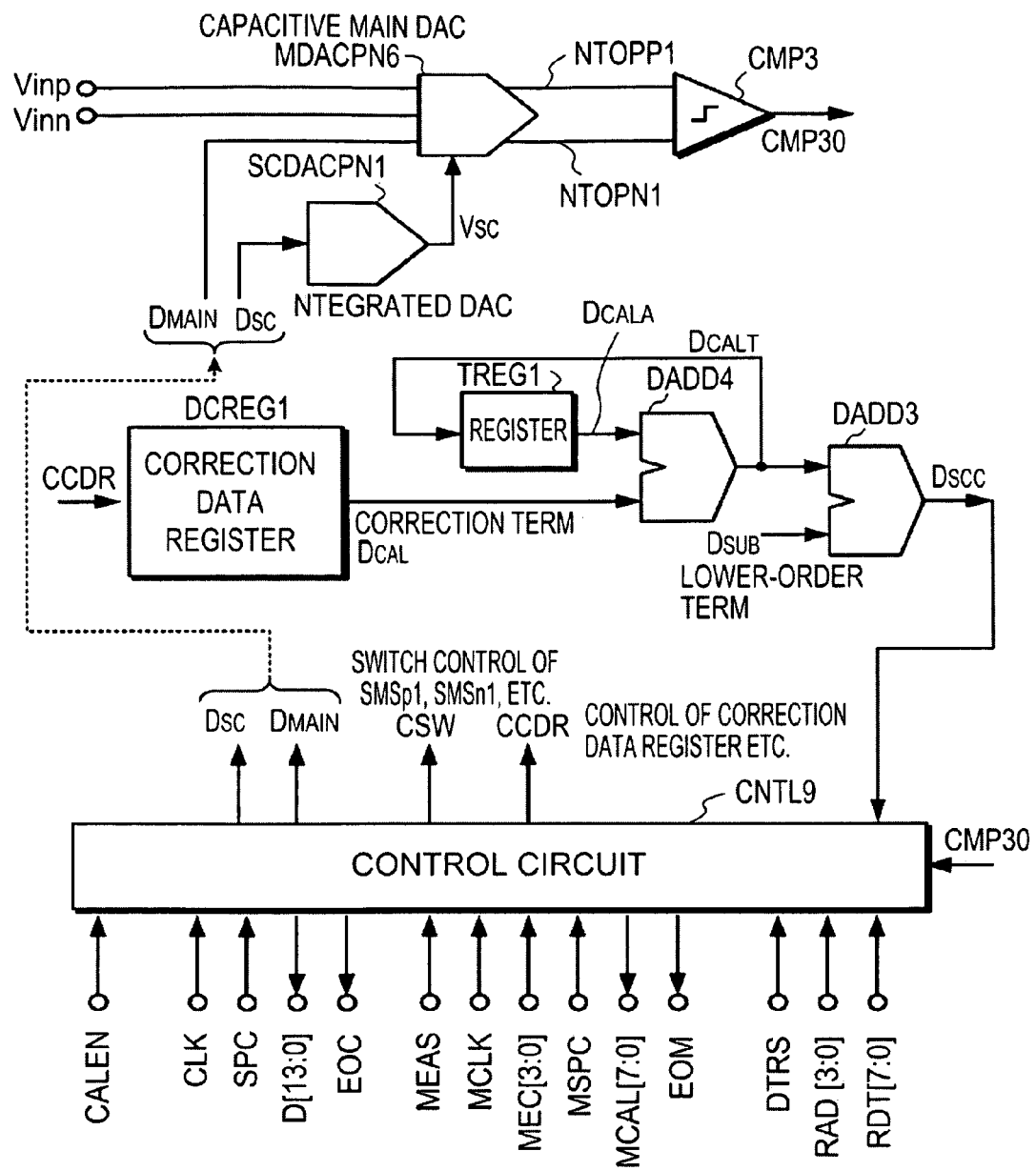
FIG. 22 illustrates an exemplary A/D converter circuit.

FIG. 22 illustrates the A/D conversion circuit illustrated in FIG. 19. $V_{imp}$ of FIG. 20 is a positive-side analog input signal. $V_{inn}$ is a negative-side analog input signal. MDACPN6 denotes a capacitive main DAC. CMP3 is a comparator. CMP30 is an output of the comparator CMP3. SCDACPN1 is a resistive sub-DAC. CNTL9 is a control circuit. $V_{SC}$ is an output voltage of the resistive integrated DAC. $D_{MAIN}$ is a digital input of the capacitive main DAC. $D_{SC}$ is a digitally added (search+correction) digital code of the capacitive main DAC. NTOPP1 is a top plate of the positive-side capacitive main DAC. NTOPN1 is a top plate of the negative-side capacitive main DAC. TREG1 is a temporary register. DCREG1 is a data register which stores correction terms. $D_{CAL}$ is correction data (a correction term) read from DCREG1. $D_{CALA}$ is a temporarily stored addition result from DADD4 which operates as an accumulator. DADD3 and DADD4 are adding circuits. $D_{SCC}$ is a digitally added (search and correction) digital code of the main DAC during normal A/D conversion. $D_{SUB}$ is a digital signal corresponding to the sub-DAC input. $D_{CALT}$ is a temporarily stored result of the addition by DADD4. CCDR is a control signal for the data register DCREG1. CSW is a switch control signal. CALEN is an enable control signal for the self-correction function. CLK is a clock signal input from an external source for the normal A/D conversion. SPC is a signal for controlling the sampling period during normal A/D conversion. D[13:0] indicates a 14-bit A/D conversion result. EOC is a flag signal which indicates the completion of normal A/D conversion. MEAS is a control signal which specifies a capacitor error measurement mode. MCLK is a clock input during capacitance error measurement. MEC[3:0] is a 4-bit signal for specifying the capacitor to be error-measured. MSPC is a signal for controlling a sampling period during capacitance error measurement. MCAL[7:0] is an 8-bit result of the capacitance error measurement. EOM is a flag signal which indicates the completion of the capacitance error measurement. DTRS is a control signal to instruct writing to the data register DCREG1. RA/D[3:0] is an address within the DCREG1 when writing to the data register DCREG1. RDT[7:0] is 8-bit correction data which is written to the data register DCREG1.

The circuit configuration of the capacitive DAC and the resistive DAC illustrated in FIG. 22 are not limited to the configurations illustrated in FIG. 19. The A/D conversion circuit illustrated in FIG. 22 may use a single-ended circuit such as the one illustrated in FIG. 8. In FIG. 22, devices which operate in the same way as or the similar way to devices illustrated in FIG. 19 are assigned the same symbols. Moreover, the nodes in FIG. 22 which correspond to nodes in FIG. 19 are assigned the same symbols. Further, descriptions of previously described portions are omitted.

The successive approximation of the A/D conversion begins with a comparison of $V_{ref}/2$ to the input voltage. In FIG. 19, for instance, the bottom plate of $C_{p9}$ is coupled to $V_{ref}$, the bottom plate of $C_{n9}$ is coupled to GND, the bottom plate of $C_{p8}$ is coupled to $V_{ref}$, and the bottom plate of $C_{n8}$ is coupled to GND. At the start of the successive approximation, the errors of $C_{p9}$, $C_{n9}$, $C_{p8}$, and $C_{n8}$ may be corrected. The errors of $C_{p9}$ and $C_{n9}$ (integrated DAC input for correcting the errors) is, for instance, measured using the method illustrated in FIG. 19, and stored in the data register DREG1. The errors of $C_{p8}$ and $C_{n8}$ are also measured using the method illustrated in FIG. 19, and stored in the data register DCREG1.

Before starting the successive approximation, the error of $C_{p9}$ and $C_{n9}$ (e.g., the integrated DAC input for correcting the error) is read from the data register DCREG1, added, for instance, to "0" (the read value does not change), and stored in the temporary register TREG1. The error of $C_{p8}$ and $C_{n8}$ is read from the data register DCREG1 and added to the error of $C_{p9}$ and $C_{n9}$ stored in the temporary register TREG1. The addition result is the correction term that is to be used in the first comparison. The addition result and the sub-DAC input $D_{SUB}$ are added by DADD3 to obtain the integrated DAC input.

In the comparison to find the second-highest order bit, the employed correction term changes depending on whether the highest-order bit is "1" or "0". When the highest-order bit is "1", the error correction data for $C_{p7}$ and $C_{n7}$ may be added to the error correction term used in the comparison to find the highest-order bit. When the highest-order bit is "1", the correction term used in the comparison to find the highest-order bit is the result $D_{CALT}$ from the adder circuit DADD4, and so $D_{CALT}$ is stored in the temporary register TREG1. By adding the TREG1 output $D_{CALA}$ and error correction data for $C_{p7}$ and $C_{n7}$ read from the data register DCREG1, the correction term used in the comparison to find the second-highest order bit is obtained.

When the highest-order bit is "0", the error correction data for $C_{p9}$ and $C_{n9}$ and the error correction data for $C_{p7}$ and $C_{n7}$ may be added. Since the correction term $D_{CALT}$ used in the comparison to find the highest-order bit may not be used, $D_{CALT}$ is not stored in the temporary register TREG1, and the temporary register TREG1 which stores the error for $C_{p9}$ and $C_{n9}$ is not updated. By adding the error correction data $D_{CALT}$ for $C_{p9}$ and $C_{n9}$ and the error correction data for $C_{p7}$ and $C_{n7}$ read from the data register DCREG1, the correction term used in the comparison to find the second-highest order bit may be obtained.

The correcting DAC input for correcting the capacitance errors may also be obtained by using the temporary register TREG1 and the adding circuit DADD4 as an accumulator. The integrated DAC input may be obtained by using DADD3 to add the correcting DAC input and the sub-DAC input $D_{SUB}$.

The provision of the enable control signal CALEN for the self-correction function makes it possible to select whether or not to use the capacitance error self-correction function. For instance, the enable control signal CALEN may be used during testing to obtain uncorrected results. By using separate clocks for the clock signal CLK during normal A/D conversion and the clock MCLK during capacitance error measurement, the cycle time during normal A/D conversion may differ from the cycle time during capacitance error measurement.

The sampling period control signal SPC for the normal A/D conversion and the sampling period control signal MSPC for the capacitance error measurement are provided separately. Thus, it may be simpler to control the sampling period during normal A/D conversion and to separately control the sampling period during capacitance error measurement. The flag signal EOC, which indicates the completion of the normal A/D conversion, and the flag signal EOM, which indicates the completion of the capacitance error measurement, are also provided separately.

Since the operations of error measurement for capacitors in the main capacitive DAC differ from the operations performed during normal A/D conversion, the control signal MEAS, which specifies the error measurement mode, may be preferable. In the capacitance error measurement, the signal MEC[3:0] is provided to specify the capacitor to be error-measured in the main capacitive DAC. For instance, MEC[3:0] may specify whether the error measurement is for $C_{p9}$ ($C_{p9}$ and $C_{n9}$), $C_{p8}$ ($C_{p8}$ and $C_{n8}$), or for $C_{p7}$ ($C_{p7}$ and $C_{n7}$).

The error (the change in the top plate potential which has been searched for and digitized by the integrated DAC) in the capacitor specified by MEC[3:0] is output as MCAL[7:0]. In the circuit of FIG. 19, the integrated DAC includes an 8-bit DAC and so the error measurement result MCAL[7:0] for the capacitors is an 8-bit value. For example, the correction data for each capacitor to be stored in the data register DCREG1 may be obtained by calculating MCAL[7:0] using a CPU provided on the same chip. The calculating circuit for obtaining the correction data for each capacitor to be stored in the data register DCREG1 may alternatively be provided in the A/D conversion circuit.

DTRS is control signal for instructing writing to the data register DCREG1. DTRS is used when the correction data for each capacitor, which is calculated by the CPU provided on the same chip and is stored in the data register DCREG1, is transmitted from the CPU to the data register DCREG1. At the transmission from the CPU or an external register to DCREG1, the RAD[3:0] functions as a signal specifying an address in the DCREG1 and RDT[7:0] functions as the 8-bit correction data to be written to the data register DCREG1.

The A/D conversion circuit illustrated in FIG. 22 may be, for instance, included in an MCU at low cost.

Figure 23:
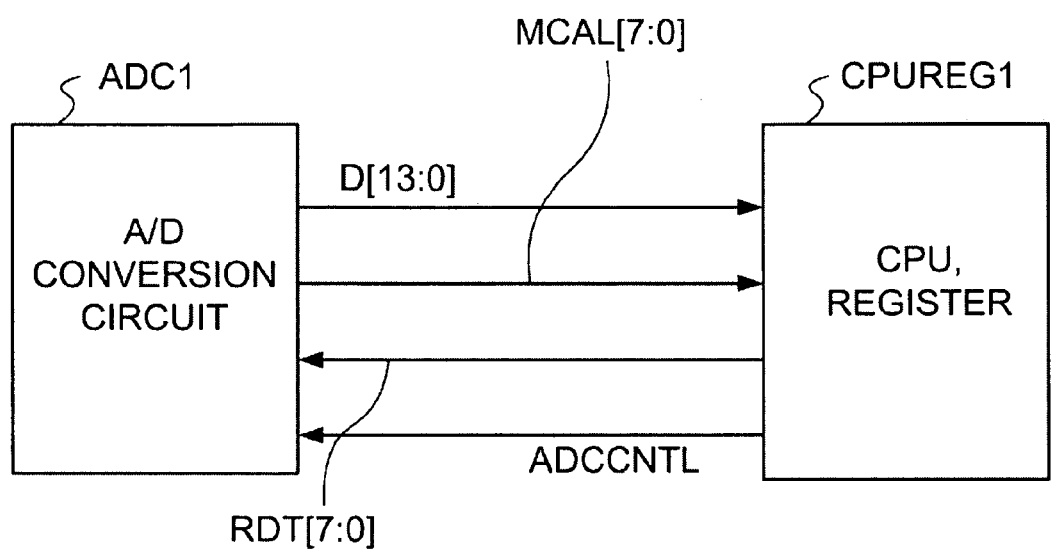
FIG. 23 illustrates an exemplary differential successive approximation A/D converter circuit.

FIG. 23 illustrates an MCU which includes a successive approximation A/D conversion circuit. The ADC1 of FIG. 23 includes, for instance, the successive approximation A/D conversion circuit illustrated in FIG. 22. CPUREG 1 includes the CPU and register provided on the same chip. D[13:0] indicates the 14-bit A/D conversion result. MCAL[7:0] indicates the 8-bit capacitance error measurement result. RDT[7:0] indicates the 8-bit correction data which is written to the data register DCREG1 of the successive approximation A/D conversion circuit. ADCCNTL indicates a control signal of the successive approximation A/D conversion circuit ADC1. In FIG. 23, signals which operate in the same way as or similar way to the signals illustrated in FIG. 22 are assigned the same symbols.

The results of the measurement of the capacitance errors may be transmitted to the CPUREG1 and the correction data of the separate capacitors to be stored in the data register DCREG1 of FIG. 22 may be calculated in CPUREG1.

For instance, multiple measurements of the capacitance errors may be performed, and the correction data for each capacitor may be determined based on an average value of the measurement results. The number of measurements for obtaining the average values of the measurement results may be determined based on the relationship between the time for the measurements and the obtained results. The successive approximation A/D conversion circuit may include only the capacitance errors measuring function while the average values of the measurement results are obtained by the CPU or register provided on the same chip.

The control signal ADCCNTL specifies the capacitor which is to undergo error measurement. The measurement is started with the error of the largest capacitor error in the DAC. The measurement results MCAL[7:0] are transmitted to CPUREG1, and measurement is repeated a number of times. Based on the measurement results, CPUREG1 then calculates the data for correcting the error of the largest capacitor in the DAC. The result of the calculation is transmitted from CPUREG1 to ADC1 and stored in the data register DCREG1 of the ADC1. RDT[7:0] denotes the transmitted data. The capacitor, which is error-measured, is changed in descending order of capacitance based on the control signal ADCCNTL, and the measurements, averaging calculations, and data calculations for error correction are performed repeatedly.

When the correction data has been assembled, the A/D conversion result D[13:0] is obtained based on the control signal ADCCNTL for specify the normal A/D conversion operations. The capacitor correction data RDT [7:0] calculated by CPUREG1 may, for example, be stored in a non-volatile memory. Correction data read from the non-volatile memory is transmitted to the ADC1 and normal self-correcting A/D conversion is performed.

Even after the shipping of an MCU product with the built-in A/D conversion circuit illustrated in FIG. 22 and FIG. 23, the correction data RDT[7:0] may be revised when necessary by a program measuring the errors in the capacitors.

Figure 24:
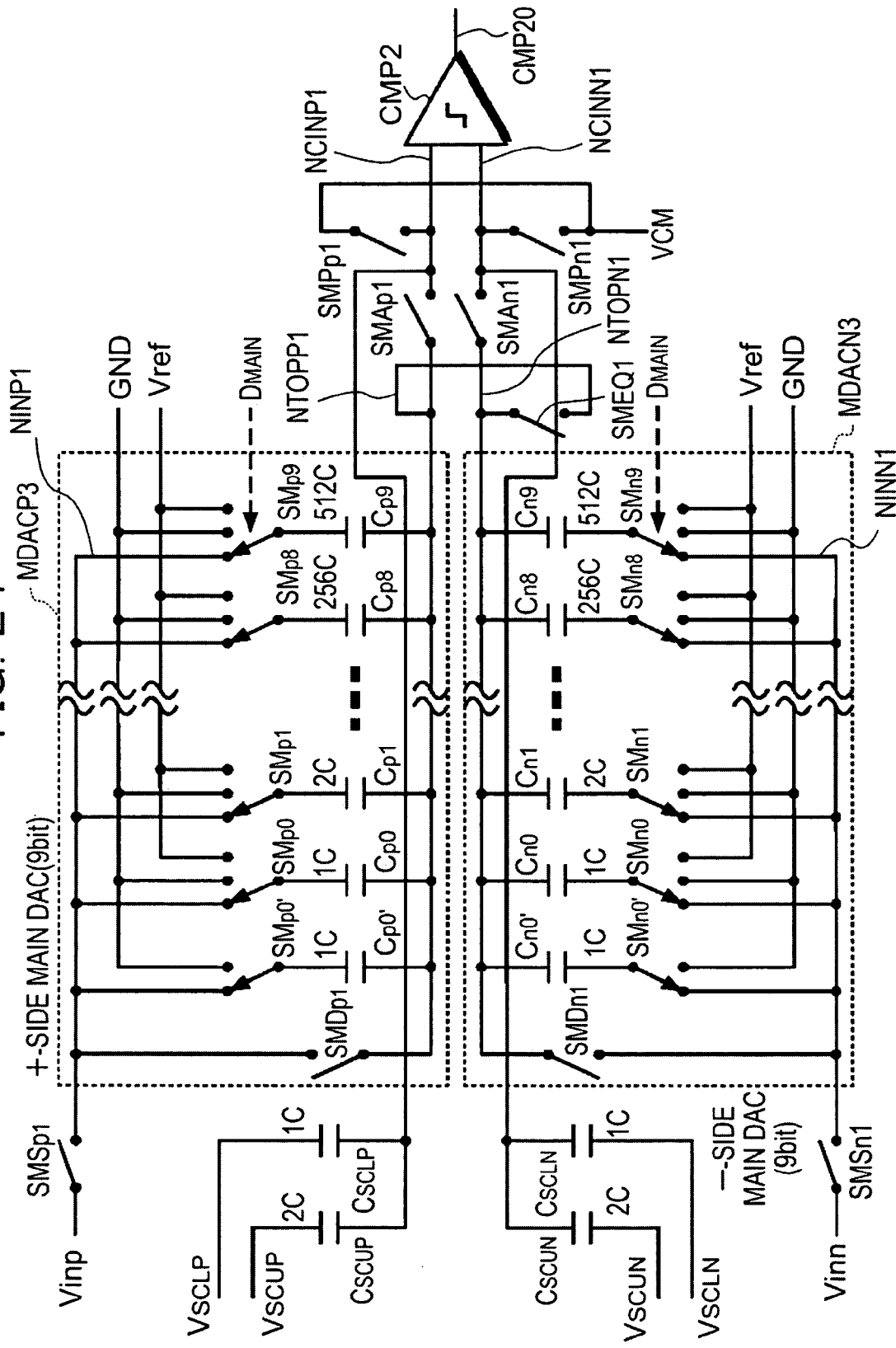
FIG. 24 illustrates another exemplary differential successive approximation A/D converter circuit.

FIG. 24 illustrates another exemplary a successive approximation A/D conversion circuit. In the circuit of FIG. 24, one terminal of each of the coupling capacitors $C_{SCUP}$, $C_{SCLP}$, $C_{SCUN}$, and $C_{SCLN}$ is coupled to the comparator input NCINP1 or NCINN1 rather than the top plate NTOPP1 or NTOPN1.

In the successive approximation period in normal A/D conversion, the top-plate potential and the comparator input potential are brought to an substantially equal potential by SMAp1 and SMAn1. In the circuit of FIG. 19, the top-plate potential during the sampling period is brought to the same or approximate potential as the input analog signal. Hence, the potential of the terminals of the coupling capacitors $C_{SCUP}$, $C_{SCLP}$, $C_{SCUN}$, and $C_{SCLN}$, which do not contribute to the sampling, are brought to the same or approximate potential as the input analog signal. In the circuit of FIG. 24, on the other hand, one terminal of each of the coupling capacitors $C_{SCUP}$, $C_{SCLP}$, $C_{SCUN}$ and $C_{SCLN}$ is coupled to the comparator input, and is therefore brought to a potential of $V_{CM}$.

In the circuit of FIG. 19, the coupling capacitors $C_{SCUP}$, $C_{SCLP}$, $C_{SCUN}$, and $C_{SCLN}$ function as parasitic capacitances of the top plate, and therefore affect the fluctuation of the top-plate potential during the successive approximation period. In the circuit of FIG. 24, on the other hand, since one terminal of each of the coupling capacitors $C_{SCUP}$, $C_{SCLP}$, $C_{SCUN}$, and $C_{SCLN}$ is at $V_{CM}$, the coupling capacitors have no effect on the fluctuation of the top-plate potential during the successive approximation.

Figure 25:
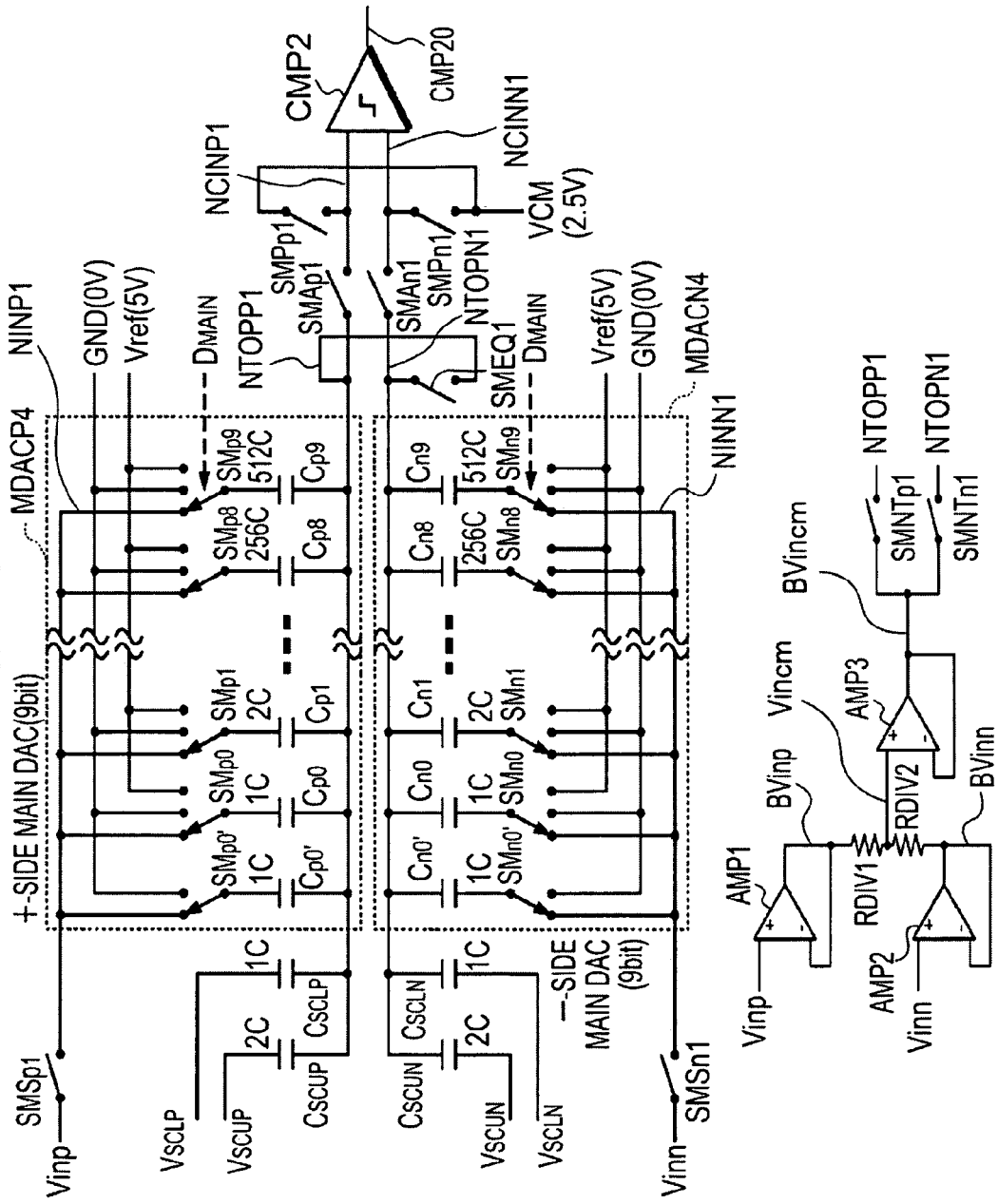
FIG. 25 illustrates another exemplary a differential successive approximation A/D converter circuit.

FIG. 25 illustrates another exemplary a successive approximation A/D conversion circuit. In the circuit of FIG. 19, the switches SMDp1 and SMDn1 are used to initialize the sampling capacitors to "0", and to bring the top plate potential to a potential which is the same as or close to the input analog signal potential. In the circuit of FIG. 25, on the other hand, amplifiers AMP1, AMP2, and AMP3 of are used to set the top plate potential during sampling to substantially the same potential as or the close potential to the common voltage of the input analog signal. AMP1 and AMP2 function as voltage followers of the input analog signals $V_{inp}$ and $V_{inn}$. By dividing AMP1 and AMP2 output potentials using resistors RDIV1 and RDIV2, a common potential $V_{incm}$ of the input analog signal is generated. By supplying $V_{incm}$ to the top plate during sampling via the AMP3, which functions as a voltage follower, the circuit illustrated in FIG. 25 may operate in the same way as or similar way to the circuit illustrated in FIG. 19.

Example embodiments of the present invention have now been described in accordance with the above advantages. It will be appreciated that these examples are merely illustrative of the invention. Many variations and modifications will be apparent to those skilled in the art.

[Formula 1]

$$C_M = C_{M-1} + C_{M-2} + \ldots + C_1 + C_0 + C_0' \qquad (1)$$

[Formula 2]

$$C_m = \frac{1}{2} C_{m+1} = \left(\frac{1}{2}\right)^{M-m} C_M \quad (m = 0, 1, \ldots M-1) \qquad (2)$$

[Formula 3]

$$C_0 = C_0' = \left(\frac{1}{2}\right)^M C_M \qquad (3)$$

[Formula 4]

$$V_{SUB} = \frac{D_{SUB}}{2^N} V_{ref} \qquad (4)$$

[Formula 5]

$$Q_{samp} = C_M(V_T - V_{in}) \qquad (5)$$

[Formula 6]

$$Q_{samp} = C_M V_{out} - (DM_{M-1}C_{M-1} + DM_{M-2}C_{M-2} + \ldots + DM_0 C_0) V_{ref} - C_0' V_{SUB} \qquad (6)$$

[Formula 7]

$$C_M(V_T - V_{in}) = C_M V_{out} - (DM_{M-1}C_{M-1} + DM_{M-2}C_{M-2} + \ldots + DM_0 C_0) V_{ref} - C_0' V_{SUB} \qquad (7)$$

[Formula 8]

$$V_{out} = V_T - V_{in} + \frac{DM_{M-1}C_{M-1} + DM_{M-2}C_{M-2} + \ldots + DM_0 C_0}{C_M} V_{ref} + \frac{C_0'}{C_M} V_{SUB} \qquad (8)$$

[Formula 9]

$$\begin{aligned} V_{out} &= V_T + \frac{DM_{M-1}C_{M-1} + DM_{M-2}C_{M-2} \ldots + DM_0 C_0}{C_M} V_{ref} + \\ &\quad \frac{C_0'}{C_M} V_{SUB} - V_{in} \\ &= V_T + \left\{\left(\frac{1}{2}\right)^1 DM_{M-1} + \left(\frac{1}{2}\right)^2 DM_{M-2} + \ldots + \left(\frac{1}{2}\right)^M DM_0\right\} V_{ref} + \\ &\quad \frac{1}{2^M} \frac{D_{SUB}}{2^N} V_{ref} - V_{in} \\ &= V_T + \frac{D_{MAIN}}{2^M} V_{ref} + \frac{1}{2^M} \frac{D_{SUB}}{2^N} V_{ref} - V_{in} \\ &= V_T + \frac{2^N D_{MAIN} + D_{SUB}}{2^M 2^N} V_{ref} - V_{in} \\ &= V_T + \frac{D}{2^{M+N}} V_{ref} - V_{in} \end{aligned} \qquad (9)$$

[Formula 10]

$$D = 2^N D_{MAIN} + D_{SUB} \qquad (10)$$

[Formula 11]

$$V_{in} = \frac{D}{2^{M+N}} V_{ref} \qquad (11)$$

[Formula 12]

$$C_m = C_{m,ideal} + \Delta C_m \quad (m=1,2,\ldots M-1)$$

$$C_0' = C_{0,ideal}' + \Delta C_0 \qquad (12)$$

[Formula 13]

$$V_{out} = V_T + \frac{DM_{M-1}C_{M-1,ideal} + DM_{M-2}C_{M-2,ideal} \ldots + DM_0C_{0,ideal}}{C_M}V_{ref} +$$
$$\frac{C'_{0,ideal}}{C_M}\frac{D_{SUB}}{2^N}V_{ref} + \frac{DM_{M-1}\Delta C_{M-1} + DM_{M-2}\Delta C_{M-2} \ldots + DM_0\Delta C_0}{C_M}V_{ref} + \frac{\Delta C'_0}{C_M}\frac{D_{SUB}}{2^N}V_{ref} - V_{in}$$
$$= V_T + \frac{D}{2^{M+N}}V_{ref} + \frac{DM_{M-1}\Delta C_{M-1} + DM_{M-2}\Delta C_{M-2} + \ldots + DM_0\Delta C_0 + \Delta C'_0\frac{D_{SUB}}{2^N}}{C_M}V_{ref} - V_{in}$$

(13)

[Formula 14]

$$V_{in} = \frac{D}{2^{M+N}}V_{ref} + \frac{DM_{M-1}\Delta C_{M-1} + DM_{M-2}\Delta C_{M-2} + \ldots + DM_0\Delta C_0 + \Delta C'_0\frac{D_{SUB}}{2^N}}{C_M}V_{ref}$$

(14)

[Formula 15]

$$V_{CAL} = \frac{D_{CAL}}{2^P}V_{ref}$$

(15)

[Formula 16]

$$Q_{samp} = (C_M + C_{CAL})V_T - C_M V_{in} - C_{CAL}V_{CAL,init}$$

(16)

[Formula 17]

$$Q_{samp} = (C_M + C_{CAL})V_{out} - (DM_{M-1}C_{M-1} + DM_{M-2}C_{M-2} + \ldots + DM_0C_0)V_{ref} - C'_0V_{SUB} - C_{CAL}V_{CAL}$$

(17)

[Formula 18]

$$V_{out} = V_T + \frac{DM_{M-1}C_{M-1} + DM_{M-2}C_{M-2} + \ldots + DM_0C_0}{C_M + C_{CAL}}V_{ref} +$$
$$\frac{C'_0}{C_M + C_{CAL}}V_{SUB} - \frac{C_M}{C_M + C_{CAL}}V_{in} + \frac{C_{CAL}}{C_M + C_{CAL}}(V_{CAL} - V_{CAL,init})$$

(18)

[Formula 19]

$$V_{in} = V_T + \frac{DM_{M-1}C_{M-1,ideal} + DM_{M-2}C_{M-2,ideal} + \ldots + DM_0C_{0,ideal}}{C_M}V_{ref} +$$
$$\frac{C'_{0,ideal}}{C_M}V_{SUB} +$$
$$\frac{DM_{M-1}\Delta C_{M-1} + DM_{M-2}\Delta C_{M-2} + \ldots + DM_0\Delta C_0}{C_M}V_{ref} +$$
$$\frac{\Delta C'_0}{C_M}V_{SUB} + \frac{C_{CAL}}{C_M}(V_{CAL} - V_{CAL,init})$$
$$= \frac{D}{2^{M+N}}V_{ref} + \frac{DM_{M-1}\Delta C_{M-1} + DM_{M-2}\Delta C_{M-2} + \ldots + DM_0\Delta C_0}{C_M}V_{ref} +$$
$$\frac{C'_0}{C_M}V_{SUB} + \frac{C_{CAL}}{C_M}(V_{CAL} - V_{CAL,init})$$

(19)

[Formula 20]

$$\frac{DM_{M-1}\Delta C_{M-1} + DM_{M-2}\Delta C_{M-2} + \ldots + DM_0 C_0}{C_M}V_{ref} = -\frac{C_{CAL}}{C_M}(V_{CAL} - V_{CAL,init})$$

$$V_{CAL} - V_{CAL,init} = -\frac{\Delta C_{M-1}}{C_{CAL}}V_{ref}DM_{M-1} - \frac{\Delta C_{M-2}}{C_{CAL}}V_{ref}DM_{M-2} - \ldots - \frac{\Delta C_0}{C_{CAL}}V_{ref}DM_0$$

(20)

[Formula 21]

$$V_{CDAC,m} = \frac{\Delta C_m}{C_{CAL}}V_{ref}(m = 0, 1, \ldots M-1)$$

(21)

[Formula 22]

$$V_{CL} - V_{CAL,init} = -V_{CDAC,M-1}DM_{M-1} - V_{CDAC,M-2}DM_{M-2} - \ldots - V_{CDAC,0}DM_0$$

(22)

[Formula 23]

$$\overline{C}_m \equiv C_{m-1} + C_{m-2} + \ldots + C_0 + C_0'(m=1,2,\ldots M)$$

(23)

[Formula 24]

$$\overline{C}_0 \equiv C_0'$$

(24)

[Formula 25]

$$Q_{x,M-1} = C_{M-1}(V_T - V_{ref}) + \overline{C}_{M-1}V_T + C_{CAL}(V_T - V_{CAL,init})$$

(25)

[Formula 26]

$$Q_{x,M-1} = C_{M-1}V_{x,M-1} + C_{\overline{M}-1}-V_{ref}) + C_{CAL}(V_{x,M-1}-V_{CAL,M-1}) \quad (26)$$

[Formula 27]

$$V_{x,M-1} = V_T + \frac{C_{\overline{M}-1} - C_{M-1}}{C_M + C_{CAL}} V_{ref} + \frac{C_{CAL}}{C_M + C_{CAL}}(V_{CAL,M-1} - V_{CAL,init}) \quad (27)$$

[Formula 28]

$$(C_{\overline{M}-1} - C_{M-1})V_{ref} = -C_{CAL}(V_{CAL,M-1} - V_{CAL,init}) \quad (28)$$

[Formula 29]

$$(C_{M-1,ideal} + \Delta C_{\overline{M}-1} - C_{M-1,ideal} - \Delta C_{M-1})V_{ref} = -C_{CAL}(V_{CAL,M-1} - V_{CAL,init}) \quad (29)$$

[Formula 30]

$$\frac{\Delta C_{M-1}}{C_{CAL}} V_{ref} = \frac{1}{2}(V_{CAL,M-1} - V_{CAL,init}) \quad (30)$$

[Formula 31]

$$Q_{x,M-2} = C_{M-2}(V_T - V_{ref}) + (C_{M-1} + C_{\overline{M}-2})V_T + C_{CAL}(V_T - V_{CAL,init}) \quad (31)$$

[Formula 32]

$$Q_{x,M-2} = (C_{M-1} + C_{M-2})V_{x,x-2} + C_{\overline{M}-2}(V_{x,M-2} - V_{ref}) + C_{CAL}(V_{x,M-2} - V_{CAL,M-2}) \quad (32)$$

[Formula 33]

$$V_{x,M-2} = V_T + \frac{C_{\overline{M}-2} - C_{M-2}}{C_M + C_{CAL}} V_{ref} + \frac{C_{CAL}}{C_M + C_{CAL}}(V_{CAL,M-2} - V_{CAL,init}) \quad (33)$$

[Formula 34]

$$(C_{\overline{M}-2} - C_{M-2})V_{ref} = C_{CAL}(V_{CAL,M-2} - V_{CAL,init}) \quad (34)$$

[Formula 35]

$$(C_{M-2,ideal} + \Delta C_{\overline{M}-2} - C_{M-2,ideal} - \Delta C_{M-2})V_{ref} = -C_{CAL}(V_{CAL,M-2} - V_{CAL,init}) \quad (35)$$

[Formula 36]

$$\frac{\Delta C_{M-2}}{C_{CAL}} V_{ref} = \frac{1}{2}(V_{CAL,M-2} - V_{CAL,init}) - \frac{1}{2}\frac{\Delta C_{M-1}}{C_{CAL}} V_{ref} \quad (36)$$

[Formula 37]

$$Q_{x,m} = C_m(V_T - V_{ref}) + (C_{M-1} + C_{M-2} + \ldots + C_{m+1} + C_{\overline{m}})V_T + C_{CAL}(V_T - V_{CAL,init}) \quad (37)$$

[Formula 38]

$$Q_{x,m} = (C_{M-1} + C_{M-2} + \ldots + C_{m+1} + C_m)V_{x,m} + C_{\overline{m}}(V_{x,m} - V_{ref}) + C_{CAL}(V_{x,m} - V_{CAL,m}) \quad (38)$$

[Formula 39]

$$V_{x,m} = V_T + \frac{\overline{C}_m - C_m}{C_M + C_{CAL}} V_{ref} + \frac{C_{CAL}}{C_M + C_{CAL}}(V_{CAL,m} - V_{CAL,init}) \quad (39)$$

[Formula 40]

$$(\overline{C}_m - C_m)V_{ref} = -C_{CAL}(V_{CAL,m} - V_{CAL,init}) \quad (40)$$

[Formula 41]

$$(C^-_{m,ideal} + \Delta \overline{C}_m - C_{m,ideal} - \Delta C_m)V_{ref} = -C_{CAL}(V_{CAL,m} - V_{CAL,init}) \quad (41)$$

[Formula 42]

$$\frac{\Delta C_m}{C_{CAL}} V_{ref} = \frac{1}{2}(V_{CAL,m} - V_{CAL,init}) - \frac{1}{2}\frac{\Delta C_{M-1}}{C_{CAL}} V_{ref} - \frac{1}{2}\frac{\Delta C_{M-2}}{C_{CAL}} V_{ref} - \ldots - \frac{1}{2}\frac{\Delta C_{m+1}}{C_{CAL}} V_{ref} \quad (42)$$

[Formula 43]

$$\frac{\Delta C_{M-1}}{C_{CAL}} V_{ref} = \frac{1}{2}(V_{CAL,M-1} - V_{CAL,init})$$

$$\frac{\Delta C_{M-2}}{C_{CAL}} V_{ref} = \frac{1}{2}(V_{CAL,M-2} - V_{CAL,init}) - \frac{1}{2}\frac{\Delta C_{M-1}}{C_{CAL}} V_{ref}$$

$$\frac{\Delta C_{M-3}}{C_{CAL}} V_{ref} = \frac{1}{2}(V_{CAL,M-3} - V_{CAL,init}) - \frac{1}{2}\frac{\Delta C_{M-1}}{C_{CAL}} V_{ref} - \frac{1}{2}\frac{\Delta C_{M-2}}{C_{CAL}} V_{ref}$$

$$\ldots$$

$$\frac{\Delta C_0}{C_{CAL}} V_{ref} = \frac{1}{2}(V_{CAL,0} - V_{CAL,init}) - \frac{1}{2}\frac{\Delta C_{M-1}}{C_{CAL}} V_{ref} - \frac{1}{2}\frac{\Delta C_{M-2}}{C_{CAL}} V_{ref} - \ldots - \frac{1}{2}\frac{\Delta C_1}{C_{CAL}} V_{ref} \quad (43)$$

[Formula 44]

$$V_{SUBP} = \frac{D_{SUB}}{2^5} V_{ref} \quad (44)$$

[Formula 45]

$$V_{SUBN} = \frac{(2^5 - D_{SUB})}{2^5} V_{ref} \quad (45)$$

[Formula 46]

$$Q_{sampp} = 1024C(V_{TOPI} - V_{inp}) \quad (46)$$

[Formula 47]

$$Q_{sampp} = 1024CV_{outp} - (512C + DM_8 * 256C + \ldots + DM_0C)V_{ref} - CV_{SUBP} \quad (47)$$

[Formula 48]

$$1024C(V_{TOPI} - V_{inp}) = 1024CV_{outp} - (512C + DM_8 * 256C + \ldots + DM_0C)V_{ref} - CV_{SUBP} \quad (48)$$

[Formula 49]

$$V_{outp} = V_{TOPI} - V_{inp} + \frac{512C + DM_8*256C + \ldots + DM_0C}{1024C}V_{ref} + \frac{C}{1024C}V_{SUBP} \quad (49)$$

[Formula 50]

$$\begin{aligned}V_{outp} &= V_{TOPI} + \frac{512C + DM_8*256C + \ldots + DM_0C}{1024C}V_{ref} + \\ &\quad \frac{C}{1024C}V_{SUBP} - V_{inp} \\ &= V_{TOPI} + \left\{\left(\frac{1}{2}\right) + \left(\frac{1}{2}\right)^2 DM_8 + \ldots + \left(\frac{1}{2}\right)^{10}DM_0\right\}V_{ref} + \\ &\quad \frac{1}{2^{10}}\frac{D_{SUB}}{2^5}V_{ref} - V_{inp} \\ &= V_{TOPI} + \frac{1}{2}V_{ref} + \frac{D_{MAIN}}{2^{10}}V_{ref} + \frac{1}{2^{10}}\frac{D_{SUB}}{2^5}V_{ref} - V_{inp} \\ &= V_{TOPI} + \frac{1}{2}V_{ref} + \frac{2^5 D_{MAIN} + D_{SUB}}{2^{10}2^5}V_{ref} - V_{inp} \\ &= V_{TOPI} + \frac{1}{2}V_{ref} + \frac{D}{2^{10+5}}V_{ref} - V_{inp}\end{aligned} \quad (50)$$

[Formula 51]

$$D = 2^5 D_{MAIN} + D_{SUB} \quad (51)$$

[Formula 52]

$$Q_{sampn} = 1024C(V_{TOPI} - V_{inn}) \quad (52)$$

[Formula 53]

$$Q_{sampn} = 1024CV_{outn} - ((1-DM_8)*256C + \ldots + (1-DM_0)C)V_{ref} - CV_{SUBN} \quad (53)$$

[Formula 54]

$$(1-DM_8)2^8 + (1-DM_7)2^7 + \ldots + (1-DM_1)2^1 + (1-DM_0) \quad (54)$$

[Formula 55]

$$1024C(V_{TOPI} - V_{inn}) = 1024CV_{outn} - (512C - C - DM_8*256C - \ldots - DM_0C)V_{ref} - CV_{SUBN} \quad (55)$$

[Formula 56]

$$V_{outn} = V_{TOPI} - V_{inn} + \frac{512C - C - DM_8*256C - \ldots - DM_0C}{1024C}V_{ref} + \frac{C}{1024C}V_{SUBN} \quad (56)$$

[Formula 57]

$$\begin{aligned}V_{outn} &= V_{TOPI} + \frac{512C - DM_8*256C - \ldots - DM_0C}{1024C}V_{ref} - \\ &\quad \frac{C}{1024C} + \frac{C}{1024C}V_{SUBN} - V_{inn} \\ &= V_{TOPI} + \left\{\left(\frac{1}{2}\right) - \left(\frac{1}{2}\right)^2 DM_8 - \ldots - \left(\frac{1}{2}\right)^{10}DM_0\right\}V_{ref} - \\ &\quad \frac{1}{2^{10}} + \frac{1}{2^{10}}\frac{(2^5 - D_{SUB})}{2^5}V_{ref} - V_{inn} \\ &= V_{TOPI} + \frac{1}{2}V_{ref} - \frac{D_{MAIN}}{2^{10}}V_{ref} - \frac{1}{2^{10}}\frac{D_{SUB}}{2^5}V_{ref} - V_{inn} \\ &= V_{TOPI} + \frac{1}{2}V_{ref} - \frac{2^5 D_{MAIN} + D_{SUB}}{2^{10}2^5}V_{ref} - V_{inn} \\ &= V_{TOPI} + \frac{1}{2}V_{ref} - \frac{D}{2^{10+5}}V_{ref} - V_{inn}\end{aligned} \quad (57)$$

[Formula 58]

$$\begin{aligned}V_{outp} - V_{outn} &= \frac{D}{2^{10+5}}V_{ref} + \frac{D}{2^{10+5}}V_{ref} - (V_{inp} - V_{inn}) \\ V_{outp} - V_{outn} &= \frac{D}{2^{14}}V_{ref} - (V_{inp} - V_{inn})\end{aligned} \quad (58)$$

[Formula 59]

$$D = 2^5 D_{MAIN} + D_{SUB} \quad (59)$$

[Formula 60]

$$V_{inp} - V_{inn} = \frac{D}{2^{14}}V_{ref} \quad (60)$$

[Formula 61]

$$V_{SCU} = \frac{D_{SCU}}{16}V_{ref} \quad (61)$$

[Formula 62]

$$V_{SCL} = \frac{D_{SCL}}{128}V_{ref} \quad (62)$$

[Formula 63]

$$Q_{x,8} = (C_9 + C_{SCU} + C_{SCL})V_T - C_8 V_{ref} - C_{SCU}V_{SCU,init} - C_{SCL}V_{SCL,init} \quad (63)$$

[Formula 64]

$$Q_{x,8} = (C_9 + C_{SCU} + C_{SCL})V_{x,8} - \overline{C}_8 V_{ref} - C_{SCU}V_{SCU} - C_{SCL}V_{CSL} \quad (64)$$

[Formula 65]

$$V_{x,8} = V_T + \frac{\overline{C}_8 - C_8}{C_9 + C_{SCU} + C_{SCL}}V_{ref} + \frac{C_{SCU}}{C_9 + C_{SCU} + C_{SCL}}(V_{SCU} - V_{SCU,init}) + \frac{C_{SCL}}{C_9 + C_{SCU} + C_{SCL}}(V_{SCL} - V_{SCL,init}) \quad (65)$$

[Formula 66]

$$\begin{aligned}V_{x,8} &= V_T + \frac{\overline{C}_8 - C_8}{C_9 + C_{SCU} + C_{SCL}}V_{ref} + \frac{C_{SCL}}{C_9 + C_{SCU} + C_{SCL}} \\ &\quad \frac{D_{SC} - D_{SC,init}}{128}V_{ref} \\ &= V_T + \frac{-2\Delta C_8}{C_9 + C_{SCU} + C_{SCL}}V_{ref} + \frac{C_{SCL}}{C_9 + C_{SCU} + C_{SCL}} \\ &\quad \frac{D_{SC} - D_{SC,init}}{128}V_{ref}\end{aligned} \quad (66)$$

[Formula 67]

$$\frac{\Delta C_8}{C_{SCL}} = \frac{1}{2}\frac{D_{SC8} - D_{SC,init}}{128} \quad (67)$$

[Formula 68]

$$MEM_8 = 128\frac{\Delta C_8}{C_{SCL}} = \frac{1}{2}(D_{SC8} - D_{SC,init}) \quad (68)$$

[Formula 69]

$$Q_{x,7} = (C_9 + C_{SCU} + C_{SCL})V_T - C_7 V_{ref} - C_{SCU} V_{SCU,init} - C_{SCL} V_{SCL,init} \quad (69)$$

[Formula 70]

$$Q_{x,7} = (C_9 + C_{SCU} + C_{SCL})V_{x,7} - \overline{C}_7 V_{ref} - C_{SCU} V_{SCU} - C_{SCL} V_{SCL} \quad (70)$$

[Formula 71]

$$V_{x,7} = V_T + \frac{\overline{C}_7 - C_7}{C_9 + C_{SCU} + C_{SCL}} V_{ref} + \frac{C_{SCU}}{C_9 + C_{SCU} + C_{SCL}} (V_{SCU} - V_{SCU,init}) + \frac{C_{SCL}}{C_9 + C_{SCU} + C_{SCL}} (V_{SCL} - V_{SCL,init}) \quad (71)$$

[Formula 72]

$$V_{x,7} = V_T + \frac{\overline{C}_7 - C_7}{C_9 + C_{SCU} + C_{SCL}} V_{ref} + \frac{C_{SCL}}{C_9 + C_{SCU} + C_{SCL}} \frac{D_{SC} - D_{SC,init}}{128} V_{ref}$$

$$= V_T + \frac{-2\Delta C_7 - \Delta C_8}{C_9 + C_{SCU} + C_{SCL}} V_{ref} + \frac{C_{SCL}}{C_9 + C_{SCU} + C_{SCL}} \frac{D_{SC} - D_{SC,init}}{128} V_{ref} \quad (72)$$

[Formula 73]

$$\frac{\Delta C_7}{C_{SCL}} = \frac{1}{2} \frac{D_{SC7} - D_{SC,init}}{128} \frac{1}{2} \frac{\Delta C_8}{C_{SCL}} \quad (73)$$

[Formula 74]

$$MEM_7 = 128 \frac{\Delta C_8}{C_{SCL}} = \frac{1}{2}(D_{SC7} - D_{SC,init}) - \frac{1}{2} MEM_7 \quad (74)$$

[Formula 75]

$$MEM_8 = 128 \frac{\Delta C_8}{C_{SCL}} = \frac{1}{2}(D_{SC8} - D_{SC,init}) \quad (75)$$

$$MEM_7 = 128 \frac{\Delta C_7}{C_{SCL}} = \frac{1}{2}(D_{SC7} - D_{SC,init}) - \frac{1}{2} MEM_8$$

$$MEM_6 = 128 \frac{\Delta C_6}{C_{SCL}}$$

$$= \frac{1}{2}(D_{SC6} - D_{SC,init}) - \frac{1}{2} MEM_8 - \frac{1}{2} MEM_7$$

...

$$MEM_0 = 128 \frac{\Delta C_0}{C_{SCL}}$$

$$= \frac{1}{2}(D_{SC0} - D_{SC,init}) - \frac{1}{2} MEM_8 - \frac{1}{2} MEM_7 - \ldots - \frac{1}{2} MEM_1$$

[Formula 76]

$$Q_{samp} = (C_9 + C_{SCU} + C_{SCL})V_T - C_9 V_{in} - C_{SCU} V_{SCU,init} - C_{SCL} V_{SCL,init} \quad (76)$$

[Formula 77]

$$Q_{samp} = (C_9 + C_{SCU} + C_{SCL})V_{out} - (DM_8 C_8 + DM_7 C_7 + \ldots + DM_0 C_0)V_{ref} - C_{SCU} V_{SCU} - C_{SCL} V_{SCL} \quad (77)$$

[Formula 78]

$$V_{out} = V_T \frac{C_9}{C_9 + C_{SCU} + C_{SCL}} V_{in} + \frac{DM_8 C_8 + D_7 C_7 + \ldots + DM_0 C_0}{C_9 + C_{SCU} + C_{SCL}} V_{ref} + \frac{C_{SCU}}{C_9 + C_{SCU} + C_{SCL}} (V_{SCU} - V_{SCU,init}) + \frac{C_{SCL}}{C_9 + C_{SCU} + C_{SCL}} (V_{SCL} - V_{SCL,init}) \quad (78)$$

[Formula 79]

$$V_{out} = V_T \frac{C_9}{C_9 + C_{SCU} + C_{SCL}} V_{in} + \frac{DM_8 C_8 + D_7 C_7 + \ldots + DM_0 C_0}{C_9 + C_{SCU} + C_{SCL}} V_{ref} + \frac{C_{SCL}}{C_9 + C_{SCU} + C_{SCL}} \frac{D_{SC} - D_{SC,init}}{128} V_{ref} \quad (79)$$

[Formula 80]

$$V_{out} = V_T \frac{C_9}{C_9 + C_{SCU} + C_{SCL}} V_{in} + \frac{DM_8 C_{8,ideal} + D_7 C_{7,ideal} + \ldots + DM_0 C_{0,ideal}}{C_9 + C_{SCU} + C_{SCL}} V_{ref} + \frac{C_{SCL}}{C_9 + C_{SCU} + C_{SCL}} \frac{D_{SC} - D_{SC,init}}{128} V_{ref} + \frac{DM_8 \Delta C_8 + D_7 \Delta C_7 + \ldots + DM_0 \Delta C_0}{C_9 + C_{SCU} + C_{SCL}} V_{ref} \quad (80)$$

[Formula 81]

$$D_{SC} = D_{SC,init} - DM_8 MEM_8 - DM_7 MEM_7 - \ldots - DM_0 MEM_0 \quad (81)$$

[Formula 82]

$$V_{out} = V_T - \frac{C_9}{C_9 + C_{SCU} + C_{SCL}} V_{in} + \frac{C_{8,ideal}}{C_9 + C_{SCU} + C_{SCL}} V_{ref} + \frac{C_{SCL}}{C_9 + C_{SCU} + C_{SCL}} \frac{1}{128}\left(-\frac{128\Delta C_8}{C_{SCL}}\right) V_{ref} + \frac{\Delta C_8}{C_9 + C_{SCU} + C_{SCL}} V_{ref}$$

$$= V_T - \frac{C_9}{C_9 + C_{SCU} + C_{SCL}} V_{in} + \frac{C_{8,ideal}}{C_9 + C_{SCU} + C_{SCL}} V_{ref} \quad (82)$$

[Formula 83]

$$V_{out} = V_T - \frac{C_9}{C_9 + C_{SCU} + C_{SCL}} V_{in} + \frac{C_{8,ideal} + C_{7,ideal}}{C_9 + C_{SCU} + C_{SCL}} V_{ref} + \frac{C_{SCL}}{C_9 + C_{SCU} + C_{SCL}} \frac{1}{128}\left(-\frac{128\Delta C_8}{C_{SCL}} - \frac{128\Delta C_7}{C_{SCL}}\right) V_{ref} + \frac{\Delta C_8 + \Delta C_7}{C_9 + C_{SCU} + C_{SCL}} V_{ref}$$

$$= V_T - \frac{C_9}{C_9 + C_{SCU} + C_{SCL}} V_{in} + \frac{C_{8,ideal} + C_{7,ideal}}{C_9 + C_{SCU} + C_{SCL}} V_{ref} \quad (83)$$

[Formula 84]

$$V_{out} = V_T - \frac{C_9}{C_9 + C_{SCU} + C_{SCL}} V_{in} + \frac{C_{8,ideal} + C_{7,ideal}}{C_9 + C_{SCU} + C_{SCL}} V_{ref} + \frac{C_{SCL}}{C_9 + C_{SCU} + C_{SCL}} \frac{1}{128}\left(\frac{-128\Delta C_7}{C_{SCL}}\right)V_{ref} + \frac{\Delta C_7}{C_9 + C_{SCU} + C_{SCL}} V_{ref}$$

$$= V_T - \frac{C_9}{C_9 + C_{SCU} + C_{SCL}} V_{in} + \frac{C_{7,ideal}}{C_9 + C_{SCU} + C_{SCL}} V_{ref} \quad (84)$$

[Formula 85]

$$D_{SC} = D_{SC,init} + 2^2 D_{SUB} - DM_8 MEM_8 - DM_7 MEM_7 - \ldots - DM_0 MEM_0 \quad (85)$$

[Formula 86]

$$V_{SCUP} = \frac{D_{SCU}}{16} V_{ref} \quad (86)$$

[Formula 87]

$$V_{SCLP} = \frac{D_{SCL}}{128} V_{ref} \quad (87)$$

[Formula 88]

$$V_{SCUN} = \frac{(16 - D_{SCU})}{16} V_{ref} \quad (88)$$

[Formula 89]

$$V_{SCLN} = \frac{(128 - D_{SCL})}{128} V_{ref} \quad (89)$$

[Formula 90]

$$Q_{sampp} = 1024C(V_{TOPI} - V_{inp}) + C_{SCUP}(V_{TOPI} - V_{SCUP,init}) + C_{SCLP}(V_{TOPI} - V_{SCLP,init}) \quad (90)$$

[Formula 91]

$$Q_{sampp} = (1024C + C_{SCUP} + C_{SCLP})V_{outp} - (C_{p9} + DM_8 C_{p8} + \ldots + DM_0 C_{p0})V_{ref} - C_{SCUP}V_{SCUP} - C_{SCLP}V_{SCLP} \quad (91)$$

[Formula 92]

$$(1024C + C_{SCUP} + C_{SCLP})V_{TOPI} - 1024CV_{inp} - C_{SCUP}V_{SCUP,init} - C_{SCLP}V_{SCLP,init} = (1024C + C_{SCUP} + C_{SCLP})V_{outp} - (C_{p9} + DM_8 C_{p8} + \ldots + DM_0 C_{p0})V_{ref} - C_{SCUP}V_{SCUP} - C_{SCLP}V_{SCLP} \quad (92)$$

[Formula 93]

$$V_{outp} = V_{TOPI} - \frac{1024C}{1024C + C_{SCUP} + C_{SCLP}} V_{inp} + \frac{C_{p9} + DM_8 C_{p8} + \ldots + DM_0 C_{p0}}{1024C + C_{SCUP} + C_{SCLP}} V_{ref} + \frac{C_{SCUP}}{1024C + C_{SCUP} + C_{SCLP}}(V_{SCUP} - V_{SCUP,init}) + \frac{C_{SCLP}}{1024C + C_{SCUP} + C_{SCLP}}(V_{SCLP} - V_{SCLP,init}) \quad (93)$$

[Formula 94]

$$V_{outp} = V_{TOPI} - \frac{1024C}{1024C + C_{SCUP} + C_{SCLP}} V_{inp} + \frac{C_{p9} + DM_8 C_{p8} + \ldots + DM_0 C_{p0}}{1024C + C_{SCUP} + C_{SCLP}} V_{ref} + \frac{C_{SCLP}}{1024C + C_{SCUP} + C_{SCLP}} \frac{D_{SC} - D_{SC,init}}{128} V_{ref} \quad (94)$$

[Formula 95]

$$V_{outp} = V_{TOPI} - \frac{1024C}{1024C + C_{SCUP} + C_{SCLP}} V_{inp} + \frac{512 + DM_8 * 256C + DM_7 * 128C + \ldots + DM_0 C}{1024C + C_{SCUP} + C_{SCLP}} V_{ref} + \frac{C_{SCLP}}{1024C + C_{SCUP} + C_{SCLP}} \frac{D_{SC} - D_{SC,init}}{128} V_{ref} + \frac{\Delta C_{p9} + DM_8 \Delta C_{p8} + DM_7 \Delta C_{p7} + \ldots + DM_0 \Delta C_{p0}}{1024C + C_{SCUP} + C_{SCLP}} V_{ref} \quad (95)$$

[Formula 96]

$$V_{outp} = V_{TOPI} - \frac{1024C}{1027C} V_{inp} + \frac{512C + DM_8 * 256C + DM_7 * 128C + \ldots + DM_0 C}{1027C} V_{ref} + \frac{C}{1027C} \frac{D_{SC} - D_{SC,init}}{128} V_{ref} + \frac{\Delta C_{p9} + DM_8 \Delta C_{p8} + DM_7 \Delta C_{p7} + \ldots + DM_0 \Delta C_{p0}}{1027C} V_{ref} \quad (96)$$

[Formula 97]

$$Q_{sampn} = 1024C(V_{TOPI} - V_{inn}) + C_{SCUN}(V_{TOPI} - V_{SCUN,init}) + C_{SCLN}(V_{TOPI} - V_{SCLN,init}) \quad (97)$$

[Formula 98]

$$Q_{sampn} = (1024C + C_{SCUN} + C_{SCLN})V_{outn} - ((1 - DM_8)C_{n8} + \ldots + (1 - DM_0)C_{n0} + C_{n0}')V_{ref} - C_{SCUN}V_{SCUN} - C_{SCLN}V_{SCLN} \quad (98)$$

[Formula 99]

$$(1024C + C_{SCUN} + C_{SCLN})V_{TOPI} - 1024CV_{inn} - C_{SCUN}V_{SCUN,init} - C_{SCLN}V_{SCLN,init} = (1024C + C_{SCUN} + C_{SCLN})V_{outn} - ((1 - DM_8)C_{n8} + \ldots + (1 - DM_0)C_{n0} + C_{n0}')V_{ref} - C_{SCUN}V_{SCUN} - C_{SCLN}V_{SCLN} \quad (99)$$

[Formula 100]

$$V_{outn} = V_{TOPI} - \frac{1024C}{1024C + C_{SCUN} + C_{SCLN}} V_{inn} + \frac{(1 - DM_8)C_{n8} + \ldots + (1 - DM_0)C_{n0} + C_{n0}'}{1024C + C_{SCUN} + C_{SCLN}} V_{ref} + \frac{C_{SCUN}}{1024C + C_{SCUN} + C_{SCLN}}(V_{SCUN} - V_{SCUN,init}) + \frac{C_{SCLN}}{1024C + C_{SCUN} + C_{SCLN}}(V_{SCLN} - V_{SCUN,in;} \quad (100)$$

-continued

[Formula 101]

$$V_{outn} = V_{TOPI} - \frac{1024C}{1024C + C_{SCUN} + C_{SCLN}} V_{inn} + \frac{(1-DM_8)C_{n8} + \ldots + (1-DM_0)C_{n0} + C'_{n0}}{1024C + C_{SCUN} + C_{SCLN}} V_{ref} + \frac{C_{SCLN}}{1024C + C_{SCUN} + C_{SCLN}} \frac{-D_{SC} + D_{SC,init}}{128} V_{ref}$$ (101)

[Formula 102]

$$V_{outn} = V_{TOPI} - \frac{1024C}{1024C + C_{SCUN} + C_{SCLN}} V_{inn} + \frac{(1-DM_8)*256C + (1-DM_7)*128C + \ldots + (1-DM_0)C + C}{1024C + C_{SCUN} + C_{SCLN}} V_{ref} + \frac{C_{SCLN}}{1024C + C_{SCUN} + C_{SCLN}} \frac{-D_{SC} + D_{SC,init}}{128} V_{ref} + \frac{(1-DM_8)\Delta C_{n8} + (1-DM_7)\Delta C_{n7} + \ldots + (1-DM_0)\Delta C_{n0} + \Delta C'_{n0}}{1024C + C_{SCUN} + C_{SCLN}} V_{ref}$$ (102)

[Formula 103]

$$V_{outn} = V_{TOPI} - \frac{1024C}{1024C + C_{SCUN} + C_{SCLN}} V_{inn} + \frac{512C - DM_8*256C - DM_7*128C - \ldots - DM_0C}{1024C + C_{SCUN} + C_{SCLN}} + \frac{C_{SCLN}}{1024C + C_{SCUN} + C_{SCLN}} \frac{-D_{SC} + D_{SC,init}}{128} V_{ref} + \frac{(1-DM_8)\Delta C_{n8} + (1-DM_7)\Delta C_{n7} + \ldots + (1-DM_0)\Delta C_{n0} + \Delta C'_{n0}}{1024C + C_{SCUN} + C_{SCLN}} V_{ref}$$ (103)

[Formula 104]

$$V_{outn} = V_{TOPI} - \frac{1024C}{1027C} V_{inn} + \frac{512C - DM_8*256C - DM_7*128C - \ldots - DM_0C}{1027C} + \frac{C}{1027C} \frac{-D_{SC} + D_{SC,init}}{128} V_{ref} + \frac{(1-DM_8)\Delta C_{n8} + (1-DM_7)\Delta C_{n7} + \ldots + (1-DM_0)\Delta C_{n0} + \Delta C'_{n0}}{1027C} V_{ref}$$ (104)

[Formula 105]

$$V_{outp} - V_{outn} = \frac{2D_{MAIN}}{1027} V_{ref} - \frac{1024C}{1027C}(V_{inp} - V_{inn}) + \frac{2}{1027} \frac{D_{SC} + D_{SC,init}}{128} V_{ref} + \frac{\Delta C_{p9} + DM_8\Delta C_{p8} + DM_7\Delta C_{p7} + \ldots + DM_0\Delta C_{p0}}{1027C} V_{ref} - \frac{(1-DM_8)\Delta C_{n8} + (1-DM_7)\Delta C_{n7} + \ldots + (1-DM_0)\Delta C_{n0} + \Delta C'_{n0}}{1027C} V_{ref}$$ (105)

The invention claimed is:

1. A successive approximation A/D converter, comprising:
a capacitive D/A converter that includes a plurality of capacitors for storing a charge based on an input voltage supplied to an input node, and generates, at an output node, a voltage based on the input voltage and a first digital signal including J bits, where J is a natural number, by switching connections of the plurality of capacitors according to the first digital signal;
a resistive D/A converter that generates a voltage based on a second digital signal by voltage division using a resistor string;
a capacitor that capacity-couples the voltage generated by the resistive D/A converter to the output node;
a comparator that generates a comparison result signal based on the voltage output at the output node;
a control circuit that supplies the first digital signal corresponding to upper-order J bits of digital data generated by the A/D converter to the capacitive D/A converter according to the comparison result signal and outputs a third digital signal indicating a capacitance error correction value for the plurality of capacitors and a fourth digital signal corresponding to lower-order K bits of the digital data generated by the A/D converter, where K is a natural number; and
a digital calculating circuit that adds the third digital signal and the fourth digital signal to generate the second digital signal, which includes at least K bits, and supplies the second digital signal to the resistive D/A converter,
wherein a bit digital data is generated based on the input signal.

2. The successive approximation A/D converter according to claim 1,
wherein the resistive D/A converter generates at least two voltages corresponding to upper-order bits and lower order bits of the second digital signal, and
wherein the at least two voltages are capacity-coupled to the output node via at least two corresponding capacitors.

3. The successive approximation A/D converter according claim 2,
wherein the at least two capacitors include a first capacitor corresponding to a first voltage corresponding to the lower-order bits and second capacitor corresponding to a second voltage corresponding to the upper-bits, wherein the first capacitor is capacity-coupled via a first switch to successive resistors in the resister, and
wherein the second capacitor is capacity-coupled via a second switch to resistors located at a certain interval in the resistor string.

4. The successive approximation A/D converter according claim 2,
wherein the at least two capacitors include four or more capacitors.

5. The successive approximation A/D converter according claim 1,
wherein the control circuit further includes a memory that stores J values for correcting capacitance errors of the plurality of capacitors.

6. The successive approximation A/D converter according claim 1,
wherein the digital calculating circuit generates the second digital signal by adding the fourth digital signal as carry bits to the third digital signal.

7. A successive approximation A/D converter, comprising:
a first capacitive D/A converter that includes a plurality of first capacitors for storing charge based on a first input voltage supplied to a first input node, and outputs, at a first output node, a voltage based on the first input voltage and a first digital signal including J bits, where J is a natural number, by switching connections of the plurality of first capacitors according to the first digital signal;
a second capacitive D/A converter that includes a plurality of second capacitors for storing charge based on a second input voltage supplied to a second input node, and outputs, at a second output node, a voltage based on the second input voltage and the first digital signal by switching connections of the plurality of second capacitors according to the first digital signal;

a resistive D/A converter that outputs a voltage based on a second digital signal and a voltage based on a third digital signal by voltage division using a single resistor string;

a capacitor that capacity-couples, to the first output node, the voltage based on the second digital signal generated by the resistive D/A converter;

a capacitor that capacity-couples, to the second output node, the voltage based on the third digital signal generated by the resistive D/A converter;

a comparator that generates a comparison result signal based on the voltages output at the first output node and the second output node;

a control signal circuit that supplies the first digital signal to the first and second capacitive D/A converters according to the comparison result signal and outputs a fourth digital signal indicating a capacitance error correction value of the plurality of first capacitors, a fifth digital signal indicating a capacitance error correction value of the plurality of second capacitors, and a sixth digital signal including K bits, where K is a natural number; and a digital calculating circuit that generates the second digital signal, which includes at least K bits, based on the fourth digital signal and the sixth digital signal, generates the third digital signal, which includes at least K bits, based on the fifth digital signal and the sixth digital signal, and supplies the second digital signal and the third digital signal to the resistive D/A converter, wherein a (J+K) bit digital data is generated based on the input voltage.

8. The successive approximation A/D converter according to claim 7, wherein the resistive D/A converter generates at least two voltages corresponding to upper-order bits and lower order bits of the second digital signal, and wherein the at least two voltages are capacity-coupled to the first output node via at least two corresponding capacitors.

9. The successive approximation A/D converter according claim 8, wherein the at least two capacitors includes a first capacitor corresponding to a first voltage corresponding to the lower-order bits and a second capacitor corresponding to a second voltage corresponding to the upper-order bits, wherein the first capacitor is capacity-coupled via a first switch to successive resistors in the resistor, and wherein the second capacitor is capacity-coupled via a second switch to resistors located at a certain interval in the resistor string.

10. The successive approximation A/D converter according to claim 7, further comprising:

a process unit that obtains a first error between a capacitance of the plurality of first capacitors and a capacitance of a certain reference capacitance with the resistive D/A converter, obtains a second error between a capacitance of the plurality of second capacitors and the capacitance of the certain reference capacitance with the resistive D/A converter, and calculates an average of the first error and the second error; and a memory that stores J values for correcting the first error and stores J values for correcting the second error, wherein the average is stored in the memory.

11. A successive approximation A/D converter which includes a successive approximation controlling circuit which compares an input analog voltage to a local analog output voltage from a local DA converter, outputs (J+K) bit digital data based on a comparison result, inputs the (J+K) bit digital data to the local DA converter and outputs the (J+K) bit digital data as A/D converter output when the local analog output voltage is substantially equal to the input analog voltage, wherein the local DA converter comprises:

a J-bit capacitive DAC that DA converts upper-order J-bit digital data of the (J+K) bit digital data;

a (K+L+1) bit resistive DAC that DA converts (K+L+1) bit digital data;

a first coupling capacitor that includes one terminal coupled to an output of the (K+L+1) bit resistive DAC and the other terminal coupled to a voltage output of the J-bit capacitive DAC;

wherein the successive approximation controlling circuit comprises:

a unit that obtains, with the (K+L+1) bit resistive DAC, an error between capacitance of a capacitor included in the capacitive DAC and a capacitance of a reference capacitance;

a unit that obtains, based on the error, (K+L+1) bit resistive DAC input digital data as a correction data to output a correction voltage for correcting a voltage error of the J-bit capacitive DAC from the (K+L+1) bit resistive DAC;

a memory that stores the correction data; and a unit that calculates, based on the correction data, (K+L+1) bit resistive DAC input digital data corresponding to the upper-order J-bit digital data, wherein a resolution of the correction voltage is a voltage determined from the resolution of the (J+K) bit successive approximation A/D converter, and wherein lower-order K-bit data of the (J+K) digital data and the calculated (K+L+1) bit resistive DAC input digital data corresponding to the upper-order J-bit digital data are added, and the added (K+L+1) bit data is used as an input to the (K+L+1) bit resistive DAC to correct the error.

12. The successive approximation A/D converter according to claim 11, wherein the local DA converter comprises:

a second coupling capacitor, wherein the (K+L+1) bit resistive DAC comprises:

an upper-order M-bit resistive DAC output corresponding to an upper-order M bits of the (K+L+1) bits; and a lower order (K+L+1−M) bit resistive DAC output corresponding to a lower-order (K+L+1−M) bits of the (K+L+1) bits, wherein one terminal of the first coupling capacitor is coupled to the upper-order M-bit resistive DAC output and the other terminal of the first coupling capacitor is coupled to a voltage output of the J-bit capacitive DAC, and, wherein one terminal of the second coupling capacitor is coupled to the lower-order (K+L+1−M) bit resistive DAC output and the other terminal of the second coupling capacitor is coupled to the voltage output of the J-bit capacitive DAC.

13. The successive approximation A/D converter according to claim 12, wherein the resolution of the correction voltage is ½.sup.L of a voltage corresponding to 1LSB which is determined by the resolution of the (J+K) bit successive approximation A/D converter.

14. The successive approximation A/D converter according to claim 11,
wherein the local DA converter comprises:
a second coupling capacitor,
wherein the (K+L+1) bit resistive DAC comprises:
an upper-order M-bit resistive DAC output corresponding to an upper-order M bits of the (K+L+1) bits; and
a plurality of lower order bit resistive DAC outputs which correspond to a lower-order (K+L+1−M) bits of the (K+L+1) bits,
wherein one terminal of the first coupling capacitor is coupled to the upper-order M-bit resistive DAC output and the other terminal of the first coupling capacitor is coupled to a voltage output of the J-bit capacitive DAC, one terminal of the second coupling capacitor is coupled to the lower resistive DAC output and the other terminal of the second coupling capacitor is coupled to the voltage output of the J-bit capacitive DAC.

15. A successive approximation A/D converter that includes a successive approximation controlling circuit, which compares a difference between a positive-side input analog voltage and a negative-side input analog voltage and a local analog voltage output by a local DA converter and generates (J+K) bit digital data based on a comparison, inputs the (J+K) bit digital data output by the successive approximation controlling circuit to the local DA converter, and outputs, as an A/D converter output, the (J+K) bit digital data when the local analog voltage is substantially equal to the difference between the positive-side input analog voltage and the negative-side input analog voltage,
wherein the local DA converter comprises:
a J-bit capacitive DAC which DA converts upper-order J-bit digital data of the (J+K) bit digital data;
a (K+L+1) bit resistive DAC which DA converts (K+L+1) bit digital data; and
at least a first coupling capacitor, a second coupling capacitor, a third coupling capacitor, and a fourth coupling capacitor,
wherein the J-bit capacitive DAC comprises:
a positive-side J-bit capacitive DAC which DA converts the upper-order J-bit digital data; and
a negative-side J-bit capacitive DAC which DA converts the upper-order J-bit digital data,
wherein the (K+L+1) bit resistive DAC comprises:
a positive-side (K+L+1) bit resistive DAC which DA converts the (K+L+1) bit digital data; and
a negative-side (K+L+1) bit resistive DAC which converts the (K+L+1) bit digital data,
wherein the positive-side (K+L+1) bit resistive DAC comprises:
a positive-side upper-order M-bit resistive DAC output corresponding to an upper-order M bits of the (K+L+1) bits; and
a plurality of positive-side lower-order bit resistive DAC outputs corresponding to a lower-order (K+L+1−M) bits of the (K+L+1) bits,
wherein the negative-side (K+L+1) bit resistive DAC comprises:
a negative-side upper-order M-bit resistive DAC output corresponding to the upper-order M bits of the (K+L+1) bits; and
a plurality of negative-side lower-order bit resistive DAC outputs corresponding to the lower-order (K+L+1−M) bits of the (K+L+1) bits,
wherein one terminal of the first coupling capacitor is coupled to the positive-side upper-order M-bit resistive DAC output and the other terminal of the first coupling capacitor is coupled to a voltage output of the positive-side J-bit capacitive DAC,
wherein one terminal of the second coupling capacitor is coupled to the positive-side lower-order bit resistive DAC output and the other terminal of the second coupling capacitor is coupled to the voltage output of the positive-side J-bit capacitive DAC,
wherein one terminal of the third coupling capacitor is coupled to the negative-side upper-order M-bit resistive DAC output and the other terminal of the third coupling capacitor is coupled to a voltage output of the negative-side J-bit capacitive DAC,
wherein one terminal of the fourth coupling capacitor is coupled to the negative-side lower-order bit resistive DAC output and the other terminal of the fourth coupling capacitor is coupled to the voltage output of the negative-side J-bit capacitive DAC,
wherein the successive approximation controlling circuit comprises:
a first unit which obtains, by the (K+L+1) bit resistive DAC, an error between a capacitance of a capacitor included in the J-bit capacitive DAC and a capacitance of a certain reference capacitance;
a second unit which obtains, based on the error, (K+L+1) bit resistive DAC input digital data, as correction data, to output a correction voltage for correcting a voltage error of the J-bit capacitive DAC from the (K+L+1) bit resistive DAC;
a memory which stores the correction data; and
a third unit which calculates, based on the correction data, (K+L+1) bit resistive DAC input digital data corresponding to the upper-order J-bit digital data,
wherein a resolution of the correction voltage is a voltage determined from the resolution of the (J+K) successive approximation A/D converter, and
wherein lower-order K-bit data of the (J+K) digital data output from the successive approximation controlling circuit and a calculation result of the (K+L+1) bit resistive DAC input digital data corresponding to the upper-order J-bit digital data are summed, and the summed (K+L+1) bit data is input to the (K+L+1) bit resistive DAC to correct capacitance error.

16. The successive approximation A/D converter according to claim 15,
wherein, during normal A/D conversion, the input analog voltage is sampled with an output node potential of the positive-side J-bit capacitive DAC and an output node potential of the negative-side capacitive DAC set to a common potential of the positive-side input analog voltage and the negative-side input analog voltage,
wherein, during error measurement for obtaining the error between the capacitance of the capacitor included in the capacitive DAC and the capacitance of the certain reference capacitance using the (K+L+1) bit resistive DAC, the output node potential of the positive-side J-bit capacitive DAC and the output node potential of the negative-side J-bit capacitive DAC are set to half of a power source voltage.

17. The successive approximation A/D converter according to claim 15, further comprising:
a first adding circuit which calculates, based on the correction data in the memory, (K+L+1) bit resistive DAC input digital data corresponding to the upper-order J-bit digital data; and
a second adding circuit which adds lower-order K-bit data of the (J+K) digital data output from the successive approximation controlling circuit and a calculation result of the (K+L+1) bit resistive DAC input digital data corresponding to the upper-order J-bit digital data, wherein an output of the first adding circuit is input to the second adding circuit.

18. The successive approximation A/D converter according to claim 15, wherein a resolution of the correction voltage is $\frac{1}{2}$.sup.L of a voltage corresponding to 1LSB which is determined by a resolution of the bit successive approximation A/D converter.

19. A (J+K) bit successive approximation A/D converter that includes a successive approximation controlling circuit, which compares a difference between a positive-side input analog voltage and a negative-side input analog voltage to a local analog voltage output by a local DA converter and generates (J+K) bit digital data based on a comparison output, inputs the (J+K) bit digital data output from the successive approximation controlling circuit to the local DA converter, and outputs, as an A/D converter output, the (J+K) bit digital data when the local analog voltage is substantially equal to the difference between the positive-side input analog voltage and the negative-side input analog voltage, wherein the local DA converter comprises:
a J-bit capacitive DAC which DA converts upper-order J-bit digital data of the (J+K) digital data;
a K-bit resistive DAC which DA converts lower-order K-bit digital data;
an N-bit correcting resistive DAC which DA converts N-bit correction digital data; and
at least a first coupling capacitor and a second coupling capacitor;
wherein the J-bit capacitive DAC comprises:
a positive-side J-bit capacitive DAC which DA converts the upper-order J-bit digital data; and
a negative-side J-bit capacitive DAC which DA converts the upper-order J-bit digital data;
wherein the K-bit resistive DAC comprises:
a positive-side K-bit resistive DAC which DA converts the lower-order K-bit digital data; and
a negative-side K-bit resistive DAC which DA converts lower-order K-bit digital data;
wherein the N-bit correcting resistive DAC comprises:
a positive-side N-bit correcting resistive DAC; and
a negative-side N-bit correcting resistive DAC;
wherein one terminal of the first coupling capacitor is coupled to the positive-side J-bit capacitive DAC output and the other terminal of the first coupling capacitor is coupled to a voltage output of the positive-side N-bit correcting resistive DAC,
wherein one terminal of the second coupling capacitor is coupled to the negative-side J-bit capacitive DAC output and the other terminal of the second coupling capacitor is coupled to voltage output of the negative-side N-bit correcting capacitive DAC,
wherein the successive approximation controlling circuit comprises:
a first unit which obtains, using the N-bit correcting resistive DAC, a first capacitance error between a capacitance of a capacitor included in the positive-side J-bit capacitive DAC and a capacitance of a certain reference capacitance;
a second unit which obtains, based on the first capacitance error, positive-side N-bit correcting resistive DAC input digital data as first correction data to output a correction voltage, which corrects a voltage error of the positive-side J-bit capacitive DAC, from the positive-side N-bit correcting resistive DAC;
a memory which stores the first correction data;
a third unit which obtains, using the negative-side N-bit correcting resistive DAC, a second capacitance error between a capacitance included in a negative-side J-bit resistive DAC and a capacitance of a certain reference capacitance;
a fourth unit which obtains, based on the second capacitance error, negative-side N-bit correcting capacitive DAC input digital data as second correction data to output a correction voltage which corrects the voltage error of the negative-side J-bit capacitive DAC from the negative-side N-bit correcting resistive DAC;
a memory which stores the first correction data;
a fifth unit which calculates, based on the second correction data, positive-side N-bit correcting resistive DAC input digital data corresponding to the upper-order J-bit digital data; and
a sixth unit which calculates, based on the second correction data, negative-side N-bit correcting resistive DAC input digital data corresponding to the upper-order J-bit digital data, and
wherein the capacitance error is corrected using the calculated positive-side N-bit correcting resistive DAC input digital data and the calculated negative-side N-bit correcting resistive DAC input digital data.

20. A successive approximation A/D converter that includes a successive approximation controlling circuit, which compares a difference between a positive-side input analog voltage and a negative-side input analog voltage to a local analog voltage output by a local DA converter and generates (J+K) bit digital data based on a comparison, inputs the (J+K) bit digital data output by the successive approximation controlling circuit to the local DA converter, and outputs, as an A/D converter output, the (J+K) bit digital data when the local analog voltage is substantially equal to the difference between the positive-side input analog voltage and the negative-side input analog voltage, wherein the local DA converter comprises:
a J-bit capacitive DAC which DA converts upper-order J-bit digital data of a J-bit digital data;
a (K+L+1) bit resistive DAC which DA converts (K+L+1) bit digital data; and at least a first coupling capacitor, a second coupling capacitor, a third coupling capacitor and a fourth coupling capacitor;
wherein the J-bit capacitive DAC comprises:
a positive-side J-bit capacitive DAC which DA converts the upper-order J-bit digital data; and
a negative-side J-bit capacitive DAC which DA converts the upper-order J-bit digital data;
wherein the (K+L+1) bit resistive DAC comprises:
a positive-side (K+L+1) bit resistive DAC which DA converts the (K.sup.+L+1) bit digital data; and
a negative-side (K+L+1) bit resistive DAC which converts the (K+L+1) bit digital data;
wherein the positive-side (K+L+1) bit resistive DAC comprises:
a positive-side upper-order M-bit resistive DAC output corresponding to an upper-order M bits of the (K+L+1) bits; and
a plurality of positive-side lower-order bit resistive DAC outputs corresponding to a lower-order (K+L+1−M) bits of the (K+L+1) bits,
wherein the negative-side (K+L+1) bit resistive DAC comprises:

a negative-side upper-order M-bit resistive DAC output corresponding to the upper-order M bits of the (K+L+1) bits; and a plurality of negative-side lower-order bit resistive DAC outputs corresponding to the lower-order (K+L+1−M) bits of the (K+L+1) bits, wherein one terminal of the first coupling capacitor is coupled to the positive-side upper-order M-bit resistive DAC output and the other terminal of the first coupling capacitor is coupled to a voltage output of the positive-side J-bit capacitive DAC, wherein one terminal of the second coupling capacitor is coupled to the positive-side lower-order bit resistive DAC output and the other terminal of the second coupling capacitor is coupled to the voltage output of the positive-side J-bit capacitive DAC, wherein one terminal of the third coupling capacitor is coupled to the negative-side upper-order M-bit resistive DAC output and the other terminal of the third coupling capacitor is coupled to a voltage output of the negative-side J-bit capacitive DAC, wherein one terminal of the fourth coupling capacitor is coupled to the negative-side lower-order bit resistive DAC output and the other terminal of the fourth coupling capacitor is coupled to the voltage output of the negative-side J-bit capacitive DAC, wherein the successive approximation circuit controlling unit comprises:

a first unit which obtains, using the positive-side (K+L+1) bit resistive DAC, an error between a capacitance of a capacitor included in the positive-side J-bit capacitive DAC and a capacitance of a certain reference capacitance;

a second unit which obtains, based on the first capacitance error of the positive-side J-bit capacitive DAC, positive-side (K+L+1) bit resistive DAC input digital data as first correction data to output a first correction voltage, which corrects the voltage error of the positive-side J-bit capacitive DAC, from the positive-side (K+L+1) bit resistive DAC;

a memory which stores the first correction data;

a third unit which obtains, using the negative-side (K+L+1) bit resistive DAC, an error between a capacitance of a capacitor included in the negative-side J-bit capacitive DAC and a capacitance of a certain reference capacitance;

a fourth unit which obtains, based on the second capacitance error of the negative-side J-bit capacitive DAC, negative-side (K+L+1) bit resistive DAC input digital data as second correction data to output a second correction voltage, which corrects the voltage error of the negative-side J-bit capacitive DAC, from the negative-side (K+L+1) bit resistive DAC;

a memory which stores the second correction data;

a fifth unit which calculates, based on the first correction data, positive-side (K+L+1) bit resistive DAC input digital data corresponding to the J-bit digital data; and a sixth unit which calculates, based on the second correction data, negative-side (K+L+1) bit resistive DAC input digital data corresponding to the J-bit digital data, wherein a resolution of the first correction voltage and the second correction voltage is a certain voltage determined by a resolution of the (J+K) bit successive approximation A/D converter, wherein lower-order K-bit data of the (J+K) digital data output from the successive approximation controlling circuit is added to a calculation result of the positive-side (K+L+1) bit resistive DAC input digital data corresponding to the upper-order J-bit digital data, and an added positive-side (K+L+1) bit data is input to the positive-side (K+L+1) bit resistive DAC, and wherein the lower-order K-bit data of the (J+K) digital data output from the successive approximation controlling circuit is added to a calculation result of the negative-side (K+L+1) bit resistive DAC input digital data corresponding to the upper-side J-bit digital data, and an added negative-side (K+L+1) bit data is input to the negative-side (K+L+1) bit resistive DAC.

* * * * *